United States Patent
Tae et al.

(10) Patent No.: US 12,218,299 B2
(45) Date of Patent: Feb. 4, 2025

(54) DISPLAY DEVICE AND METHOD FOR MANUFACTURING SAME

(71) Applicant: SAMSUNG DISPLAY CO., LTD., Yongin-si (KR)

(72) Inventors: Chang Il Tae, Yongin-si (KR); Hyun Min Cho, Yongin-si (KR); Dae Hyun Kim, Yongin-si (KR)

(73) Assignee: SAMSUNG DISPLAY CO., LTD., Yongin-si (KR)

(*) Notice: Subject to any disclaimer, the term of this patent is extended or adjusted under 35 U.S.C. 154(b) by 364 days.

(21) Appl. No.: 17/774,978

(22) PCT Filed: Oct. 19, 2020

(86) PCT No.: PCT/KR2020/014278
§ 371 (c)(1),
(2) Date: May 6, 2022

(87) PCT Pub. No.: WO2021/091119
PCT Pub. Date: May 14, 2021

(65) Prior Publication Data
US 2022/0393086 A1    Dec. 8, 2022

(30) Foreign Application Priority Data
Nov. 7, 2019   (KR) .................. 10-2019-0141906

(51) Int. Cl.
*H01L 33/62* (2010.01)
*H01L 23/00* (2006.01)
(Continued)

(52) U.S. Cl.
CPC .............. *H01L 33/62* (2013.01); *H01L 24/24* (2013.01); *H01L 24/25* (2013.01); *H01L 24/82* (2013.01);
(Continued)

(58) Field of Classification Search
None
See application file for complete search history.

(56) References Cited

U.S. PATENT DOCUMENTS 9,412,297 B2 * 8/2016 Kim ................. H10K 59/131
10,205,051 B2   2/2019 Kim et al.
(Continued)

FOREIGN PATENT DOCUMENTS

| CN | 107623013 | 1/2018 |
| CN | 107818755 | 3/2018 |

(Continued)

OTHER PUBLICATIONS

International Search Report, with English translation, corresponding to International Application No. PCT/KR2020/014278 dated Jan. 25, 2021.
(Continued)

*Primary Examiner* — Bilkis Jahan
(74) *Attorney, Agent, or Firm* — KILE PARK REED & HOUTTEMAN PLLC

(57) ABSTRACT

A display device may include a display area including pixel areas each including an emission area, a non-display area, and a pixel disposed in each of the pixel areas. The pixel may include a first electrode, a second electrode spaced apart from the first electrode and surrounding a periphery of the first electrode, a third electrode spaced apart from the second electrode and surrounding a periphery of the second electrode, a fourth electrode spaced apart from the third electrode and surrounding a periphery of the third electrode, light emitting elements disposed between the first to fourth electrodes, and first and second conductive lines disposed under the first to fourth electrodes with an insulating layer disposed therebetween. The first conductive line may be electrically connected to the first electrode, and the second
(Continued)

conductive line may be electrically connected to the fourth electrode.

20 Claims, 45 Drawing Sheets

(51) Int. Cl.
  *H01L 25/16* (2023.01)
  *H01L 33/60* (2010.01)
  *H01L 27/12* (2006.01)
  *H01L 33/32* (2010.01)

(52) U.S. Cl.
  CPC ............ *H01L 24/95* (2013.01); *H01L 25/167* (2013.01); *H01L 33/60* (2013.01); *H01L 27/124* (2013.01); *H01L 33/325* (2013.01); *H01L 2224/24051* (2013.01); *H01L 2224/24147* (2013.01); *H01L 2224/244* (2013.01); *H01L 2224/25175* (2013.01); *H01L 2224/254* (2013.01); *H01L 2224/8293* (2013.01); *H01L 2224/95133* (2013.01); *H01L 2924/12041* (2013.01); *H01L 2933/0058* (2013.01); *H01L 2933/0066* (2013.01)

(56) References Cited

U.S. PATENT DOCUMENTS

| | | | |
|---|---|---|---|
| 10,211,418 B2 | 2/2019 | Im et al. | |
| 10,249,603 B2 | 4/2019 | Cho et al. | |
| 10,879,324 B2 * | 12/2020 | Lee | H10K 59/12 |
| 10,943,947 B2 | 3/2021 | Im et al. | |
| 10,943,967 B2 | 3/2021 | Kim et al. | |
| 11,063,194 B2 | 7/2021 | Do et al. | |
| 2015/0214284 A1 * | 7/2015 | Kim | H10K 59/122 |
| | | | 257/40 |
| 2017/0358563 A1 * | 12/2017 | Cho | H01L 33/38 |
| 2018/0342564 A1 | 11/2018 | Hanari | |
| 2019/0245017 A1 * | 8/2019 | Jeon | H10K 59/126 |
| 2020/0403131 A1 | 12/2020 | Kim et al. | |
| 2021/0242380 A1 | 8/2021 | Kim et al. | |

FOREIGN PATENT DOCUMENTS

| | | |
|---|---|---|
| JP | 2014-123583 | 7/2014 |
| KR | 10-1730977 | 4/2017 |
| KR | 10-2017-0141305 | 12/2017 |
| KR | 10-2018-0082667 | 7/2018 |
| KR | 10-2019-0121894 | 10/2019 |
| KR | 10-2019-0124359 | 11/2019 |
| KR | 10-2020-0145966 | 12/2020 |
| KR | 10-2021-0008252 | 1/2021 |
| KR | 10-2021-0029337 | 3/2021 |

OTHER PUBLICATIONS

Written Opinion, with English translation, corresponding to International Application No. PCT/KR2020/014278, dated Jan. 25, 2021.

* cited by examiner

DISPLAY DEVICE AND METHOD FOR MANUFACTURING SAME

CROSS-REFERENCE TO RELATED APPLICATION(S)

This application is a national entry of International Application No. PCT/KR2020/014278, filed on Oct. 19, 2020, which claims under 35 U.S.C. §§ 119(a) and 365(b) priority to and benefits of Korean Patent Application No. 10-2019-0141906, filed on Nov. 7, 2019, in the Korean Intellectual Property Office (KIPO), the entire contents of which are incorporated herein by reference.

BACKGROUND

1. Technical Field

The disclosure relates to a display device and a method of manufacturing the same.

2. Description of Related Art

As interest in information display increases and the demand to use portable information media increases, the demand and commercialization for display devices are focused.

SUMMARY

An object of the disclosure is to provide a display device having improved light output efficiency and a method of manufacturing the same.

According to an embodiment of the disclosure, a display device may include a display area including a plurality of pixel areas each including an emission area, a non-display area; and a pixel disposed in each of the pixel areas.

In an embodiment of the disclosure, the pixel may include a first electrode; a second electrode spaced apart from the first electrode and surrounding a periphery of the first electrode; a third electrode spaced apart from the second electrode and surrounding a periphery of the second electrode; a fourth electrode spaced apart from the third electrode and surrounding a periphery of the third electrode; light emitting elements disposed between the first to fourth electrodes; and a first conductive line and a second conductive line disposed under the first to fourth electrodes with an insulating layer disposed between the first and second conductive lines. The first conductive line may be electrically connected to the first electrode, and the second conductive line may be electrically connected to the fourth electrode.

In an embodiment of the disclosure, in a plan view, each of the second to fourth electrodes may have a ring shape, and the first electrode may have an isolated circular island shape surrounded by the second to fourth electrodes.

In an embodiment of the disclosure, the light emitting elements may include first light emitting elements disposed between the first electrode and the second electrode; second light emitting elements disposed between the second electrode and the third electrode; and a third light emitting element disposed between the third electrode and the fourth electrode.

In an embodiment of the disclosure, the first light emitting elements may be disposed between the first electrode and the second electrode in a circumferential direction centered on the first electrode, the second light emitting elements may be disposed between the second electrode and the third electrode in a circumferential direction centered on the second electrode, and the third light emitting elements may be disposed between the third electrode and the fourth electrode in a circumferential direction centered on the third electrode.

In an embodiment of the disclosure, the first conductive line and the second conductive line may be disposed on a same layer.

In an embodiment of the disclosure, the first conductive line and the second conductive line may be disposed on different layers.

In an embodiment of the disclosure, the insulating layer may include first and second insulating layers sequentially stacked on a substrate.

In an embodiment of the disclosure, the first conductive line may be disposed on one of the first and second insulating layers, and the second conductive line may be disposed on the other of the first and second insulating layers.

In an embodiment of the disclosure, the pixel may further include a third conductive line electrically connected to the second electrode with the insulating layer disposed between the third conductive line and the second electrode; and a fourth conductive line electrically connected to the third electrode with the insulating layer disposed between the fourth conductive line and the third electrode. Here, the third and fourth conductive lines may be in a floating state.

In an embodiment of the disclosure, the third and fourth conductive lines and the first and second conductive lines may be disposed on a same layer.

In an embodiment of the disclosure, the third conductive line and the fourth conductive line may be disposed on different layers.

In an embodiment of the disclosure, the first light emitting elements may form a first stage electrically connected in parallel between the first electrode and the second electrode, the second light emitting elements may form a second stage electrically connected in parallel between the second electrode and the third electrode, and the third light emitting elements may form a third stage electrically connected in parallel between the third electrode and the fourth electrode.

In an embodiment of the disclosure, the pixel may further include a bank pattern disposed under each of the first to fourth electrodes; and a contact electrode respectively disposed on the first to fourth electrodes.

In an embodiment of the disclosure, the second electrode may include a 2-1-th electrode surrounding one region of the first electrode and a 2-2-th electrode spaced apart from the 2-1-th electrode and surrounding another region of the first electrode. The third electrode may include a 3-1-th electrode surrounding one region of the second electrode and a 3-2-th electrode spaced apart from the 3-1-th electrode and surrounding another region of the second electrode.

In an embodiment of the disclosure, the 2-2-th electrode and the 3-2-th electrode may be in a floating state.

In an embodiment of the disclosure, the 2-2-th electrode may be electrically connected to the second conductive line, and the 3-2-th electrode may be electrically connected to the first conductive line.

In an embodiment of the disclosure, the first conductive line and the second conductive line may be disposed on a same layer.

In an embodiment of the disclosure, the pixel may further include a pixel circuit part including at least one transistor electrically connected to the fourth electrode. Here, the first electrode may be a cathode electrode of the pixel and the fourth electrode may be an anode electrode of the pixel.

The above-described display device may be manufactured by including providing a pixel including a pixel area. The providing of the pixel may include forming a pixel circuit part and forming a display element part.

The forming of the pixel circuit part may include forming at least one transistor and first to fourth conductive lines spaced apart from each other on a substrate; and forming a protective layer on the transistor and the first to fourth conductive lines.

The forming of the display element part may include forming a first electrode electrically connected to the first conductive line, a second electrode spaced apart from the first electrode and electrically connected to the second conductive line, a third electrode spaced apart from the second electrode and electrically connected to the third conductive line, and a fourth electrode spaced apart from the third electrode and electrically connected to the fourth conductive line, on the protective layer; aligning light emitting elements between the first to fourth electrodes by forming an electric field between the first and second electrodes, between the second and third electrodes, and between the third and fourth electrodes by applying an alignment signal corresponding to each of the first to fourth conductive lines; and forming a contact electrode on each of the first to fourth electrodes.

In an embodiment of the disclosure, the method may further include removing a portion of each of the second and third conductive lines after the forming of the contact electrode.

In an embodiment of the disclosure, the first electrode may be disposed at a center of the pixel area, the second electrode may surround a periphery of the first electrode, the third electrode may surround a periphery of the second electrode, and the fourth electrode may surround a periphery of the third electrode.

According to an embodiment of the disclosure, a display device and a method of manufacturing the same advantageous in implementing high resolution and capable of improving light output efficiency by sufficiently securing an alignment area of a light emitting element by disposing a circular-shaped electrode at a center of a pixel area in the pixel area provided with one pixel, and disposing at least one ring-shaped electrode surrounding the circular-shaped electrode may be provided.

An effect according to embodiments of the disclosure is not limited by the contents discussed above, and more various effects are included in the specification.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION OF THE EMBODIMENTS

Figure 1A:
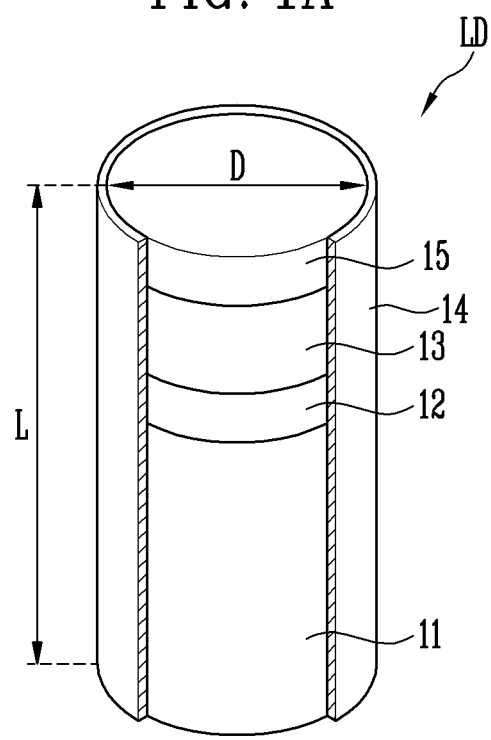
FIG. 1A is a perspective view schematically illustrating a light emitting element according to an embodiment of the disclosure.

Since the disclosure may be modified in various manners and have various forms, specific embodiments will be illustrated in the drawings and will be described in detail in the specification. However, it should be understood that the disclosure is not intended to be limited to the disclosed specific forms, and the disclosure includes all modifications, equivalents, and substitutions within the technical scope of the disclosure.

Similar reference numerals are used for similar components in describing each drawing. In the accompanying drawings, the dimensions of the structures are shown enlarged from the actual dimensions for the sake of clarity of the disclosure. Terms of "first", "second", and the like may be used to describe various components, but the components should not be limited by the terms. The terms are used only for the purpose of distinguishing one component from another component. For example, without departing from the scope of the disclosure, a first component may be referred to as a second component, and similarly, a second component may also be referred to as a first component. The singular expressions include plural expressions unless the context clearly indicates otherwise.

It should be understood that in the application, a term of "include", "have", or the like is used to specify that there is a feature, a number, a step, an operation, a component, a part, or a combination thereof described in the specification, but does not exclude a possibility of the presence or addition of one or more other features, numbers, steps, operations, components, parts, or combinations thereof in advance. In addition, a case where a portion of a layer, a film, an area, a plate, or the like is referred to as being "on" another portion, it includes not only a case where the portion is "directly on" another portion, but also a case where there is further another portion between the portion and another portion. In addition, in the specification, when a portion of a layer, a film, an area, a plate, or the like is formed on another portion, a forming direction is not limited to an upper direction but includes forming the portion on a side surface or in a lower direction. On the contrary, when a portion of a layer, a film, an area, a plate, or the like is formed "under" another portion, this includes not only a case where the portion is "directly beneath" another portion but also a case where there is further another portion between the portion and another portion.

Hereinafter, embodiments of the disclosure and other matters necessary for those skilled in the art to readily understand the contents of the disclosure will be described in detail with reference to the accompanying drawings. In the description below, the singular expressions include plural expressions (or plural meanings) unless the context clearly indicates otherwise.

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Figure 1B:
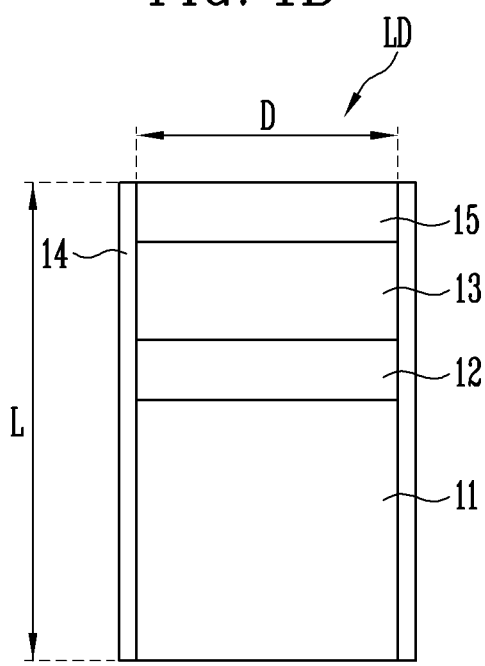
FIG. 1B is a schematic cross-sectional view of the light emitting element of FIG. 1A.
Figure 2A:
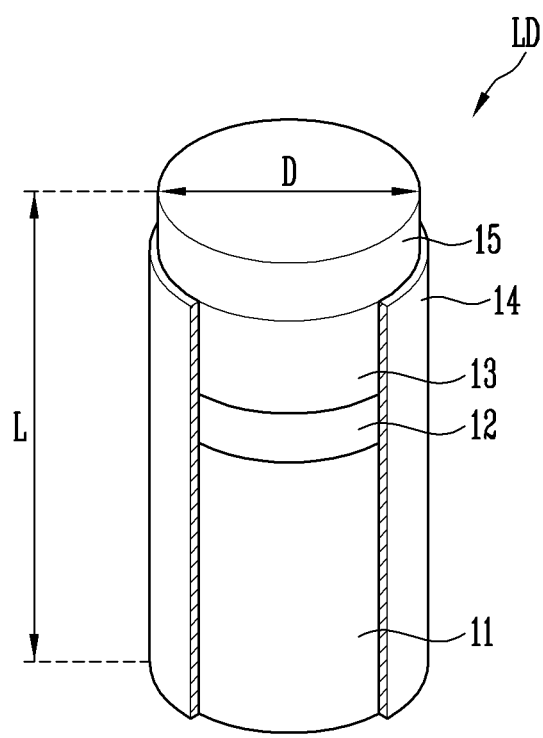
FIG. 2A is a perspective view schematically illustrating a light emitting element according to another embodiment of the disclosure.
Figure 2B:
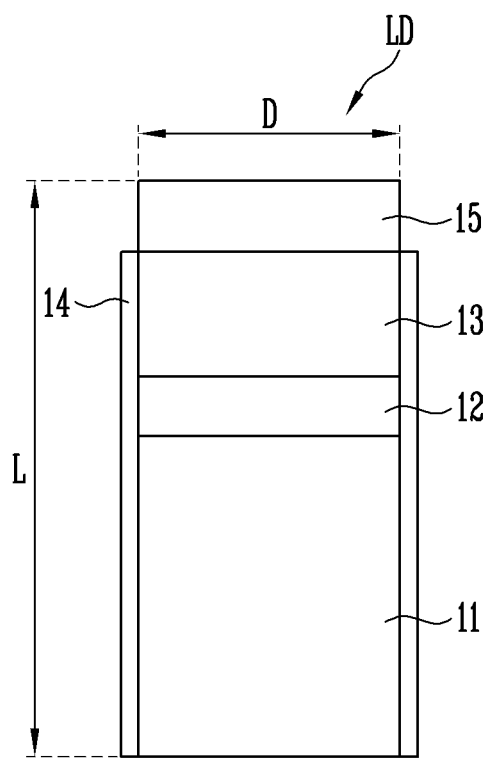
FIG. 2B is a schematic cross-sectional view of the light emitting element of FIG. 2A.
Figure 3A:
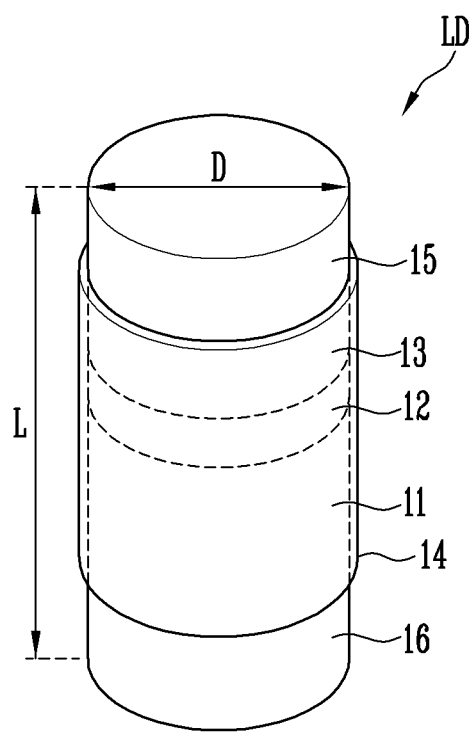
FIG. 3A is a perspective view schematically illustrating a light emitting element according to another embodiment of the disclosure.
Figure 3B:
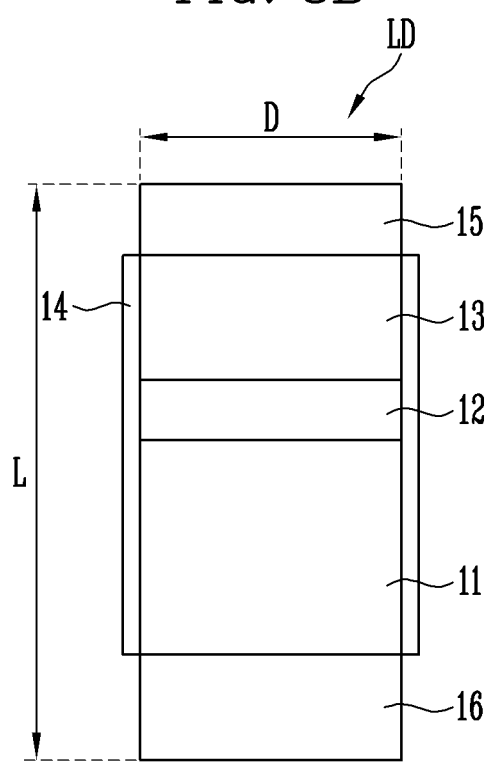
FIG. 3B is a schematic cross-sectional view of the light emitting element of FIG. 3A.
Figure 4A:
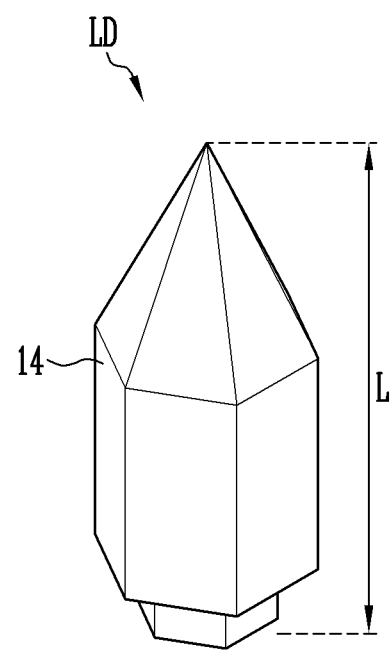
FIG. 4A is a schematic perspective view schematically illustrating a light emitting element according to still another embodiment of the disclosure.
Figure 4B:
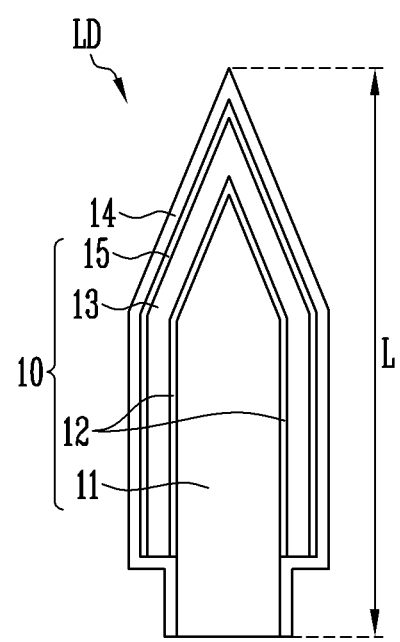
FIG. 4B is a cross-sectional view of the light emitting element of FIG. 4A.

FIG. 1A is a perspective view schematically illustrating a light emitting element according to an embodiment, FIG. 1B is a schematic cross-sectional view of the light emitting element of FIG. 1A, FIG. 2A is a perspective view schematically illustrating a light emitting element according to another embodiment, FIG. 2B is a schematic cross-sectional view of the light emitting element of FIG. 2A, FIG. 3A is a perspective view schematically illustrating a light emitting element according to another embodiment, FIG. 3B is a schematic cross-sectional view of the light emitting element of FIG. 3A, FIG. 4A is a perspective view schematically illustrating a light emitting element according to still another embodiment, and FIG. 4B is a schematic cross-sectional view of the light emitting element of FIG. 4A.

For convenience, after describing FIGS. 1A, 1B, 2A, 2B, 3A, and 3B illustrating the light emitting element manufactured by an etching method, FIGS. 4A and 4B illustrating the light emitting element manufactured by a growth method are described. In an embodiment, a type and/or a shape of the light emitting element are/is not limited to the embodiments shown in FIGS. 1A, 1B, 2A, 2B, 3A, 3B, 4A, and 4B.

First, referring to FIGS. 1A, 1B, 2A, 2B, 3A, and 3B, a light emitting element LD may include a first semiconductor layer 11, a second semiconductor layer 13, and an active layer 12 interposed between the first semiconductor layer 11 and the second semiconductor layer 13. For example, the light emitting element LD may be implemented as a light emitting stack in which the first semiconductor layer 11, the active layer 12, and the second semiconductor layer 13 are sequentially stacked.

According to an embodiment, the light emitting element LD may extend in a direction. In case that an extension direction of the light emitting element LD is referred to as a longitudinal direction, the light emitting element LD may have one side end (or first end) and another side end (or second end) in the extension direction. One of the first and second semiconductor layers 11 and 13 may be disposed at the one side end of the light emitting element LD, and the other of the first and second semiconductor layers 11 and 13 may be disposed at the other side end of the light emitting element LD.

The light emitting element LD may be provided in various shapes. For example, the light emitting element LD may have a rod-like shape or a bar-like shape that is long in the longitudinal direction (for example, an aspect ratio is greater than 1). In an embodiment, a length L of the light emitting element LD in the longitudinal direction may be greater than a diameter D (or a width of a cross section) of the light emitting element LD. The light emitting element LD may include, for example, a light emitting diode manufactured to be extremely small to have the diameter D and/or the length L to a degree of the nanoscale to the microscale. In an embodiment, a size of the light emitting element LD may be changed to accord with a requirement condition (or a design condition) of a lighting device or a self-luminous display device.

The first semiconductor layer 11 may include, for example, at least one n-type semiconductor layer. For example, the first semiconductor layer 11 may include at least one semiconductor material among InAlGaN, GaN, AlGaN, InGaN, AlN, and InN, and may include an n-type semiconductor layer doped with a first conductive dopant such as Si, Ge, or Sn. However, the material forming (or configuring) the first semiconductor layer 11 is not limited thereto, and various other materials may form the first semiconductor layer 11.

The active layer 12 may be disposed on the first semiconductor layer 11 and may be formed in a single or multiple quantum well structure. A position of the active layer 12 may be variously changed according to the type of the light emitting element LD. The active layer 12 may emit light having a wavelength of about 400 nm to about 900 nm, and may have a double hetero structure. In an embodiment, a clad layer (not shown) doped with a conductive dopant may be formed on and/or under the active layer 12. For example, the clad layer may be formed of (or formed as) an AlGaN layer or an InAlGaN layer. According to an embodiment, a material such as AlGaN or AlInGaN may be used to form the active layer 12, and various other materials may form the active layer 12.

In case that an electric field of a voltage or more is applied to both ends (or two ends) of the light emitting element LD, the light emitting element LD emits light while an electron-hole pair is combined in the active layer 12. By controlling light emission of the light emitting element LD by using such a principle, the light emitting element LD may be used as a light source of various light emitting devices including a pixel of the display device.

The second semiconductor layer 13 may be disposed on the active layer 12 and may include a semiconductor layer of a type different from that of the first semiconductor layer 11. For example, the second semiconductor layer 13 may include at least one p-type semiconductor layer. For example, the second semiconductor layer 13 may include at least one semiconductor material among InAlGaN, GaN, AlGaN, InGaN, AlN, and InN, and may include a p-type semiconductor layer doped with a second conductive dopant such as Mg. However, the material forming the second semiconductor layer 13 is not limited thereto, and various other materials may form the second semiconductor layer 13.

In an embodiment, the first semiconductor layer 11 and the second semiconductor layer 13 may have widths (or thicknesses) different from each other in a length L direction of the light emitting element LD. For example, the first semiconductor layer 11 may have a width (or a thickness) relatively greater than that of the second semiconductor layer 13 in the length L direction of the light emitting element LD. Therefore, the active layer 12 of the light emitting element LD may be positioned to be closer to an upper surface of the second semiconductor layer 13 than to a lower surface of the first semiconductor layer 11 as shown in FIGS. 1A to 3B.

According to an embodiment, the light emitting element LD may further include an additional electrode 15 disposed on the second semiconductor layer 13 in addition to the above-described first semiconductor layer 11, active layer 12, and second semiconductor layer 13. In addition, according to an embodiment, as shown in FIGS. 3A and 3B, the light emitting element LD may further include an additional electrode 16 disposed at one end of the first semiconductor layer 11.

The additional electrodes 15 and 16 may be ohmic contact electrodes, but are not limited thereto, and may be Schottky contact electrodes according to an embodiment. The additional electrodes 15 and 16 may include a metal or metal oxide, and for example, chromium (Cr), titanium (Ti), aluminum (Al), gold (Au), nickel (Ni), ITO, an oxide or an alloy thereof, and the like may be used alone or in combination, but the disclosure is not limited thereto.

The materials included in each of the additional electrodes 15 and 16 may be the same as or different from each other. The additional electrodes 15 and 16 may be substantially transparent or translucent. Therefore, light generated by the light emitting element LD may pass through the additional electrodes 15 and 16 and may be emitted to the outside of the light emitting element LD. According to an embodiment, in case that the light generated by the light emitting element LD does not pass through the additional electrodes 15 and 16 and is emitted to the outside of the light emitting element LD through a region except for the both ends of the light emitting element LD, the additional electrodes 15 and 16 may include an opaque metal.

In an embodiment, the light emitting element LD may further include an insulating film 14. However, according to an embodiment, the insulating film 14 may be omitted and may be provided so as to cover (or overlap, e.g., in a plan view) only a portion of the first semiconductor layer 11, the active layer 12, and the second semiconductor layer 13.

The insulating film 14 may prevent an electrical short that may occur in case that the active layer 12 contacts a conductive material other than the first semiconductor layer 11 and the second semiconductor layer 13. In addition, by forming the insulating film 14, lifespan and efficiency of the light emitting element LD may be improved by minimizing a surface defect of the light emitting element LD. In addition, in case that light emitting elements LD are closely disposed, the insulating film 14 may prevent an unwanted short that may occur between the light emitting elements LD. Insofar as the active layer 12 may prevent an occurrence of a short with an external conductive material, presence or absence of the insulating film 14 is not limited.

As shown in FIGS. 1A and 1B, the insulating film 14 may be provided in a form entirely surrounding an outer circumferential surface of the light emitting stack including the first semiconductor layer 11, the active layer 12, the second semiconductor layer 13, and the additional electrode 15. For convenience of description, FIG. 1A illustrates that a portion of the insulating film 14 is removed, and the first semiconductor layer 11, the active layer 12, the second semiconductor layer 13, and the additional electrode 15 included in the actual light emitting element LD may be surrounded by the insulating film 14.

In the above-described embodiment, the insulating film 14 entirely surrounds the outer circumferential surface of each of the first semiconductor layer 11, the active layer 12, the second semiconductor layer 13, and the additional electrode 15, but the disclosure is not limited thereto.

According to an embodiment, as shown in FIGS. 2A and 2B, the insulating film 14 may surround the outer circumferential surface of each of the first semiconductor layer 11, the active layer 12, and the second semiconductor layer 13 and may not entirely surround the outer circumferential surface of the additional electrode 15 disposed on the second semiconductor layer 13, or may surround only a portion of the outer circumferential surface of the additional electrode 15 and may not surround the remaining of the outer circumferential surface of the additional electrode 15. However, the insulating film 14 may expose at least both ends of the light emitting element LD, and for example, the insulating film 14 may expose one end of the first semiconductor layer 11 together with the additional electrode 15 disposed at one end side of the second semiconductor layer 13. In addition, according to an embodiment, as shown in FIGS. 3A and 3B, in case that the additional electrodes 15 and 16 are disposed at the both ends of the light emitting element LD, the insulating film 14 may expose at least one region of each of the additional electrodes 15 and 16. As another example, the insulating film 14 may not be provided.

According to an embodiment, the insulating film 14 may include a transparent insulating material. For example, the insulating film 14 may include one or more insulating materials selected from a group including $SiO_2$, $Si_3N_4$, Al$_2$O$_3$, and TiO$_2$, but the disclosure is not limited thereto, and various materials having insulating properties may be used.

In case that the insulating film 14 is provided in the light emitting element LD, a short between the active layer 12 and a first electrode and/or a second electrode (not shown) may be prevented. In addition, by forming the insulating film 14, the lifespan and efficiency of the light emitting element LD may be improved by minimizing the surface defect of the light emitting element LD. In addition, in case that the light emitting elements LD are closely disposed, the insulating film 14 may prevent the unwanted short that may occur between the light emitting elements LD.

The above-described light emitting element LD may be used as a light emitting source of various display devices. The light emitting element LD may be manufactured by a surface treatment process. For example, in case that the light emitting elements LD are mixed in a fluid solution (or a solvent) and supplied to each emission area (for example, an emission area of each pixel or an emission area of each sub-pixel), a surface treatment may be performed on each of the light emitting elements LD so that the light emitting elements LD may be uniformly sprayed without being uniformly aggregated in the solution.

The light emitting device including the light emitting element LD described above may be used in various types of devices that require a light source, including a display device. For example, in case that light emitting elements LD are disposed in an emission area of each pixel of a display panel, the light emitting elements LD may be used as a light source of each of the pixels. However, an application field of the light emitting element LD is not limited to the above-described example. For example, the light emitting element LD may be used in other types of devices that require a light source, such as a lighting device.

Next, the light emitting element LD manufactured by the growth method is described with reference to FIGS. 4A and 4B.

In describing the light emitting element LD manufactured by the growth method, the disclosure is described focusing on a point different from the above-described embodiment, and parts that are not specially described in the light emitting element LD manufactured by the growth method follows the above-described embodiment, and the same reference numerals are given to similar and/or the same components as those of the above-described embodiment.

Referring to FIGS. 4A and 4B, the light emitting element LD according to an embodiment may include the first semiconductor layer 11, the second semiconductor layer 13, and the active layer 12 interposed between the first and second semiconductor layers 11 and 13. According to an embodiment, the light emitting element LD may include a light emission pattern 10 of a core-shell structure including the first semiconductor layer 11 positioned at a center thereof, the active layer 12 surrounding at least one side of the first semiconductor layer 11, the second semiconductor layer 13 surrounding at least one side of the active layer 12, and the additional electrode 15 surrounding at least one side of the second semiconductor layer 13.

The light emitting element LD may be provided in a polypyramidal shape extending in a direction. For example, the light emitting element LD may be provided in a hexapyramidal shape. In case that the extension direction of the light emitting element LD is referred to as the length L direction, the light emitting element LD may have one end (or a lower end) and another end (or an upper end) in the length L direction. A portion of a semiconductor layer of the first and second semiconductor layers 11 and 13 may be exposed at the one end (or the lower end) of the light emitting element LD, and a portion of the other semiconductor layer of the first and second semiconductor layers 11 and 13 may be exposed at the other end (the upper end) of the light emitting element LD. For example, a portion of the first semiconductor layer 11 may be exposed at the one end (or the lower end) of the light emitting element LD, and a portion of the second semiconductor layer 13 may be exposed at the other end (or the upper end) of the light emitting element LD. In this case, in case that the light emitting element LD is applied as the light source of the display device, the exposed portion of the first semiconductor layer 11 may contact one of driving electrodes driving the light emitting element LD and the exposed portion of the second semiconductor layer 13 may contact another driving electrode.

According to an embodiment, in case that the light emitting element LD includes the additional electrode 15, a portion of the additional electrode 15 surrounding at least one side of the second semiconductor layer 13 may be exposed at the other end (or the upper end) of the light emitting element LD. In this case, in case that the light emitting element LD is applied as the light source of the display device, the exposed portion of the additional electrode 15 may contact the other driving electrode and may be electrically connected to the driving electrode.

In an embodiment, the first semiconductor layer 11 may be positioned at a core, for example, a center of the light emitting element LD. The light emitting element LD may have a shape corresponding to a shape of the first semiconductor layer 11. For example, in case that the first semiconductor layer 11 has a hexagonal horn (or hexapyramidal) shape, the light emitting element LD and the light emission pattern 10 may also have a hexagonal horn shape.

The active layer 12 may surround the outer circumferential surface of the first semiconductor layer 11 in the length L direction of the light emitting element LD. Specifically, the active layer 12 may surround the remaining region except for the other end disposed at a lower side thereof, of the both ends of the first semiconductor layer 11 in the length L direction of the light emitting element LD.

The second semiconductor layer 13 may be provided and/or formed in a shape surrounding the active layer 12 in the length L direction of the light emitting element LD, and may include a semiconductor layer of a type different from that of the first semiconductor layer 11. For example, the second semiconductor layer 13 may include at least one p-type semiconductor layer.

In an embodiment, the light emitting element LD may include the additional electrode 15 surrounding at least one side of the second semiconductor layer 13. The additional electrode 15 may be an ohmic contact electrode or a Schottky contact electrode electrically connected to the second semiconductor layer 13, but is not limited thereto.

As described above, the light emitting element LD may be formed in the hexagonal horn shape having a shape in which the both ends are protruded, and may be provided as the light emission pattern 10 of a core-shell structure including the first semiconductor layer 11 provided at the center thereof, the active layer 12 surrounding the first semiconductor layer 11, the second semiconductor layer 13 surrounding the active layer 12, and the additional electrode 15 surrounding the second semiconductor layer 13. The first semiconductor layer 11 may be disposed at the one end (or the lower end) of the light emitting element LD having the hexagonal horn shape, and the additional electrode 15 may be disposed at the other end (or the upper end) of the light emitting element LD.

In addition, according to an embodiment, the light emitting element LD may further include the insulating film 14 provided on an outer circumferential surface of the light emission pattern 10 of the core-shell structure. The insulating film 14 may include a transparent insulating material.

Figure 5:
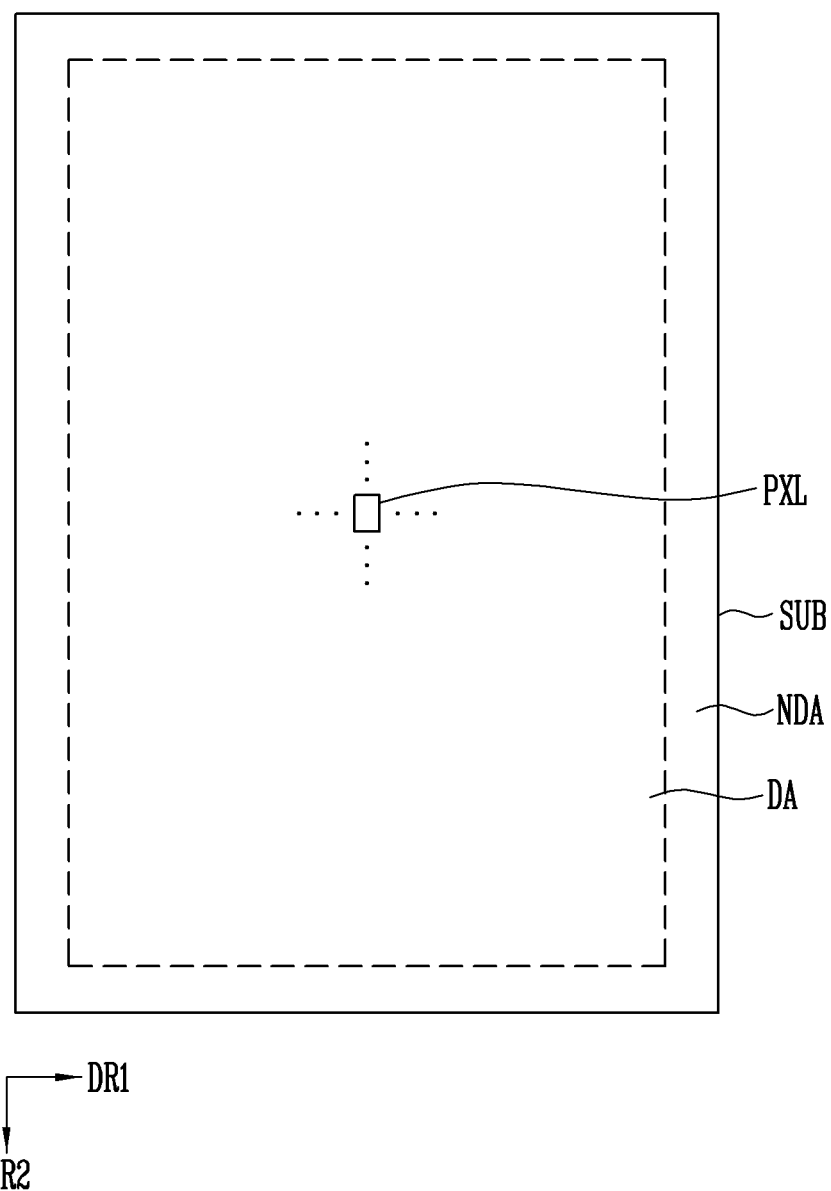
FIG. 5 is a diagram schematically illustrating a display device according to an embodiment of the disclosure, and is a schematic plan view of a display device, in particular, using any one light emitting element as a light emitting source among the light emitting elements shown in FIGS. 1A, 1B, 2A, 2B, 3A, 3B, 4A, and 4B.

FIG. 5 is a diagram illustrating a display device according to an embodiment, and is a schematic plan view of a display device, in particular, using, as a light emitting source, a light emitting element among the light emitting elements shown in FIGS. 1A, 1B, 2A, 2B, 3A, 3B, 4A, and 4B.

For convenience, FIG. 5 illustrates a structure of the display device focusing on a display area where an image is displayed. However, according to an embodiment, at least one driving circuit (for example, a scan driver or a data driver) and/or signal lines, which are not shown, may be further disposed in the display device.

Referring to FIGS. 1A, 1B, 2A, 2B, 3A, 3B, 4A, 4B, and 5, the display device according to an embodiment may include a substrate SUB, pixels PXL provided on the substrate SUB and including at least one light emitting element LD, a driver (not shown) provided on the substrate SUB and driving the pixels PXL, a line unit (or line) (not shown) electrically connecting the pixels PXL and the driver to each other.

The display device may be classified into a passive matrix type display device and an active matrix type display device according to a method of driving the light emitting element LD. For example, in case that the display device is provided as an active matrix type display device, each of the pixels PXL may include a driving transistor that controls an amount of current supplied to the light emitting element LD, a switching transistor that transmits a data signal to the driving transistor, and the like.

Recently, the active matrix type display device that selects and turns on each pixel PXL (to emit light) in terms of resolution, contrast, and operation speed has become mainstream, but the disclosure is not limited thereto, and the passive matrix type display device in which each pixel PXL group turned on may also use components (for example, the first and second electrodes, and the like) for driving the light emitting element LD.

The substrate SUB may include a display area DA and a non-display area NDA.

According to an embodiment, the display area DA may be disposed in a center area of the display device, and the non-display area NDA may be disposed in an edge area of the display device to surround the display area DA. However, positions of the display area DA and the non-display area NDA are not limited thereto, and the positions of the display area DA and the non-display area NDA may be changed.

The display area DA may be an area where the pixels PXL that displays an image are provided. The non-display area NDA may be an area where the driver for driving the pixels PXL and a portion of the line electrically connecting the pixels PXL and the driver to each other are provided.

The display area DA may have various shapes. For example, the display area DA may be provided as a polygon of a closed shape including a side formed of a straight line. In addition, the display area DA may be provided in a circular shape and/or an elliptical shape including a side formed of a curve. In addition, the display area DA may be provided in various shapes such as a semicircle, a semi-ellipse, and the like including a side formed of a straight line and a curve.

The non-display area NDA may be disposed at at least one side of the display area DA. In an embodiment, the non-display area NDA may surround a periphery (or an edge) of the display area DA.

The substrate SUB may include a transparent insulating material and may transmit light.

The substrate SUB may be a rigid substrate. For example, the rigid substrate may be one of a glass substrate, a quartz substrate, a glass ceramic substrate, and a crystalline glass substrate.

In addition, the substrate SUB may be a flexible substrate. The flexible substrate may be one of a film substrate and a plastic substrate including a polymer organic material. For example, the flexible substrate may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate.

However, a material forming the substrate SUB may be variously changed, and may include fiber reinforced plastic (FRP) or the like.

An area of the substrate SUB may be provided as the display area DA to dispose the pixels PXL, and the remaining area of the substrate SUB may be provided as the non-display area NDA. For example, the substrate SUB may include the display area DA including pixel areas in which each pixel PXL is disposed, and the non-display area NDA disposed around the display area DA.

Each of the pixels PXL may be provided in the display area DA on the substrate SUB. In an embodiment, the pixels PXL may be arranged in the display area DA in a stripe or PenTile® structure, but the disclosure is not limited thereto.

Each of the pixels PXL may include at least one light emitting element LD driven by corresponding scan and data signals. The light emitting element LD may have a small size to a degree of the nanoscale to the microscale and may be electrically connected in parallel with adjacent light emitting elements, but the disclosure is not limited thereto. The light emitting element LD may form a light source of each pixel PXL.

Each of the pixels PXL may include at least one light source driven by a signal (for example, a scan signal and a data signal) and/or power (for example, first driving power and second driving power). For example, each pixel PXL may include at least one ultra-small light emitting element LD having a small size to a degree of the nanoscale to the microscale, shown in each of the embodiments of FIGS. 1A to 4B. However, a type of the light emitting element LD that may be used as the light source of each pixel PXL is not limited thereto.

In an embodiment, the color, type, number, and/or the like of the pixels PXL are/is not particularly limited, and for example, the color of light emitted from each pixel PXL may be variously changed.

The driver may provide a signal and power to each pixel PXL through the line, thereby controlling driving of the pixel PXL. The line is omitted from FIG. 5, for convenience of description.

The driver may include a scan driver that provides a scan signal to the pixels PXL through a scan line, an emission driver that provides an emission control signal to the pixels PXL through an emission control line, a data driver that provides a data signal to the pixels PXL through a data line, and a timing controller. The timing controller may control the scan driver, the emission driver, and the data driver.

FIGS. 6A to 6E are schematic diagrams of equivalent circuits illustrating an electrical connection relationship between components included in a pixel shown in FIG. 5 according to various embodiments.

For example, FIGS. 6A to 6E illustrate the electrical connection relationship between the components included in the pixel PXL that may be applied to the active type display device, according to different embodiments. However, types of the components included in the pixel PXL to which an embodiment may be applied are not limited thereto.

As illustrated in FIGS. 6A to 6E, not only the components included in each of the pixels PXL shown in FIG. 5 but also an area where the components are provided are referred to as the pixel PXL. According to an embodiment, each pixel PXL shown in FIGS. 6A to 6E may be one of the pixels PXL included in the display device of FIG. 5, and the pixels PXL may have substantially the same or similar structure.

Referring to FIGS. 1A to 4B, 5, and 6A to 6E, a pixel PXL may include a light emitting part EMU that generates light of a luminance corresponding to the data signal. In addition, the pixel PXL may selectively further include a pixel circuit 144 for driving the light emitting part EMU.

According to an embodiment, the light emitting part EMU may include light emitting elements LD connected to each other in parallel between a first power line PL1 to which first driving power VDD is applied and a second power line PL2 to which second driving power VSS is applied. For example, the light emitting part EMU may include a first electrode EL1 (or a "first alignment electrode") electrically connected to the first driving power VDD via the pixel circuit 144 and the first power line PL1, a second electrode EL2 (or a "second alignment electrode") electrically connected to the second driving power VSS via the second power line PL2, and the light emitting elements LD electrically connected to each other in parallel in a same direction. In an embodiment, the first electrode EL1 may be an anode electrode, and the second electrode EL2 may be a cathode electrode.

In an embodiment, each of the light emitting elements LD included in the light emitting part EMU may include a first end electrically connected to the first driving power VDD through the first electrode EL1 and a second end electrically connected to the second driving power VSS through the second electrode EL2. The first driving power VDD and the second driving power VSS may have different potentials. For example, the first driving power VDD may be set as high-potential power, and the second driving power VSS may be set as low-potential power. In this case, a potential difference between the first driving power VDD and the second driving power VSS may be set as a threshold voltage or more of the light emitting elements LD during a light emission period of the pixel PXL.

As described above, the respective the light emitting elements LD electrically connected to each other in parallel in a same direction (for example, a forward direction) between the first electrode EL1 and the second electrode EL2 to which voltages of different potentials are supplied may form respective effective light sources. Such effective light sources may form the light emitting part EMU of the pixel PXL.

The light emitting elements LD of the light emitting part EMU may emit light with a luminance corresponding to a driving current supplied through the corresponding pixel circuit 144. For example, the pixel circuit 144 may supply a driving current, corresponding to a grayscale value of corresponding frame data, to the light emitting part EMU during each frame period. The driving current supplied to the light emitting part EMU may be divided and flow to the light emitting elements LD electrically connected in the same direction. Therefore, each of the light emitting elements LD may emit light with a luminance corresponding to the current flowing through the light emitting element LD, and thus the light emitting part EMU may emit light of the luminance corresponding to the driving current.

Figure 6A:
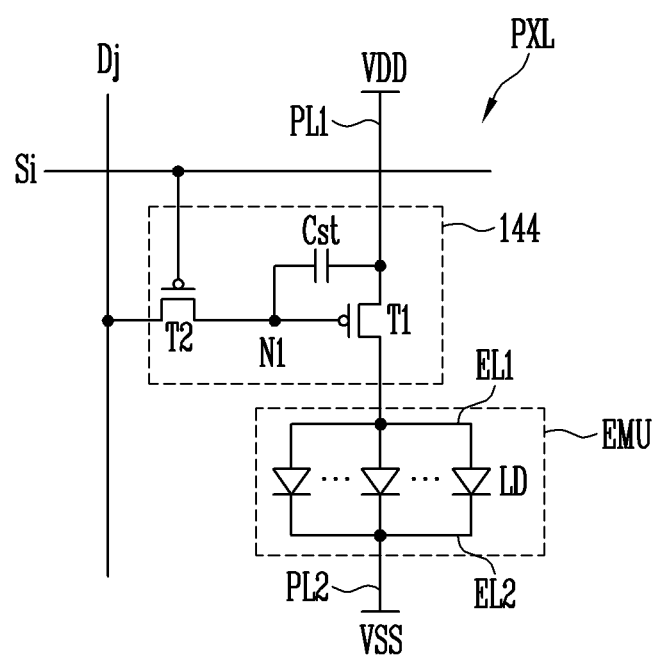
FIGS. 6A to 6E are schematic diagrams of equivalent circuits illustrating an electrical connection relationship between components included in a pixel shown in FIG. 5 according to various embodiments.
Figure 6B:
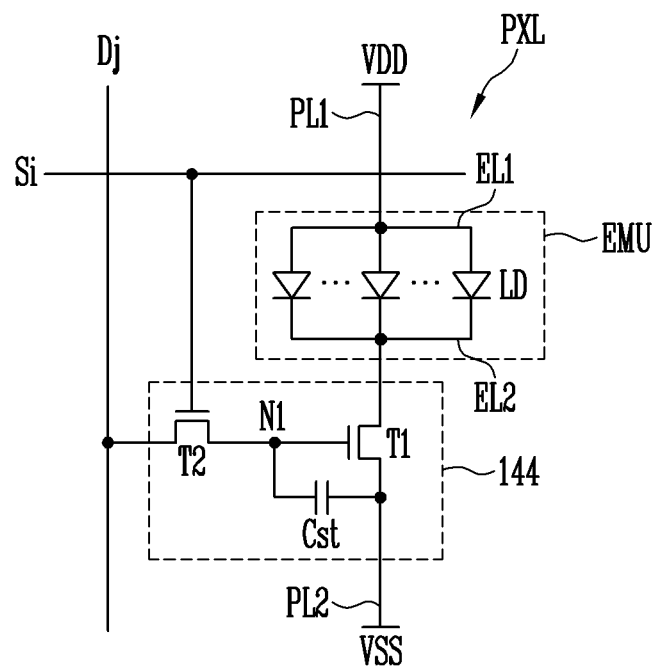
Figure 6C:
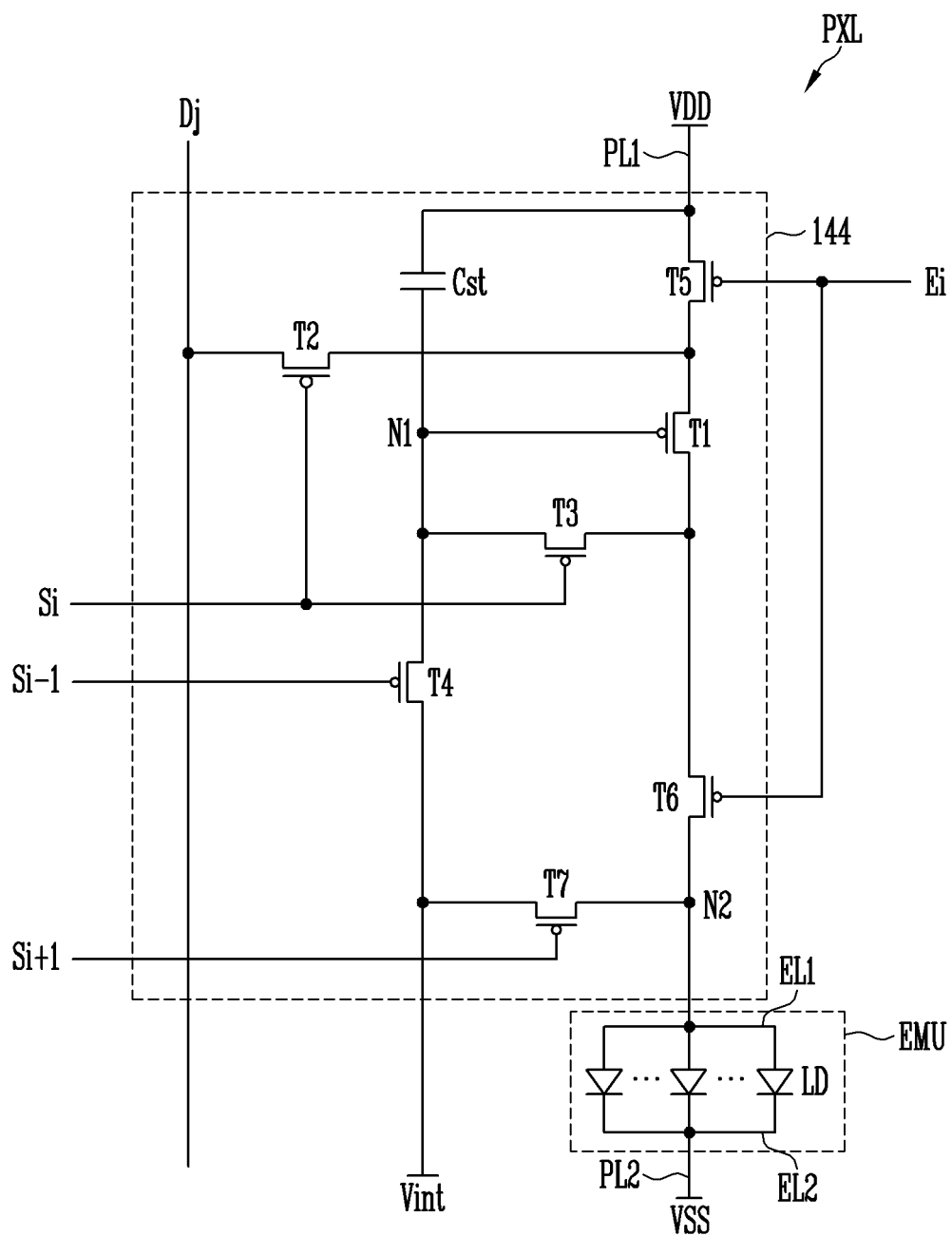
Figure 6D:
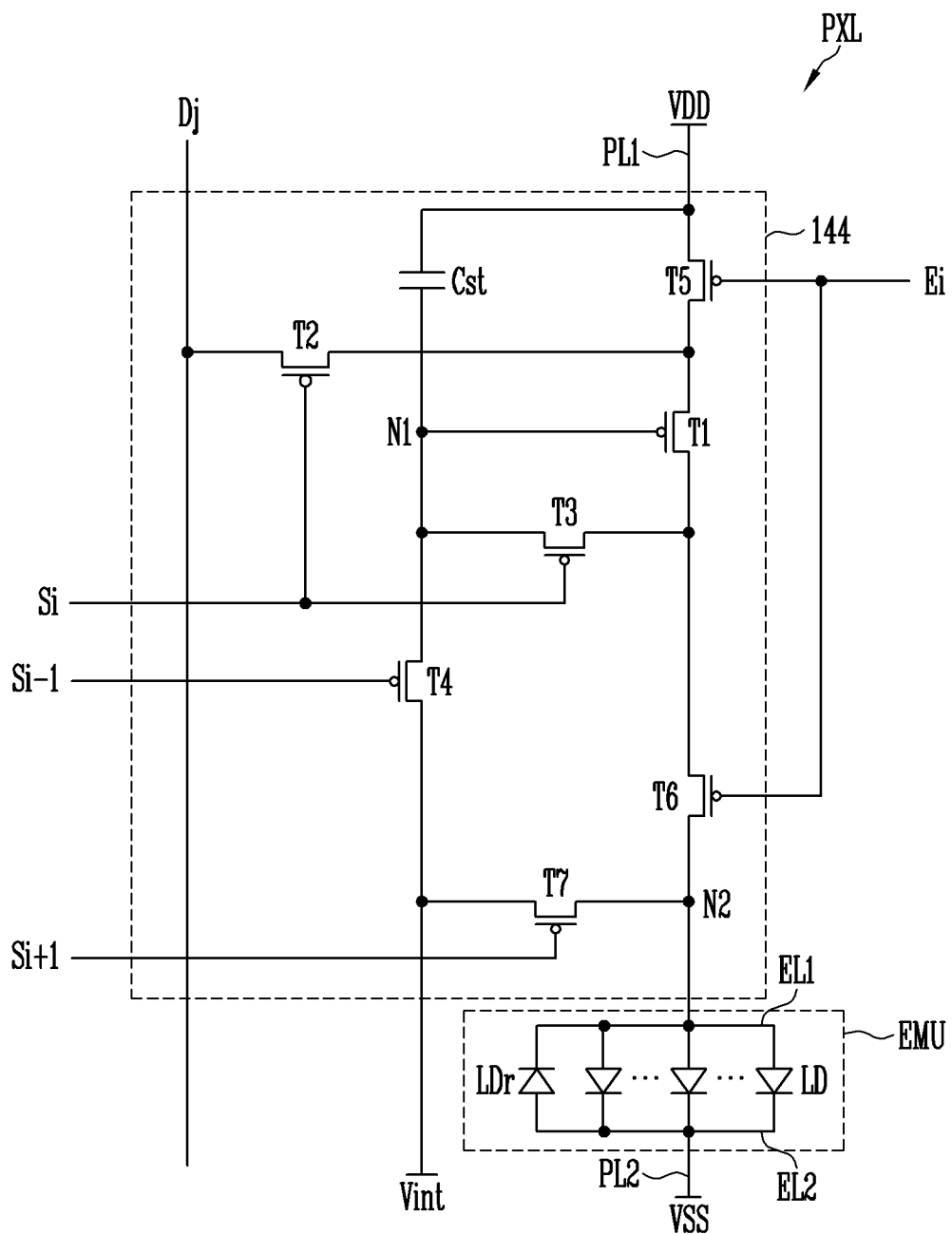
Figure 6E:
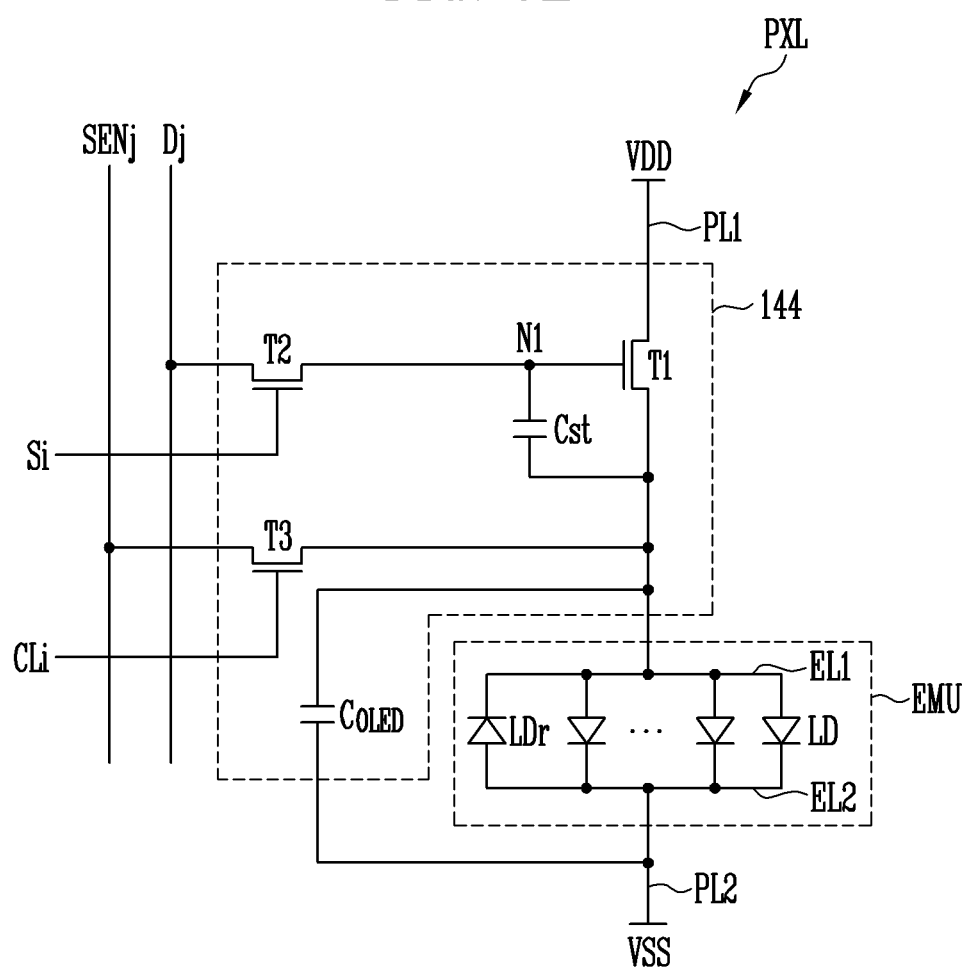

FIGS. 6A to 6E illustrate an embodiment in which the light emitting elements LD are electrically connected in the same direction between the first driving power VDD and the second driving power VSS, but the disclosure is not limited thereto. According to an embodiment, the light emitting part EMU may further include at least one ineffective light source in addition to the light emitting elements LD forming each effective light source. For example, at least one reverse light emitting element LDr may be further electrically connected between the first and second electrodes EL1 and EL2 of the light emitting part EMU, as shown in FIGS. 6D and 6E. The reverse light emitting element LDr may be electrically connected in parallel between the first and second electrodes EL1 and EL2 together with the light emitting elements LD configuring the effective light sources, and may be electrically connected between the first and second electrodes EL1 and EL2 in a direction opposite to that of the light emitting elements LD. The reverse light emitting element LDr maintains an inactive state even though a driving voltage (for example, a driving voltage of a forward direction) is applied between the first and second electrodes EL1 and EL2, and thus a current substantially does not flow through the reverse light emitting element LDr.

The pixel circuit 144 may be electrically connected to a scan line Si and a data line Dj of a corresponding pixel PXL. For example, in case that the pixel PXL is disposed in an i-th (where i is a natural number) row and a j-th (where j is a natural number) column of the display area DA, the pixel circuit 144 of the pixel PXL may be electrically connected to the i-th scan line Si and the j-th data line Dj of the display area DA. According to an embodiment, the pixel circuit 144 may include first and second transistors T1 and T2 and a storage capacitor Cst as shown in FIGS. 6A and 6B. However, a structure of the pixel circuit 144 is not limited to the embodiment shown in FIGS. 6A and 6B.

First, referring to FIG. 6A, the pixel circuit 144 may include the first and second transistors T1 and T2 and the storage capacitor Cst.

A first terminal of the second transistor T2 (switching transistor) may be electrically connected to the data line Dj, and a second terminal thereof may be electrically connected to a first node N1. The first terminal and the second terminal of the second transistor T2 may be different terminals, and for example, in case that the first terminal is a source electrode, the second terminal may be a drain electrode. In addition, a gate electrode of the second transistor T2 may be electrically connected to the scan line Si.

The second transistor T2 may be turned on in case that a scan signal of a voltage (for example, a low voltage) at which the second transistor T2 may be turned on from the scan line Si is supplied, to electrically connect the data line Dj and the first node N1 to each other. In this case, a data signal of a corresponding frame is supplied to the data line Dj, and thus the data signal is transmitted to the first node N1. The data signal transmitted to the first node N1 is charged in the storage capacitor Cst.

A first terminal of the first transistor T1 (driving transistor) may be electrically connected to the first driving power VDD, and a second terminal thereof may be electrically connected to the first electrode EL1 of each of the light emitting elements LD. A gate electrode of the first transistor T1 may be electrically connected to the first node N1. The first transistor T1 controls an amount of the driving current supplied to the light emitting elements LD in response to a voltage of the first node N1.

One electrode (or first electrode) of the storage capacitor Cst may be electrically connected to the first driving power VDD, and another electrode (or second electrode) may be electrically connected to the first node N1. The storage capacitor Cst charges a voltage corresponding to the data signal supplied to the first node N1 and maintains the charged voltage until the data signal of a next frame is supplied.

Each of FIGS. 6A and 6B illustrate the pixel circuit 144 including the second transistor T2 for transmitting the data signal to the pixel PXL, the storage capacitor Cst for storing the data signal, and the first transistor T1 for supplying the driving current corresponding to the data signal to the light emitting elements LD.

However, the disclosure is not limited thereto, and the structure of the pixel circuit 144 may be variously modified and implemented. For example, the pixel circuit 144 may further include other circuit elements such as at least one transistor element such as a transistor element for compensating for a threshold voltage of the first transistor T1, a transistor element for initializing the first node N1, and/or a transistor element for controlling a light emission time of the light emitting element LD, or a boosting capacitor for boosting the voltage of the first node N1.

In addition, FIG. 6A illustrates that the transistors included in the pixel circuit 144, for example, the first and second transistors T1 and T2 are P-type transistors, but the disclosure is not limited thereto. For example, at least one of the first and second transistors T1 and T2 included in the pixel circuit 144 may be changed to an N-type transistor.

Referring to FIGS. 1A to 4B, 5, and 6B, according to an embodiment, the first and second transistors T1 and T2 may be implemented as N-type transistors. A configuration or an operation of the pixel circuit 144 shown in FIG. 6B is similar to that of the pixel circuit 144 of FIG. 6A except for a connection position change of some components due to a transistor type change. Therefore, description thereof will be briefly provided.

In an embodiment, the pixel circuit 144 shown in FIG. 6B may include the first and second transistors T1 and T2 formed as the N-type transistors, and the storage capacitor Cst. In case that the first and second transistors T1 and T2 are formed as the N-type transistors, the light emitting part EMU may be electrically connected between the first driving power VDD and the pixel circuit 144 for stabilization of the storage capacitor Cst that charges the voltage corresponding to the data signal supplied to the first node N1. However, the disclosure is not limited thereto, and according to an embodiment, the light emitting part EMU shown in FIG. 6B may be electrically connected between the pixel circuit 144 and the second driving power VSS. In an embodiment, the configuration of the pixel circuit 144 is not limited to the embodiment shown in FIGS. 6A and 6B. For example, the pixel circuit 144 may be configured as in an embodiment shown in FIGS. 6C and 6D.

As shown in FIGS. 6C and 6D, the pixel circuit 144 may be electrically connected to the scan line Si and the data line Dj of the pixel PXL. For example, in case that the pixel PXL is disposed in the i-th row and the j-th column of the display area DA, the pixel circuit 144 of the corresponding pixel PXL may be electrically connected to the i-th scan line Si and the j-th data line Dj of the display area DA.

In addition, according to an embodiment, the pixel circuit 144 may be further electrically connected to at least another scan line. For example, the pixel PXL disposed in the i-th row of the display area DA may be further electrically connected to an (i−1)-th scan line Si−1 and/or an (i+1)-th scan line Si+1. In addition, according to an embodiment, the pixel circuit 144 may be further electrically connected to third power in addition to the first driving power VDD and the second driving power VSS. For example, the pixel circuit 144 may also be electrically connected to initialization power Vint.

The pixel circuit 144 may include first to seventh transistors T1 to T7 and a storage capacitor Cst.

An electrode of the first transistor T1 (driving transistor), for example, a source electrode may be electrically connected to the first driving power VDD via the fifth transistor T5, and another electrode thereof, for example, a drain electrode may be electrically connected to one side end of the light emitting elements LD via the sixth transistor T6. In addition, a gate electrode of the first transistor T1 may be electrically connected to a first node N1. The first transistor T1 controls the driving current flowing between the first driving power VDD and the second driving power VSS via the light emitting elements LD in response to a voltage of the first node N1.

The second transistor T2 (switching transistor) may be electrically connected between the j-th data line Dj electrically connected to the pixel PXL and the source electrode of the first transistor T1. In addition, a gate electrode of the second transistor T2 may be electrically connected to the i-th scan line Si electrically connected to the pixel PXL. The second transistor T2 may be turned on in case that a scan signal having a gate-on voltage (for example, a low voltage) is supplied from the i-th scan line Si, to electrically connect the j-th data line Dj to the source electrode of the first transistor T1. Therefore, in case that the second transistor T2 is turned on, the data signal supplied from the j-th data line Dj is transmitted to the first transistor T1.

The third transistor T3 may be electrically connected between the drain electrode of the first transistor T1 and the first node N1. In addition, a gate electrode of the third transistor T3 may be electrically connected to the i-th scan line Si. The third transistor T3 may be turned on in case that the scan signal of the gate-on voltage is supplied from the i-th scan line Si, to electrically connect the drain electrode of the first transistor T1 and the first node N1 to each other.

The fourth transistor T4 may be electrically connected between the first node N1 and an initialization power line to which the initialization power Vint is applied. In addition, a gate electrode of the fourth transistor T4 may be electrically connected to a previous scan line, for example, the (i−1)-th scan line Si−1. The fourth transistor T4 may be turned on in case that the scan signal of the gate-on voltage is supplied to the (i−1)-th scan line Si−1, to transmit a voltage of the initialization power Vint to the first node N1. The initialization power Vint may have a voltage equal to or less than the lowest voltage of the data signal.

The fifth transistor T5 may be electrically connected between the first driving power VDD and the first transistor T1. In addition, a gate electrode of the fifth transistor T5 may be electrically connected to a corresponding emission control line, for example, an i-th emission control line Ei. The fifth transistor T5 may be turned off in case that an emission control signal of a gate-off voltage is supplied to the i-th emission control line Ei, and may be turned on in other cases.

The sixth transistor T6 may be electrically connected between the first transistor T1 and a second node N2, which is electrically connected to the one end of the light emitting elements LD. In addition, a gate electrode of the sixth transistor T6 may be electrically connected to the i-th emission control line Ei. The sixth transistor T6 may be turned off in case that the emission control signal of the gate-off voltage is supplied to the i-th emission control line Ei, and may be turned on in other cases.

The seventh transistor T7 may be electrically connected between the one end of the light emitting elements LD and the initialization power line. In addition, a gate electrode of the seventh transistor T7 may be electrically connected to one of next scan lines, for example, the (i+1)-th scan line Si+1. The seventh transistor T7 may be turned on in case that the scan signal having the gate-on voltage is supplied to the (i+1)-th scan line Si+1, to supply the voltage of the initialization power Vint to the one end of the light emitting elements LD.

The storage capacitor Cst may be electrically connected between the first driving power VDD and the first node N1. The storage capacitor Cst may store a data signal supplied to the first node N1 and a voltage corresponding to the threshold voltage of the first transistor T1 during each frame period.

FIGS. 6C and 6D illustrate that the transistors included in the pixel circuit 144, for example, the first to seventh transistors T1 to T7 are P-type transistors, but the disclosure is not limited thereto. For example, at least one of the first to seventh transistors T1 to T7 may be changed to an N-type transistor.

In an embodiment, the configuration of the pixel circuit 144 is not limited to the embodiment shown in FIGS. 6A to 6D. For example, the pixel circuit 144 may be configured as in an embodiment shown in FIG. 6E.

The pixel circuit 144 may be further electrically connected to a control line CLi and a sensing line SENj as shown in FIG. 6E. For example, the pixel circuit 144 of the pixel PXL disposed in the i-th row and the j-th column of the display area DA may be electrically connected to an i-th control line CLi and a j-th sensing line SENj of the display area DA. The above-described pixel circuit 144 may further include a third transistor T3 in addition to the first and second transistors T1 and T2 shown in FIGS. 6A and 6B.

The third transistor T3 is electrically connected between the first transistor T1 and the sensing line SENj. For example, an electrode of the third transistor T3 may be electrically connected to the terminal (for example, the source electrode) of the first transistor T1 electrically connected to the first electrode EL1, and another electrode of the third transistor T3 may be electrically connected to the sensing line SENj. In case that the sensing line SENj is omitted, a gate electrode of the third transistor T3 may be electrically connected to the data line Dj.

According to an embodiment, a gate electrode of the third transistor T3 is electrically connected to the control line CLi. In case that the control line CLi is omitted, the gate electrode of the third transistor T3 may be electrically connected to the scan line Si. The third transistor T3 may be turned on by a control signal of a gate-on voltage (for example, a high-level voltage) supplied to the control line CLi during a sensing period, to electrically connect the sensing line SENj and the second transistor T2 to each other.

According to an embodiment, a sensing period may be a period for extracting characteristic information (for example, the threshold voltage or the like of the first transistor T1) of each of the pixels PXL disposed in the display area DA. During the above-described sensing period, the first transistor T1 may be turned on by supplying a reference voltage, at which the first transistor T1 may be turned on, to the first node N1 through the data line Dj and the second transistor T2, or electrically connecting each pixel PXL to a current source or the like. In addition, the first transistor T1 may be electrically connected to the sensing line SENj by supplying the control signal of the gate-on voltage to the third transistor T3 to turn on the third transistor T3. Therefore, the characteristic information of each pixel PXL including the threshold voltage or the like of the first transistor T1 may be extracted through the sensing line SENj. The extracted characteristic information may be used to convert image data so that a characteristic deviation between the pixels PXL is compensated. A capacitor $C_{OLED}$ may be disposed between the first and second electrodes EL1 and EL2.

FIG. 6E illustrates an embodiment in which all of the first to third transistors T1 to T3 are N-type transistors, but the disclosure is not limited thereto. For example, at least one of the above-described first to third transistors T1 to T3 may be changed to a P-type transistor. In addition, FIG. 6E illustrates an embodiment in which the light emitting part EMU is electrically connected between the pixel circuit 144 and the second driving power VSS, but the light emitting part EMU also may be electrically connected between the first driving power VDD and the pixel circuit 144.

In addition, FIGS. 6A to 6E illustrate an embodiment in which all of the light emitting elements LD forming each light emitting part EMU are electrically connected to each other in parallel, but the disclosure is not limited thereto. According to an embodiment, the light emitting part EMU may include at least one series stage including light emitting elements LD electrically connected in parallel with each other. For example, the light emitting part EMU may have a serial or parallel mixed structure. This will be described below with reference to FIGS. 7A to 7C.

The structure of the pixel PXL that may be applied to the disclosure is not limited to the embodiments shown in FIGS. 6A to 6E, and the corresponding pixel PXL may have various structures. In addition, in an embodiment, each pixel PXL may be provided inside a passive type light emitting display device or the like. In this case, the pixel circuit 144 may be omitted, and each of the both ends of the light emitting elements LD included in the light emitting part EMU may be directly electrically connected to each of the scan lines Si−1, Si, Si+1, the data line Dj, the first power line PL1 to which the first driving power VDD is applied, the second power line PL2 to which the second driving power VSS is applied, a predetermined control line, and/or the like.

Figure 7A:
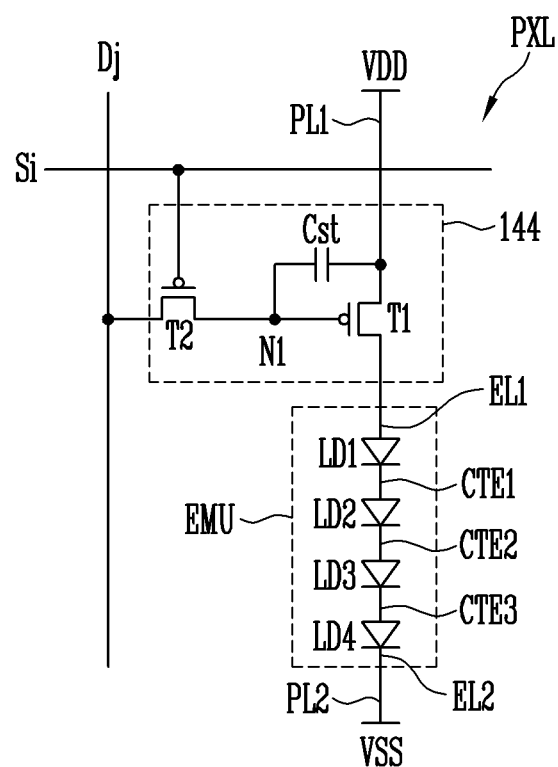
FIGS. 7A to 7C are schematic diagrams of equivalent circuits illustrating the electrical connection relation of the components included in a pixel shown in FIG. 5 according to another embodiment.
Figure 7B:
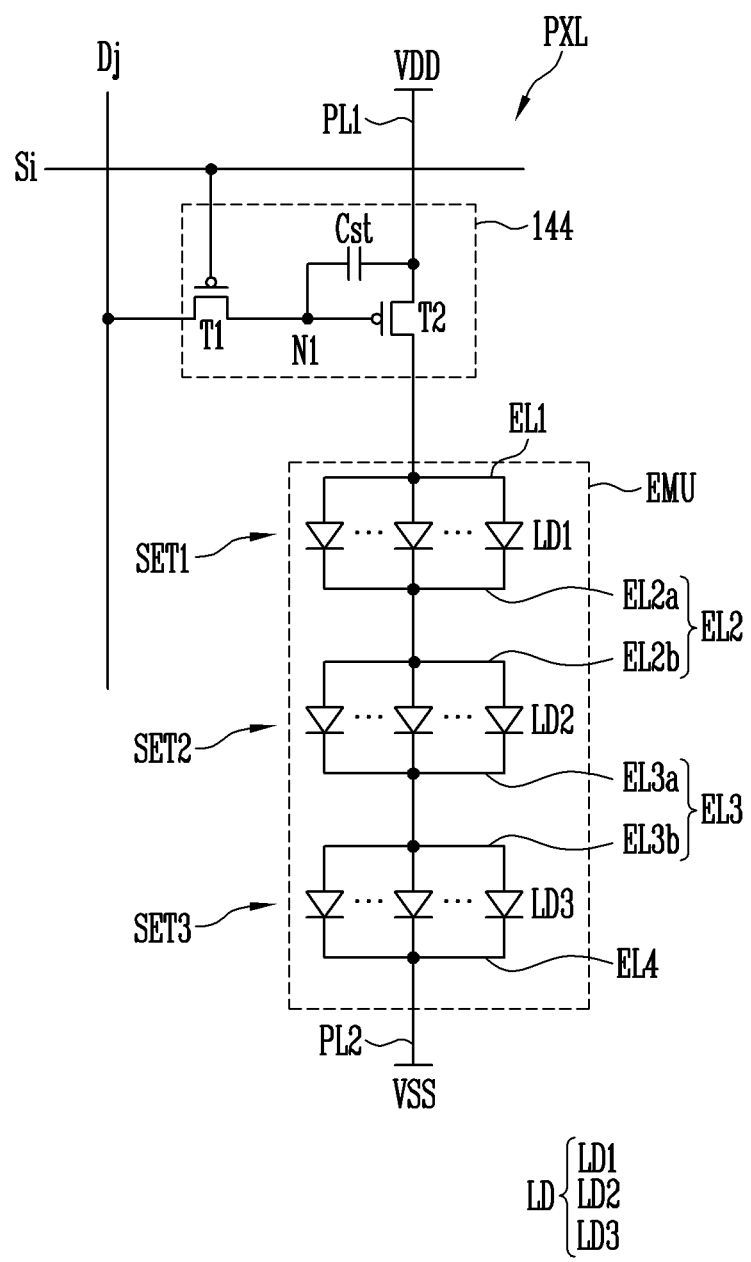
Figure 7C:
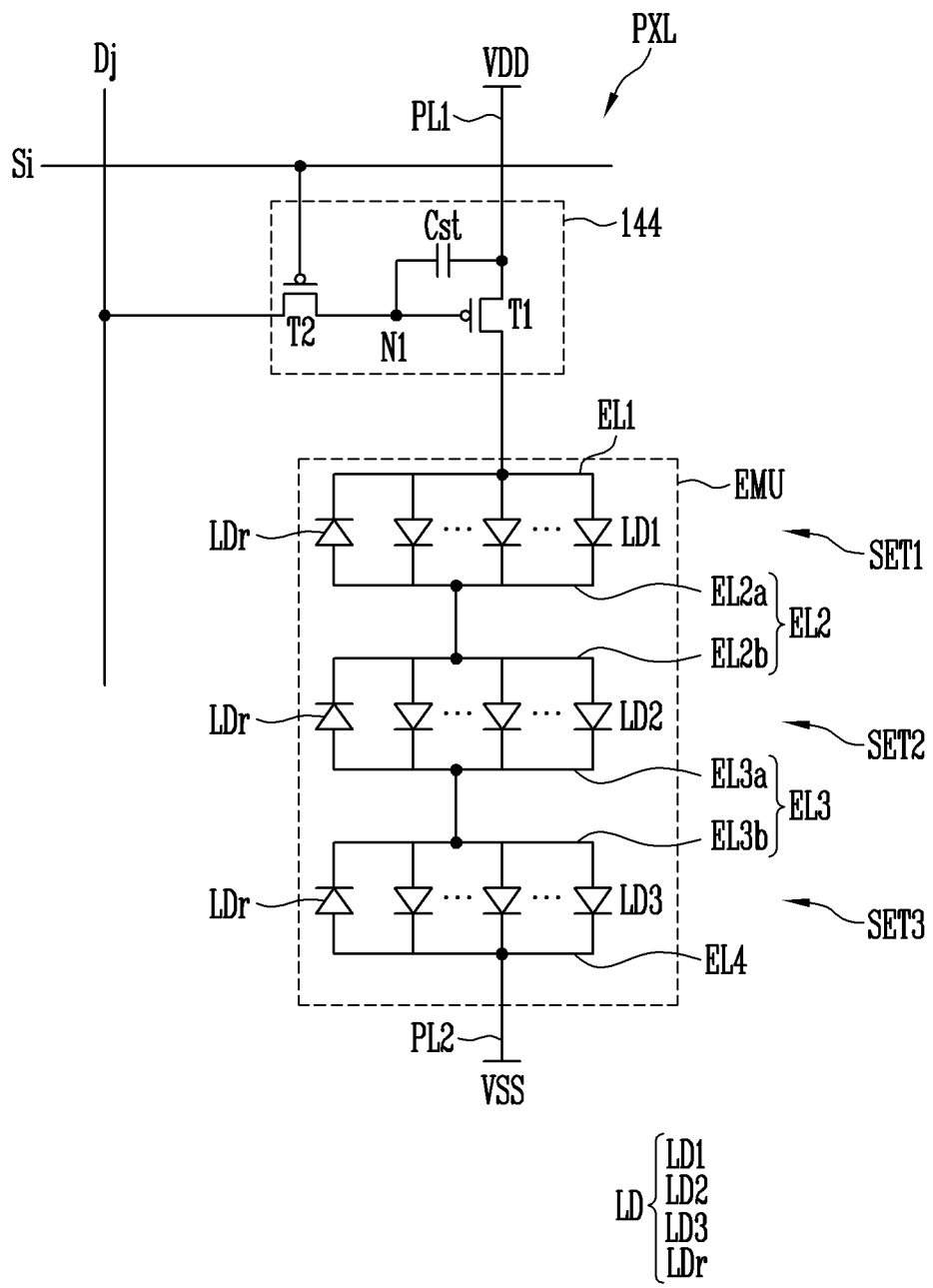

FIGS. 7A to 7C are schematic diagrams of equivalent circuits illustrating the electrical connection relation between the components included in a pixel shown in FIG. 5 according to another embodiment. As illustrated in FIGS. 7A to 7C, the light emitting part EMU of each pixel PXL may include series stages which are continuously electrically connected to each other. In describing the embodiments of FIGS. 7A to 7C, in order to avoid repetitive description, detailed description of a configuration similar or identical to that of the embodiments of FIGS. 6A to 6E, for example, the pixel circuit 144, will be omitted.

First, referring to FIG. 7A, the light emitting part EMU may include light emitting elements electrically connected in series to each other. For example, the light emitting part EMU may include a first light emitting element LD1, a second light emitting element LD2, a third light emitting element LD3, and a fourth light emitting element LD4 electrically connected in series in a forward direction between the first driving power VDD and the second driving power VSS to form an effective light source. In the following embodiment, in case that at least one light emitting element among the first to fourth light emitting elements LD1 to LD4 is arbitrarily referred to as or the first to fourth light emitting elements LD1 to LD4 are collectively referred to as, the at least one light emitting element or the first to fourth light emitting elements LD1 to LD4 may be referred to as the light emitting element LD or the light emitting elements LD.

One end (for example, the second semiconductor layer) of the first light emitting element LD1 may be electrically connected to the first driving power VDD through the first electrode EL1, and another end (for example, the first semiconductor layer) of the first light emitting element LD1 may be electrically connected to one end (for example, the second semiconductor layer) of the second light emitting element LD2 through a first intermediate electrode CTE1 electrically connected between first and second series stages.

The one end (for example, the second semiconductor layer) of the second light emitting element LD2 may be electrically connected to the first intermediate electrode CTE1, and another end (for example, the first semiconductor layer) of the second light emitting element LD2 may be electrically connected to one end (for example, the second semiconductor layer) of the third light emitting element LD3 through a second intermediate electrode CTE2 electrically connected between second and third series stages.

The one end of the third light emitting element LD3 may be electrically connected to the second intermediate electrode CTE2, and another end (for example, the first semiconductor layer) of the third light emitting element LD3 may be electrically connected to one end (for example, the second semiconductor layer) of the fourth light emitting element LD4 through a third intermediate electrode CTE3 electrically connected between third and fourth series stages.

The one end of the fourth light emitting element LD4 may be electrically connected to the third intermediate electrode CTE3, and another end (for example, the first semiconductor layer) of the fourth light emitting element LD4 may be electrically connected to the second driving power VSS through the second electrode EL2.

As described above, the first to fourth light emitting elements LD1 to LD4 may be electrically connected in series between the first and second electrodes EL1 and EL2 of the light emitting part EMU of the pixel PXL.

In a case of the light emitting part EMU having a structure in which the light emitting elements LD are electrically connected in series, a voltage applied between the first and second electrodes EL1 and EL2 may increase and a magnitude of the driving current flowing through the light emitting part EMU may decrease compared to a light emitting part EMU having a structure in which the light emitting elements LD are electrically connected in parallel. Therefore, in case that the light emitting part EMU of each pixel PXL is configured in a series structure, power consumption of the display device may be reduced.

According to an embodiment, at least one series stage may include light emitting elements LD electrically connected in parallel to each other. In this case, the light emitting part EMU of each pixel PXL may be configured in a series/parallel mixed structure. For example, the light emitting part EMU may be configured as shown in FIGS. 7B and 7C.

Referring to FIGS. 7B and 7C, the light emitting part EMU of the pixel PXL may include series stages sequentially electrically connected between the first driving power VDD and the second driving power VSS. In addition, each series stage may include one or more light emitting elements LD electrically connected in a forward direction between two electrodes forming an electrode pair of a corresponding series stage. For example, the light emitting part EMU may include first to third series stages SET1 to SET3 sequentially electrically connected between the first driving power VDD and the second driving power VSS. Each of the first to third series stages SET1 to SET3 may include two electrodes EL1 and EL2a, EL2b and EL3a, and EL3b and EL4 forming an electrode pair of a corresponding series stage, and light emitting elements LD electrically connected in parallel in the forward direction, for example, in a same direction, between the two electrodes EL1 and EL2a, EL2b and EL3a, and EL3b and EL4.

The first series stage SET1 may include the first electrode EL1 and the 2a-th electrode EL2a among the two electrodes EL1 and EL2a, EL2b and EL3a, and EL3b and EL4 forming the electrode pair included in the light emitting part EMU, and may include at least one first light emitting element LD1 electrically connected between the first electrode EL1 and the 2a-th electrode EL2a. For example, the first series stage SET1 may include the first electrode EL1 electrically connected to the first driving power VSS via the pixel circuit 144, the 2a-th electrode EL2a electrically connected to the second driving power VSS, and first light emitting elements LD1 electrically connected between the first electrode EL1 and the 2a-th electrode EL2a. One end (for example, the second semiconductor layer) of each first light emitting element LD1 is electrically connected to the first electrode EL1 of the first series stage SET1, and another end (for example, the first semiconductor layer) thereof is electrically connected to the 2a-th electrode EL2a of the first series stage SET1. The first light emitting elements LD1 may be electrically connected in parallel between the first electrode EL1 and the 2a-th electrode EL2a of the first series stage SET1, and may be electrically connected in a same direction (for example, the forward direction) between the first electrode EL1 and the 2a-th electrode EL2a. According to an embodiment, as shown in FIG. 7C, at least one reverse light emitting element LDr may be further electrically connected to the first series stage SET1. The reverse light emitting element LDr may be electrically connected in parallel between the first electrode EL1 and the 2a-th electrode EL2a together with the first light emitting elements LD1 configuring effective light sources, and may be electrically connected between the first electrode EL1 and the 2a-th electrode EL2a in a direction opposite to that of the first light emitting elements LD1. For example, a first semiconductor layer of the reverse light emitting element LDr may be electrically connected to the first electrode ELL and a second semiconductor layer thereof may be electrically connected to the 2a-th electrode EL2a. The reverse light emitting element LDr maintains an inactive state even though a driving voltage (for example, a driving voltage of a forward direction) is applied between the first and 2a-th electrodes EL1 and EL2a, and thus a current substantially does not flow through the reverse light emitting element LDr.

The second series stage SET2 may include the 2b-th electrode EL2b and the 3a-th electrode EL3a among the two electrodes EL1 and EL2a, EL2b and EL3a, and EL3b and EL4 forming the electrode pair included in the light emitting part EMU, and may include at least one second light emitting element LD2 electrically connected between the 2b-th electrode EL2b and the 3a-th electrode EL3a. For example, the second series stage SET2 may include the 2b-th electrode EL2b electrically connected to the first driving power VDD via the pixel circuit 144 and the first series stage SET1, the 3a-th electrode EL3a electrically connected to the second driving power VDD, and second light emitting elements LD2 electrically connected between the 2b-th electrode EL2b and the 3a-th electrode EL3a. One end (for example, the second semiconductor layer) of each second light emitting element LD2 is electrically connected to the 2b-th electrode EL2b of the second series stage SET2, and another end (for example, the first semiconductor layer) thereof is electrically connected to the 3a-th electrode EL3a of the second series stage SET2. The second light emitting elements LD2 may be electrically connected in parallel between the 2b-th and 3a-th electrodes EL2b and EL3a of the second series stage SET2, and may be electrically connected in a same direction (for example, the forward direction) between the first and second driving power VDD and VSS through the 2b-th and EL3a. According to an embodiment, as shown in FIG. 7C, at least one reverse light emitting element LDr may be further electrically connected between the 2b-th and 3a-th electrodes EL2b and EL3a. The reverse light emitting element LDr may be electrically connected in parallel between the 2b-th and 3a-th electrodes EL2b and EL3a together with the second light emitting elements LD2 configuring effective light sources, and may be electrically connected between the 2b-th and 3a-th electrodes EL2b and EL3a in a direction opposite to that of the second light emitting elements LD2. For example, the first semiconductor layer of the reverse light emitting element LDr may be electrically connected to the 2b-th electrode EL2b, and the second semiconductor layer thereof may be electrically connected to the 3a-th electrode EL3a.

In an embodiment, the 2a-th electrode EL2a of the first series stage SET1 and the 2b-th electrode EL2b of the second series stage SET2 may be integrally provided (or integral with each other) and electrically connected to each other. For example, the 2a-th electrode EL2a of the first series stage SET1 and the 2b-th electrode EL2b of the second series stage SET2 may form the second electrode EL2 electrically connecting the first series stage SET1 and the second series stage SET2 to each other. As described above, in case that the 2a-th electrode EL2a of the first series stage SET1 and the 2b-th electrode EL2b of the second series stage SET2 are integrally provided, the 2a-th electrode EL2a and the 2b-th electrode EL2b may be different regions of the second electrode EL2.

The third series stage SET3 may include the 3b-th electrode EL3b and the fourth electrode EL4 among the two electrodes EL1 and EL2a, EL2b and EL3a, and EL3b and EL4 forming the electrode pair included in the light emitting part EMU, and may include at least one third light emitting element LD3 electrically connected between the 3b-th electrode EL3b and the fourth electrode EL4. For example, the third series stage SET3 may include the 3b-th electrode EL3b electrically connected to the first driving power VDD via the pixel circuit 144 and previous series stages, for example, the first and second series stages SET1 and SET2, the fourth electrode EL4 electrically connected to the second driving power VSS, and third light emitting elements LD3 electrically connected between the 3b-th electrode EL3b and the fourth electrode EL4. One end (for example, the second semiconductor layer) of each third light emitting element LD3 is electrically connected to the 3b-th electrode EL3b of the third series stage SET3, and another end (for example, the first semiconductor layer) thereof is electrically connected to the fourth electrode EL4 of the third series stage SET3. The third light emitting elements LD3 may be electrically connected in parallel between the 3b-th electrode EL3b and the fourth electrode EL4 of the third series stage SET3, and may be electrically connected in a same direction (for example, the forward direction) between the first and second driving power VDD and VSS through the 3b-th electrode EL3b and the fourth electrode EL4. According to an embodiment, as shown in FIG. 7C, at least one reverse light emitting element LDr may be further electrically connected between the 3b-th and fourth electrodes EL3b and EL4. The reverse light emitting element LDr may be electrically connected in parallel between the 3b-th and fourth electrodes EL3b and EL4 together with the third light emitting elements LD3 configuring effective light sources, and may be electrically connected between the 3b-th and fourth electrodes EL3b and EL4 in a direction opposite to that of the third light emitting elements LD3. For example, the first semiconductor layer of the reverse light emitting element LDr may be electrically connected to the 3b-th electrode EL3b, and the second semiconductor layer thereof may be electrically connected to the fourth electrode EL4.

In an embodiment, the 3a-th electrode EL3a of the second series stage SET2 and the 3b-th electrode EL3b of the third series stage SET3 may be integrally provided and electrically connected to each other. For example, the 3a-th electrode EL3a of the second series stage SET2 and the 3b-th electrode EL3b of the third series stage SET3 may form a third electrode EL3 electrically connecting the second series stage SET2 and the third series stage SET3 to each other. As described above, in case that the 3a-th electrode EL3a of the second series stage SET2 and the 3b-th electrode EL3b of the third series stage SET3 are integrally provided, the 3a-th electrode EL3a and the 3b-th electrode EL3b may be different regions of the third electrode EL3.

In the above-described embodiment, the first electrode EL1 of the first series stage SET1 may be the anode electrode of the light emitting part EMU of each pixel PXL, and the fourth electrode EL4 of the third series stage SET3 may be the cathode electrode of the light emitting part EMU.

As described above, the light emitting part EMU of the pixel PXL including the light emitting elements LD electrically connected in the series/parallel mixed structure may readily adjust a driving current/voltage condition according to an applied product specification.

In particular, the light emitting part EMU of the pixel PXL including the light emitting elements LD electrically connected in the series/parallel mixed structure may reduce the driving current compared to the light emitting part EMU of the structure in which the light emitting elements LD are electrically connected in parallel. In addition, the light emitting part EMU of the pixel PXL including the light emitting elements LD electrically connected in the series/parallel mixed structure may reduce the driving voltage applied to the both ends of the light emitting part EMU compared to the light emitting part EMU of the structure in which all of the light emitting elements LD are electrically connected in series. In addition, in case that all of the light emitting elements LD are electrically connected in series, and at least one of the light emitting elements LD electrically connected in series is not completely electrically connected in the forward direction (or the reverse light emitting element LDr is included), a path through which the driving current may flow in the pixel PXL is blocked, and thus a dark spot defect may be caused. On the other hand, in case that the light emitting elements LD are electrically connected in the series/parallel mixed structure, even though some light emitting elements LD are not electrically connected to each other in the forward direction (or the reverse light emitting element LDr is included) or a defect occurs in some light emitting elements LD in each series stage, the driving current may flow through another light emitting element LD of a corresponding series stage. Accordingly, a defect of the pixel PXL may be prevented or reduced.

Figure 8:
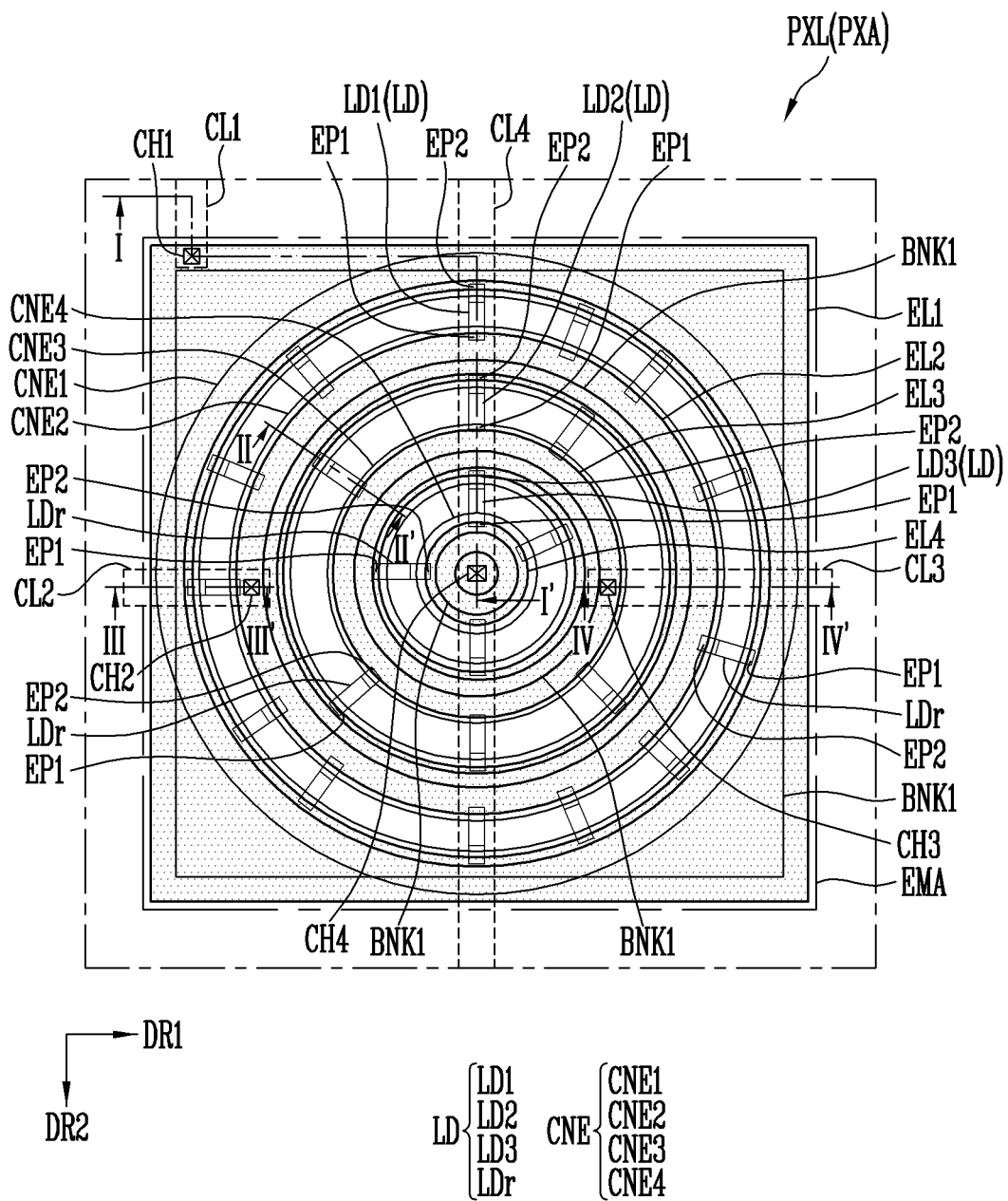
FIG. 8 is a plan view schematically illustrating a pixel among pixels shown in FIG. 5.
Figure 9:
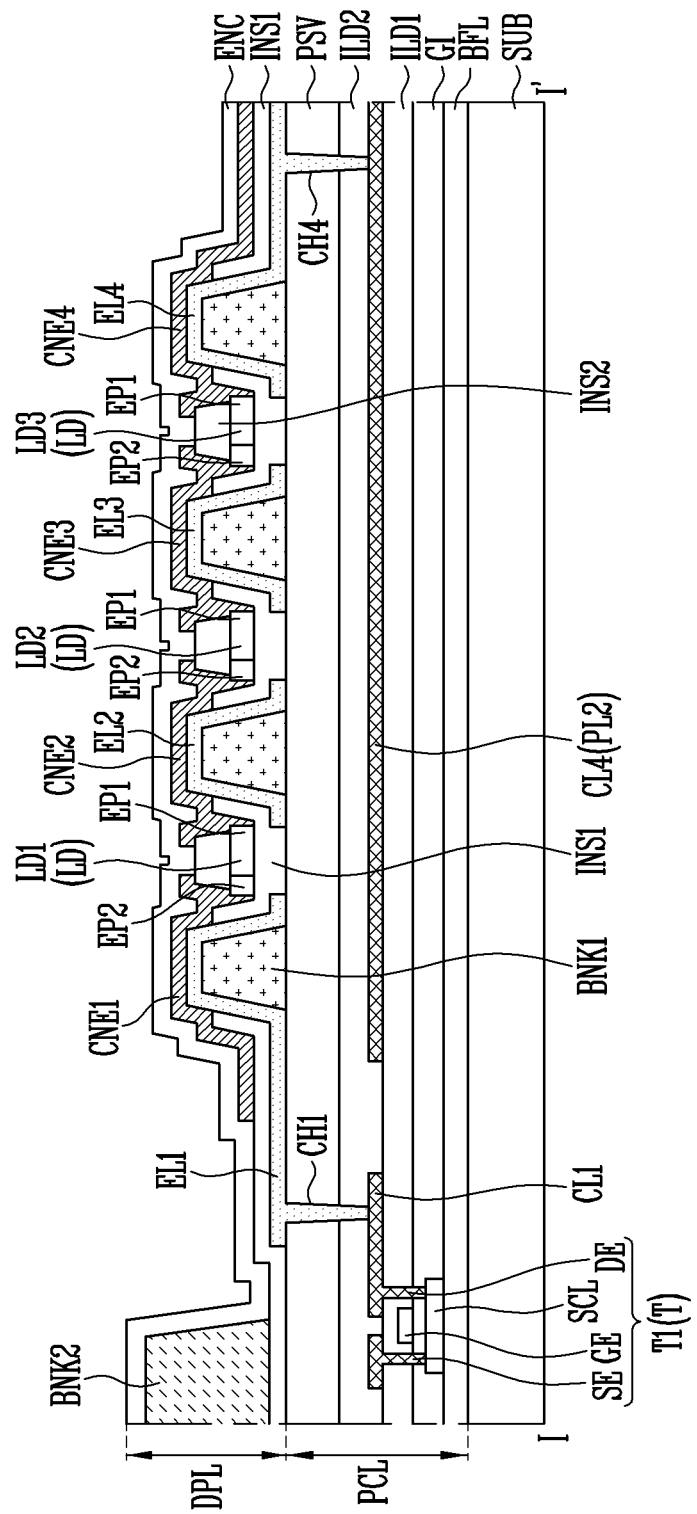
FIG. 9 is a schematic cross-sectional view taken along line I-I' of FIG. 8.
Figure 10:
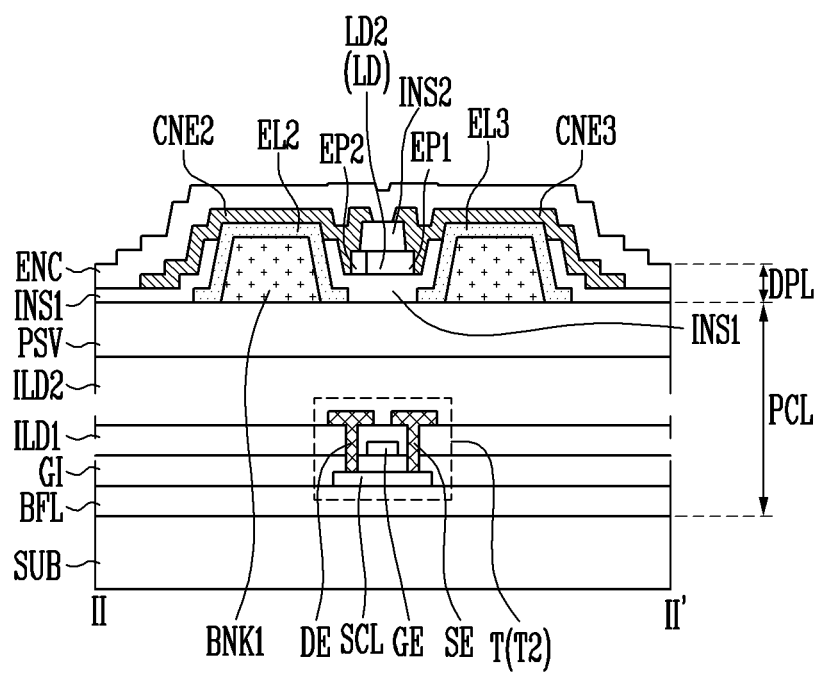
FIG. 10 is a schematic cross-sectional view taken along line II-II' of FIG. 8.
Figure 11:
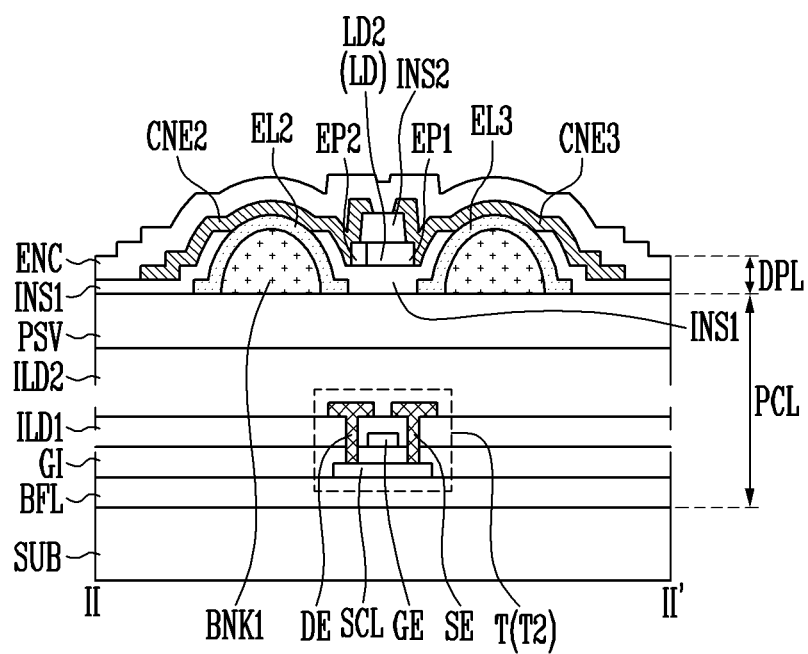
FIG. 11 is a schematic cross-sectional view corresponding to line II-II' of FIG. 8 as implementation of a first bank shown in FIG. 10 according to another embodiment.
Figure 12:
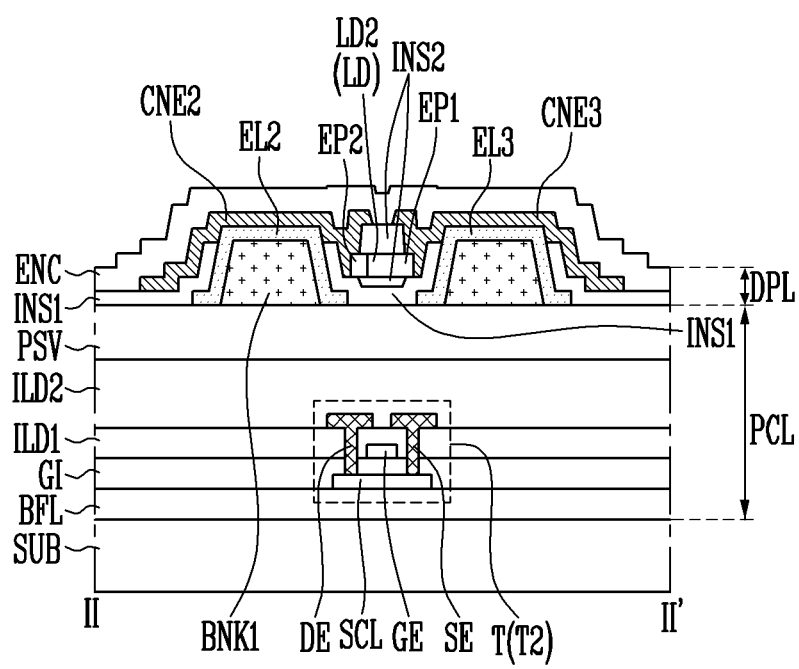
FIG. 12 is a schematic cross-sectional view corresponding to line II-II' of FIG. 8 as implementation of a display element layer shown in FIG. 10.
Figure 13:
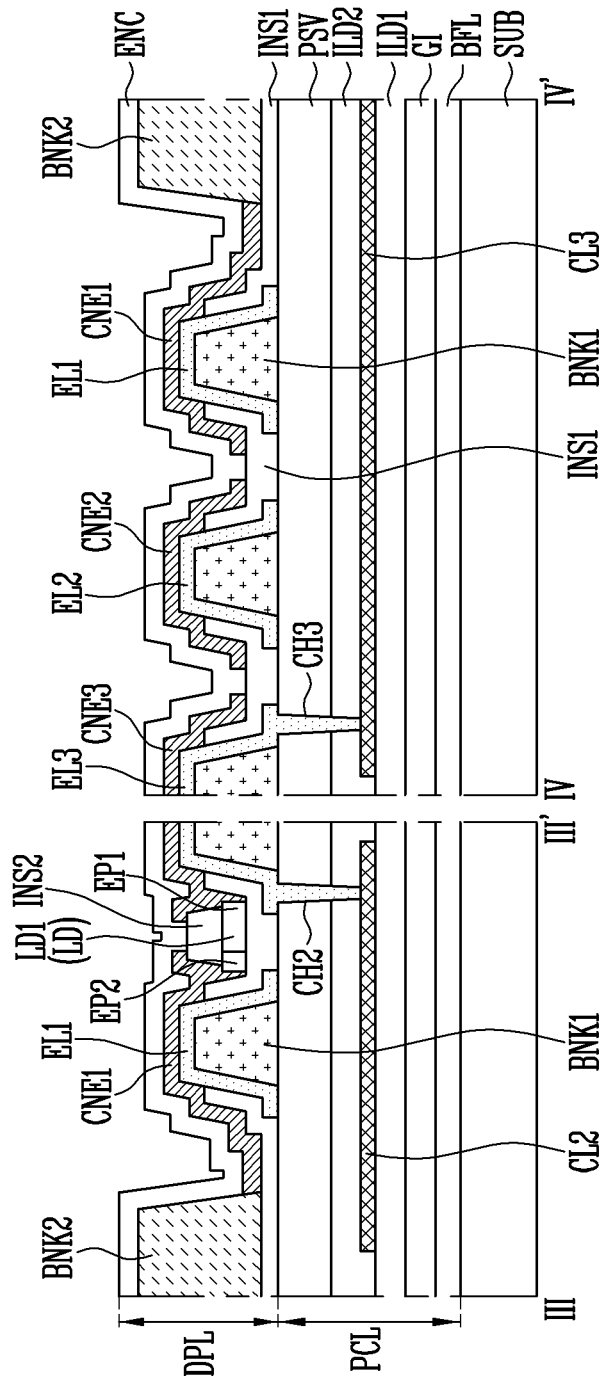
FIG. 13 is a schematic cross-sectional view taken along line III-III' and line IV-IV' of FIG. 8.
Figure 14:
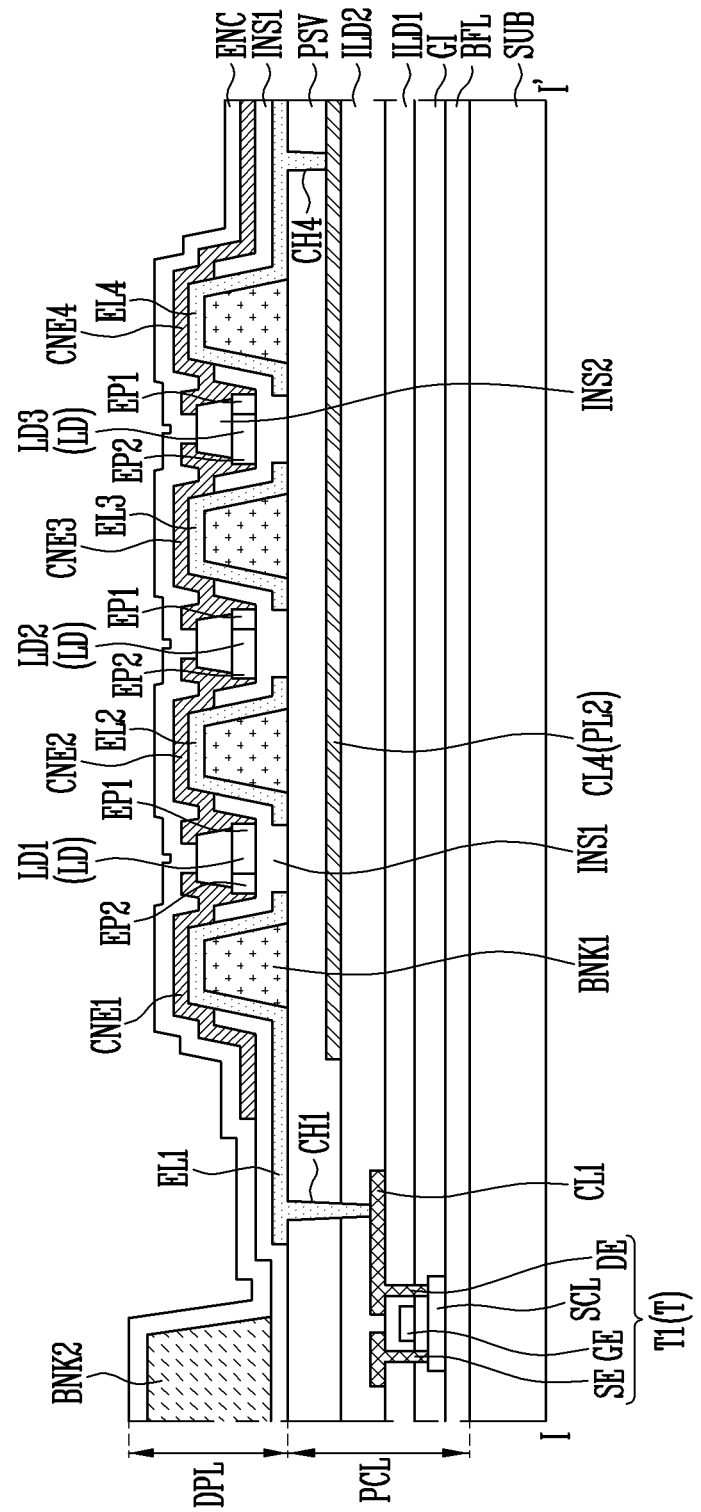
FIG. 14 is a schematic cross-sectional view corresponding to line I-I' of FIG. 8 as implementation of a fourth conductive line shown in FIG. 9 according to another embodiment.
Figure 15:
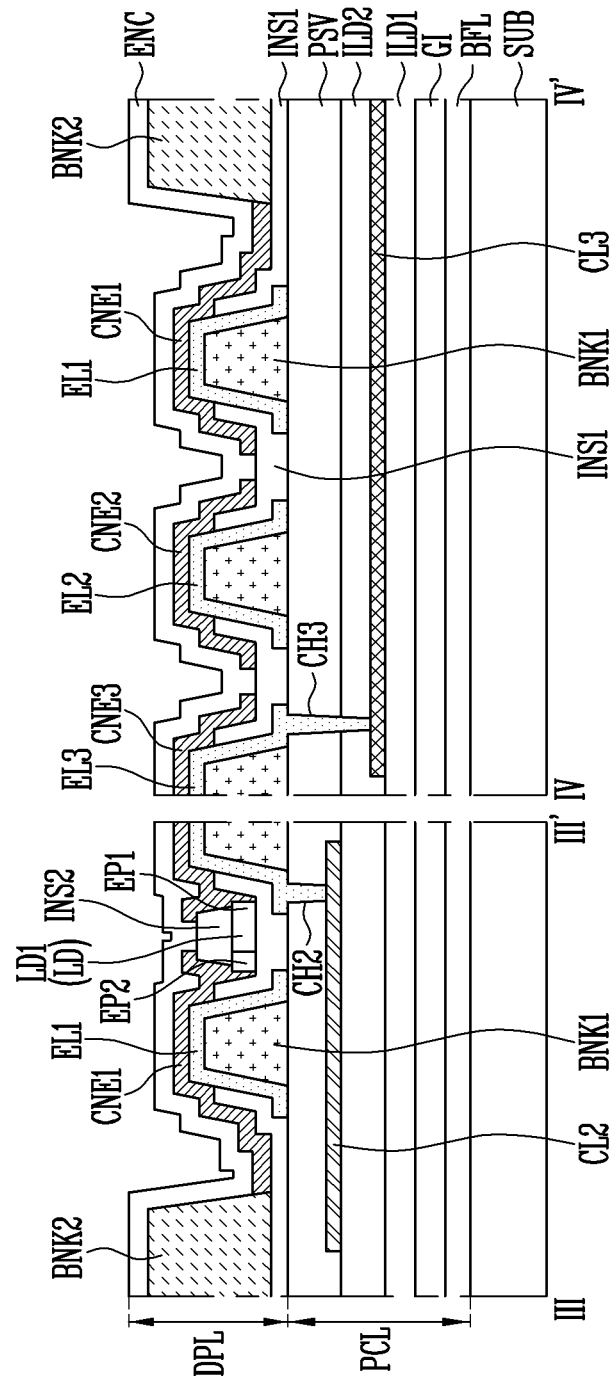
FIG. 15 is a schematic cross-sectional view corresponding to line III-III' and line IV-IV' of FIG. 8 as implementation of a second conductive line shown in FIG. 13 according to another embodiment.

FIG. 8 is a plan view schematically illustrating a pixel among the pixels shown in FIG. 5, FIG. 9 is a schematic cross-sectional view taken along line I-I' of FIG. 8, FIG. 10 is a schematic cross-sectional view taken along line II-II' of FIG. 8, FIG. 11 is a schematic cross-sectional view corresponding to line II-II' of FIG. 8 as implementation of a first bank shown in FIG. 10 according to another embodiment, FIG. 12 is a schematic cross-sectional view corresponding to line II-II' of FIG. 8 as implementation of a display element layer shown in FIG. 10, FIG. 13 is a schematic cross-sectional view taken along lines III-III' and IV-IV' of FIG. 8, FIG. 14 is a schematic cross-sectional view corresponding to line I-I' of FIG. 8 as implementation of a fourth conductive line shown in FIG. 9 according to another embodiment, and FIG. 15 is a schematic cross-sectional view corresponding to lines III-III' and IV-IV' of FIG. 8 as implementation of a second conductive line shown in FIG. 13 according to another embodiment.

A pixel shown in FIG. 8 may be one of the pixels shown in each of FIGS. 6A to 6E and 7A to 7C. For example, the pixel shown in FIG. 8 may be the pixel shown in FIGS. 7A and/or 7C.

For convenience, the transistor electrically connected to the light emitting elements and the signal lines electrically connected to the transistor are omitted from FIG. 8.

FIGS. 8 to 15 illustrate a simple structure of the pixel PXL, illustrating each electrode as a single electrode layer and each insulating layer as a single insulating layer, but the disclosure is not limited thereto.

Additionally, in an embodiment, "formed and/or provided on a same layer" may refer to formed in a same process, and "formed and/or provided on different layers" may refer to formed in different processes.

Referring to FIGS. 1A to 5, 7B, 7C, and 8 to 15, the display device according to an embodiment may include the substrate SUB, the line, and the pixels PXL.

The substrate SUB may include a transparent insulating material and may transmit light. The substrate SUB may be a rigid substrate or a flexible substrate. A material applied to the substrate SUB may have resistance (or heat resistance) to a high process temperature during a manufacturing process of the display device. The substrate SUB may include the display area DA including at least one pixel area PXA in which the pixel PXL is disposed, and the non-display area NDA disposed around the display area DA.

The pixels PXL may be arranged in a matrix form and/or a stripe form in a plurality of pixel rows extended in a first direction DR1 and pixel columns extended in a second direction DR2 intersecting the first direction DR1 in the display area DA on the substrate SUB, but the disclosure is not limited thereto. According to an embodiment, the pixels PXL may be provided in the display area DA on the substrate SUB in various arrangements.

The pixel area PXA in which each pixel PXL is disposed (or arranged) may include an emission area EMA from which light is emitted and a peripheral area surrounding a periphery of the emission area EMA. In an embodiment, the peripheral area may include a non-emission area in which light is not emitted.

Each pixel PXL may include a pixel circuit part PCL including the pixel circuit 144 and a display element part DPL including light emitting elements LD. The light emitting elements LD may be positioned in the emission area EMA of the pixel area PXA of each pixel PXL.

The pixel circuit part PCL may include a buffer layer BFL, the pixel circuit 144 including at least one transistor T, and a protective layer PSV. The display element part DPL may include first and second bank patterns BNK1 and BNK2, first to fourth electrodes EL1 to EL4, light emitting elements LD, and a contact electrode CNE.

For convenience, the pixel circuit part PCL is first described, and the display element part DPL is described.

The buffer layer BFL may prevent an impurity from diffusing into the transistor T. The buffer layer BFL may be provided as a single layer, but may be provided as a multilayer of at least two or more layers. In case that the buffer layer BFL is provided as the multilayer, each layer may be formed of a same material or different materials. The buffer layer BFL may be omitted according to the material, a process condition, and the like of the substrate SUB.

The transistor T may include a first transistor T1 that is a driving transistor that controls the amount of the driving current supplied to the light emitting elements LD, and a second transistor T2 that is a switching transistor. In an embodiment, the first transistor T1 may be the first transistor T1 of the pixel circuit 144 described with reference to FIGS. 6A, 7B, and 7C, and the second transistor T2 may be the second transistor T2 of the pixel circuit 144 described with reference to FIGS. 6A, 7B, and 7C. In the following embodiment, one of the first and second transistors T1 and T2 or first and second transistors T1 and T2 is referred to as the transistor T or the transistors T.

Each of the first transistor T1 and the second transistor T2 may include a transistor semiconductor pattern SCL, a gate electrode GE, a first terminal SE, and a second terminal DE. The first terminal SE may be one of a source electrode and a drain electrode, and the second terminal DE may be the other electrode. For example, in case that the first terminal SE is a source electrode, the second terminal DE may be a drain electrode.

The transistor semiconductor pattern SCL may be provided and/or formed on the buffer layer BFL. The transistor semiconductor pattern SCL may include a first contact region contacting the first terminal SE and a second contact region contacting the second terminal DE. A region between the first contact region and the second contact region may be a channel region. The transistor semiconductor pattern SCL may be a semiconductor panel formed of polysilicon, amorphous silicon, oxide semiconductor, or the like. The channel region is a semiconductor pattern that is not doped with an impurity, and may be an intrinsic semiconductor. The first contact region and the second contact region may be semiconductor patterns doped with an impurity.

The gate electrode GE may be provided and/or formed on the transistor semiconductor pattern SCL with a gate insulating layer GI interposed therebetween.

The first terminal SE and the second terminal DE may respectively contact the first contact region and the second contact region of the transistor semiconductor pattern SCL through a contact hole passing through a first interlayer insulating layer ILD1 and the gate insulating layer GI.

In the above-described embodiment, the first and second terminals SE and DE of each of the first transistor T1 and the second transistor T2 are described as separate electrodes electrically connected to the transistor semiconductor pattern SCL, but the disclosure is not limited thereto. According to an embodiment, the first terminal SE of each of the first transistor T1 and the second transistor T2 may be one of the first and second contact regions adjacent to the channel region of the corresponding transistor semiconductor pattern SCL, and the second terminal DE of each of the first transistor T1 and the second transistor T2 may be the other of the first and second contact regions adjacent to the channel region of the corresponding transistor semiconductor pattern SCL. In this case, the second terminal DE of each of the first transistor T1 and the second transistor T2 may be electrically connected to the light emitting elements LD of the corresponding pixel PXL through a separate connection means such as a bridge electrode or a contact electrode.

In an embodiment, the transistors T included in the pixel circuit part 144 may be formed as low-temperature polysilicon (LTPS) thin-film transistors, but the disclosure is not limited thereto, and may be formed as an oxide semiconductor thin-film transistor according to an embodiment. In addition, in case that the transistors T are thin-film transistors having a top gate structure is described as an example, but the disclosure is not limited thereto. According to an embodiment, the transistors T may be thin-film transistors having a bottom gate structure.

A second interlayer insulating layer ILD2 may be disposed on the transistors T described above. The second interlayer insulating layer ILD2 may cover the transistors T. The second interlayer insulating layer ILD2 may be an inorganic insulating layer including an inorganic material or an organic insulating layer including an organic material.

The protective layer PSV may be disposed on the second interlayer insulating layer ILD2. The protective layer PSV may include an organic insulating layer, an inorganic insulating layer, or the organic insulating layer disposed on the inorganic insulating layer. The inorganic insulating layer may include at least one of silicon oxide ($SiO_x$) and silicon nitride ($SiN_x$). The organic insulating layer may include an organic insulating material capable of transmitting light. The organic insulating layer may include at least one of an acrylic resin (polyacrylates resin), an epoxy resin, a phenolic resin, a polyamide resin, a polyimides resin, an unsaturated polyesters resin, a polyphenylene ethers resin, a polyphenylene sulfides resin, and a benzocyclobutene resin.

The pixel circuit part PCL may include first to fourth conductive lines CL1 to CL4.

The first and fourth conductive lines CL1 and CL4 among the first to fourth conductive lines CL1 to CL4 may have a bar shape extending in the second direction DR2, for example, in a vertical direction on the substrate SUB, and the second and third conductive lines CL2 and CL3 may have a bar shape extending in the first direction DR1 intersecting the second direction DR2 on the substrate SUB, for example, in a horizontal direction. The extension direction and the shape of each of the first to fourth conductive lines CL1 to CL4 are not limited to the above-described embodiment. According to an embodiment, the first and fourth conductive lines CL1 and CL4 may extend in the first direction DR1 or in a direction inclined with respect to the first direction DR1 on the substrate SUB, and the second and third conductive lines CL2 and CL3 may extend in the second direction DR2 or a direction inclined with respect to the second direction DR2 on the substrate SUB. In addition, according to an embodiment, the first to fourth conductive lines CL1 to CL4 may extend in a same direction, for example, in the first direction DR1 and/or the second direction DR2.

The first to fourth conductive lines CL1 to CL4 and the first and second terminals SE and DE of each of the first and second transistors T1 and T2 may be provided on a same layer, and may include a same material. For example, the first to fourth conductive lines CL1 to CL4 may be provided and/or formed on the first interlayer insulating layer ILD1.

The first conductive line CL1 may be provided and/or formed on the first interlayer insulating layer ILD1. The first conductive line CL1 may be provided integrally with the second terminal DE of the first transistor T1 to be electrically connected to the second terminal DE of the first transistor T1. In case that the first conductive line CL1 and the second terminal DE of the first transistor T1 are integrally provided, the first conductive line CL1 may be regarded as a region of the second terminal DE of the first transistor T1, or the second terminal DE of the first transistor T1 may be regarded as a region of the first conductive line CL1. According to an embodiment, the first conductive line CL1 may be provided non-integrally with the second terminal DE of the first transistor T1 and may be electrically connected to the second terminal DE of the first transistor T1 by a separate connection means such as a contact hole and a bridge electrode.

The first conductive line CL1 may be electrically connected to a partial configuration (or part) of the display element part DPL, for example, the first electrode, through a first contact hole CH1 sequentially passing through the second interlayer insulating layer ILD2 and the protective layer PSV. In an embodiment, the first conductive line CL1 may transmit an alignment signal (or alignment voltage) to the first electrode EL1 to allow the first electrode EL1 to serve as a first alignment electrode (or a first alignment line) in case that the light emitting elements LD are aligned in the emission area EMA of each pixel PXL. In addition, after the light emitting elements LD are aligned in the emission area EMA of each pixel PXL, the first conductive line CL1 may be electrically connected to the first transistor T1 to allow the first electrode EL1 to serve as a driving electrode of the light emitting elements LD.

The second conductive line CL2 may be provided and/or formed on the first interlayer insulating layer ILD1, and may be spaced apart from the first conductive line CL1 to be electrically and/or physically separated from the first conductive line CL1. The second conductive line CL2 may be electrically connected to a partial configuration of the display element part DPL, for example, the second electrode EL2, through a second contact hole CH2 sequentially passing through the second interlayer insulating layer ILD2 and the protective layer PSV. In an embodiment, the second conductive line CL2 may transmit an alignment signal (or alignment voltage) to the second electrode EL2 to allow the second electrode EL2 to serve as a second alignment electrode (or a second alignment line) in case that the light emitting elements LD are aligned in the emission area EMA of each pixel PXL. In addition, after the light emitting elements LD are aligned in the emission area EMA of each pixel PXL, a portion of the second conductive line CL2 may be removed or electrically disconnected and thus the second conductive line CL2 may be in a floating state. A detailed description related thereto will be provided below.

The third conductive line CL3 may be provided and/or formed on the first interlayer insulating layer ILD1, and may be spaced apart from the first and second conductive lines CL1 and CL2 to be electrically and/or physically separated from the first and second conductive lines CL1 and CL2. The third conductive line CL3 may be electrically connected to a partial configuration of the display element part DPL, for example, a third electrode EL3, through a third contact hole CH3 sequentially passing through the second interlayer insulating layer ILD2 and the protective layer PSV. In an embodiment, the third conductive line CL3 may transmit an alignment signal (or alignment voltage) to the third electrode EL3 to allow the third electrode EL3 to serve as a third alignment electrode (or a third alignment line) in case that the light emitting elements LD are aligned in the emission area EMA of each pixel PXL. In addition, after the light emitting elements LD are aligned in the emission area EMA of each pixel PXL, a portion of the third conductive line CL3 may be removed or electrically disconnected and thus the third conductive line CL3 may be in a floating state. A detailed description related thereto will be provided below.

The fourth conductive line CL4 may be provided and/or formed on the first interlayer insulating layer ILD1, and may be spaced apart from the first to third conductive lines CL1, CL2, and CL3 to be electrically and/or physically separated from the first to third conductive lines CL1, CL2, and CL3. The fourth conductive line CL4 may be electrically connected to a partial configuration of the display element part DPL, for example, a fourth electrode EL4, through a fourth contact hole CH4 sequentially passing through the second interlayer insulating layer ILD2 and the protective layer PSV. In an embodiment, the fourth conductive line CL4 may be the second power line PL2 to which the second driving power VSS is applied in the pixel PXL shown in FIGS. 7B and 7C. The fourth conductive lines CL4 and PL2 may transmit an alignment signal (or alignment voltage) to the fourth electrode EL4 to allow the fourth electrode EL4 to serve as a fourth alignment electrode (or a fourth alignment line) in case that the light emitting elements LD are aligned in the emission area EMA of each pixel PXL. In addition, after the light emitting elements LD are aligned in the emission area EMA of each pixel PXL, the fourth conductive lines CL4 and PL2 may transmit the second driving power VSS to the fourth electrode EL4 to allow the fourth electrode EL4 to serve as a driving electrode of the light emitting elements LD.

In the above-described embodiment, the first to fourth conductive lines CL1 to CL4 are provided and/or formed on the first interlayer insulating layer ILD1, and thus the first to fourth conductive lines CL1 to CL4 are provided on a same layer, but the disclosure is not limited thereto. According to an embodiment, the first to fourth conductive lines CL1 to CL4 may be provided on different layers. For example, as shown in FIGS. 14 and 15, the first and third conductive lines CL1 and CL3 may be provided and/or formed on the first interlayer insulating layer ILD1, and the second and fourth conductive lines CL2 and CL4 may be provided and/or formed on the second interlayer insulating layer ILD2. In contrast, the second and fourth conductive lines CL2 and CL4 may be provided and/or formed on the first interlayer insulating layer ILD1, and the first and third conductive lines CL1 and CL3 may be provided and/or formed on the second interlayer insulating layer ILD2. A position of each of the first to fourth conductive lines CL1 to CL4 is not limited to the above-described embodiments. In case that the second and fourth conductive lines CL2 and CL4 are provided and/or formed on the second interlayer insulating layer ILD2, the second conductive line CL2 may be electrically connected to the second electrode EL2 through the second contact hole CH2 passing through the protective layer PSV, and the fourth conductive line CL4 may be electrically connected to the fourth electrode EL4 through the fourth contact hole CH4 passing through the protective layer PSV.

The display element part DPL is described hereinafter.

The first bank pattern BNK1 may be support members or insulating patterns that support each of the first to fourth electrodes EL1 to EL4 to change a surface profile of each of the first to fourth electrodes EL1 to EL4 so that light emitted from the light emitting elements LD further proceeds in an image display direction of the display device.

The first bank pattern BNK1 may be provided and/or formed between the protective layer PSV and the first to fourth electrodes EL1 to EL4 in the emission area EMA of each pixel PXL. For example, the first bank pattern BNK1 may be provided and/or formed between the protective layer PSV and the first electrode EL1, between the protective layer PSV and the second electrode EL2, between the protective layer PSV and the third electrode EL3, and between the protective layer PSV and the fourth electrode EL4.

The first bank pattern BNK1 may include an inorganic insulating layer formed of an inorganic material or an organic insulating layer formed of an organic material. According to an embodiment, the first bank pattern BNK1 may include a single-layered organic insulating layer and/or a single-layered inorganic insulating layer, but the disclosure is not limited thereto. According to an embodiment, the first bank pattern BNK1 may be provided in a form of a multi-layer in which at least one organic insulating layer and at least one inorganic insulating layer are stacked.

The first bank pattern BNK1 may have a cross section of a trapezoidal shape that becomes narrower upward from a surface of the protective layer PSV, but the disclosure is not limited thereto. According to an embodiment, as shown in FIG. 11, the first bank pattern BNK1 may include a curved surface having a cross section of a semi-elliptical shape, a semi-circle shape, or the like, a width of which becomes narrower toward an upper portion from one surface facing the protective layer PSV. In a cross-sectional view, the shape of the first bank pattern BNK1 is not limited to the above-described embodiments and may be variously changed within a range capable of improving efficiency of the light emitted from each of the light emitting elements LD. The adjacent first bank patterns BNK1 and the protective layer PSV may be disposed on a same plane, and may have a same height (or thickness).

The second bank pattern BNK2 may surround at least one side of the peripheral area of each pixel PXL. The second bank pattern BNK2 is a structure defining (or partitioning) each pixel PXL and the emission area EMA of each of the pixels PXL adjacent thereto, and may be, for example, a pixel defining layer. The second bank pattern BNK2 may be configured to include at least one light blocking material and/or at least one reflective material to prevent a light leakage defect in which light (or rays) leaks between each pixel PXL and the pixels PXL adjacent thereto. According to an embodiment, a reflective layer (or a reflective material layer) may be formed on the second bank pattern BNK2 to further improve the efficiency of light emitted from each pixel PXL. The second bank pattern BNK2 and the first bank pattern BNK1 may be formed and/or provided on different layers, but the disclosure is not limited thereto, and according to an embodiment, the second bank pattern BNK2 and the first bank pattern BNK1 may be formed and/or provided on a same layer. In an embodiment, the second bank pattern BNK2 and the first bank pattern BNK1 may be formed on different layers, and the second bank pattern BNK2 may be positioned on a first insulating layer INS1.

The first to fourth electrodes EL1, EL2, EL3, and EL4 included in each pixel PXL may be spaced apart from each other. The second and third electrodes EL2 and EL3 may be disposed between the first electrode EL1 and the fourth electrode EL4. For example, the second electrode EL2 may be disposed between the first electrode EL1 and the third electrode EL3, and the third electrode EL3 may be disposed between the second electrode EL2 and the fourth electrode EL4. In a plan view, the first electrode EL1, the second electrode EL2, the third electrode EL3, and the fourth electrode EL4 may be spaced apart from each other.

In an embodiment, the first electrode EL1 and the second electrode EL2 may be spaced apart from each other by a distance, the second electrode EL2 and the third electrode EL3 may be spaced apart from each other by a distance, and the third electrode EL3 and the fourth electrode EL4 may be spaced apart from each other by a distance. In the emission area EMA of each pixel PXL, distances between the first electrode EL1 and the second electrode EL2, between the second electrode EL2 and the third electrode EL3, and between the third electrode EL3 and the fourth electrode EL4 may be the same. Accordingly, the light emitting elements LD may be more uniformly aligned in the emission area EMA of each pixel PXL. However, the disclosure is not limited thereto, and according to an embodiment, the distances between the first electrode EL1 and the second electrode EL2, between the second electrode EL2 and the third electrode EL3, and between the third electrode EL3 and the fourth electrode EL4 may be different from each other.

Each of the first to fourth electrodes EL1 to EL4 may be provided and/or formed on the first bank pattern BNK1 and have a surface profile corresponding to the shape of the first bank pattern BNK1. For example, each of the first to fourth electrodes EL1 to EL4 may include a protrusion portion corresponding to the first bank pattern BNK1 and a flat portion corresponding to the protective layer PSV. Each of the first to fourth electrodes EL1 to EL4 may be formed of a material having a constant reflectance to allow the light emitted from each of the light emitting elements LD to proceed in the image display direction of the display device.

Each of the first to fourth electrodes EL1 to EL4 may be formed of a conductive material having a constant reflectance. The conductive material may include an opaque metal that is advantageous in reflecting the light emitted from the light emitting elements LD in the image display direction of the display device. The opaque metal may include, for example, metals such as Ag, Mg, Al, Pt, Pd, Au, Ni, Nd, Ir, Cr, Ti, and an alloy thereof. According to an embodiment, each of the first to fourth electrodes EL1 to EL4 may include a transparent conductive material. The transparent conductive material may include a conductive oxide such as an indium tin oxide (ITO), an indium zinc oxide (IZO), a zinc oxide (ZnO), and an indium tin zinc oxide (ITZO), and conductive polymer such as poly(3,4-ethylenedioxythiophene) (PEDOT), and the like. In case that each of the first to fourth electrodes EL1 to EL4 includes the transparent conductive material, a separate conductive layer formed of an opaque metal, for reflecting the light emitted from the light emitting elements LD in the image display direction of the display device may be further included. However, the material of each of the first to fourth electrodes EL1 to EL4 is not limited to the above-described materials.

In addition, each of the first to fourth electrodes EL1 to EL4 may be provided and/or formed as a single layer, but the disclosure is not limited thereto. According to an embodiment, each of the first to fourth electrodes EL1 to EL4 may be provided and/or formed as a multilayer in which at least two or more materials of metals, alloys, conductive oxides, and conductive polymers are stacked. Each of each of the first to fourth electrodes EL1 to EL4 may be formed as a multilayer of at least two layers in order to minimize distortion due to signal delay in case that a signal (or a voltage) is transmitted to the both ends of each of the light emitting elements LD. For example, each of the first to fourth electrodes EL1 to EL4 may be formed as a multilayer in which ITO/Ag/ITO are sequentially stacked.

As described above, since each of the first to fourth electrodes EL1 to EL4 has a surface profile corresponding to a shape of the first bank pattern BNK1 disposed thereunder, the light emitted from each of the light emitting elements LD may be reflected by each of the first to fourth electrodes EL1 to EL4 to further proceed in the image display direction of the display device. Finally, efficiency of the light emitted from each of the light emitting elements LD may be further improved.

Each of the first bank pattern BNK1 and the first to fourth electrodes EL1 to EL4 may function as a reflective member for improving light efficiency of the display device by guiding the light emitted from the light emitting elements LD in a desired direction. For example, each of the first bank pattern BNK1 and the first to fourth electrodes EL1 to EL4 may function as the reflective member that causes the light emitted from the light emitting elements LD to proceed in the image display direction of the display device to improve light output efficiency of the light emitting elements LD.

In an embodiment, the fourth electrode EL4 among the first to fourth electrodes EL1 to EL4 may be positioned at a center (for example, a core) in the emission area EMA of each pixel PXL, and may have a circular shape, but the disclosure is not limited thereto. According to an embodiment, the fourth electrode EL4 may have an elliptical shape including a curve having a curvature, a circular ring shape, or the like. In addition, according to an embodiment, the fourth electrode EL4 may have a polygonal shape such as a quadrangular shape, a triangular shape, or an octagonal shape. The fourth electrode EL4 may be electrically connected to the fourth conductive lines CL4 and PL2 of the pixel circuit part PCL through the fourth contact hole CH4.

The third electrode EL3 may have a shape surrounding a periphery of the fourth electrode EL4 in a circumferential direction of the fourth electrode EL4. For example, the third electrode EL3 may have a ring shape (or a closed loop shape) surrounding at least one side of the fourth electrode EL4. The third electrode EL3 may have a circular ring shape, but the disclosure is not limited thereto. According to an embodiment, the shape of the third electrode EL3 is not limited to a circular ring shape, and the third electrode EL3 may have a polygonal ring shape including a rectangular ring shape and an octagonal ring shape of a quadrangular shape, an octagonal shape, and the like forming a closed circuit. In the above-described embodiment, the third electrode EL3 has a shape that entirely surrounds the periphery of the fourth electrode EL4, but the disclosure is not limited thereto. According to an embodiment, the third electrode EL3 may have a shape surrounding only a remaining region except for at least one region of the fourth electrode EL4, and for example, may have a C shape in which any one portion is open without forming a perfect circle. The fourth electrode EL4 may be provided in an isolated circular island shape surrounded by the third electrode EL3, but the disclosure is not limited thereto. The third electrode EL3 and the fourth electrode EL4 may be disposed on the corresponding first bank pattern BNK1 to be spaced apart from each other by a distance.

The second electrode EL2 may surround a periphery of the third electrode EL3 in a circumferential direction of the third electrode EL3. For example, the second electrode EL2 may have a ring shape (or a closed loop shape) surrounding at least one side of the third electrode EL3. The second electrode EL2 may have a circular ring shape, but the disclosure is not limited thereto. According to an embodiment, the shape of the second electrode EL2 is not limited to a circular ring shape, and the second electrode EL2 may have a polygonal ring shape of a quadrangular shape, an octagonal shape, and the like forming a closed circuit. In the above-described embodiment, the second electrode EL2 has a shape that entirely surrounds the periphery of the third electrode EL3, but the disclosure is not limited thereto. According to an embodiment, the second electrode EL2 may have a shape surrounding only a remaining region except for at least one region of the third electrode EL3, and for example, may have a C shape in which any one portion is open without forming a perfect circle. The third electrode EL3 may be provided in an isolated ring shape surrounded by the second electrode EL2, but the disclosure is not limited thereto. The second electrode EL2 and the third electrode EL3 may be disposed on the corresponding first bank pattern BNK1 to be spaced apart from each other by a distance.

The first electrode EL1 may surround a periphery of the second electrode EL2 in a circumferential direction of the second electrode EL2. For example, the first electrode EL1 may have a ring shape (or a closed loop shape) surrounding at least one side of the second electrode EL2. The first electrode EL1 may have a closed loop shape surrounding the second electrode EL2 and including an inner surface formed as a curve having a curvature and an outer surface formed as a straight line, but the disclosure is not limited thereto. According to an embodiment, the first electrode EL1 may have a circular ring shape of which both of the inner surface and the outer surface are formed as a curve, or may have a polygonal ring shape having a quadrangular shape, an octagonal shape, and the like forming a closed circuit. In the above-described embodiment, the first electrode EL1 has a shape that entirely surrounds the periphery of the second electrode EL2, but the disclosure is not limited thereto. According to an embodiment, the first electrode EL1 may have a shape surrounding only a remaining region except for at least one region of the second electrode EL2, and for example, may have a C shape in which any one portion is open without forming a perfect circle. The second electrode EL2 may be provided in an isolated ring shape surrounded by the first electrode ELL but the disclosure is not limited thereto. The first electrode EL1 and the second electrode EL2 may be disposed on the corresponding first bank pattern BNK1 to be spaced apart from each other by a distance.

As described above, in case that the fourth electrode EL4 is positioned at the center of the emission area EMA of each pixel PXL, the third electrode EL3 surrounds the periphery of the fourth electrode EL4, the second electrode EL2 surrounds the periphery of the third electrode EL3, and the first electrode EL1 surrounds the periphery of the second electrode EL2, the first to fourth electrodes EL1 to EL4 may form a concentric circle structure.

In the emission area EMA of each pixel PXL, the light emitting elements LD may be aligned and/or provided between the first electrode EL1 and the second electrode EL2, between the second electrode EL2 and the third electrode EL3, and between the third electrode EL3 and the fourth electrode EL4. In the emission area EMA, the first to fourth electrodes EL1 to EL4 and the light emitting elements LD may form the light emitting part EMU of each pixel PXL. The first electrode EL1 may be an anode electrode of the light emitting part EMU of each pixel PXL, and the fourth electrode EL4 may be a cathode electrode of the light emitting part EMU of each pixel PXL.

In an embodiment, the first electrode EL1 may be electrically connected to the pixel circuit part PCL through the first contact hole CH1. For example, the first electrode EL1 may be electrically connected to the first conductive line CL1 and the first transistor T1 of the pixel circuit part PCL through the first contact hole CH1. Accordingly, a signal (or a voltage) applied to the first transistor T1 may be transmitted to the first electrode EL1.

The second electrode EL2 may be electrically connected to the pixel circuit part PCL through the second contact hole CH2. For example, the second electrode EL2 may be electrically connected to the second conductive line CL2 of the pixel circuit part PCL through the second contact hole CH2. In an embodiment, since the second conductive line CL2 is in a floating state after the alignment of the light emitting elements LD, a signal (or voltage) from the second conductive line CL2 may not be applied to the second electrode EL2.

The third electrode EL3 may be electrically connected to the pixel circuit part PCL through the third contact hole CH3. For example, the third electrode EL3 may be electrically connected to the third conductive line CL3 of the pixel circuit part PCL through the third contact hole CH3. In an embodiment, since the third conductive line CL3 is in a floating state after the alignment of the light emitting elements LD, any signal (or voltage) from the third conductive line CL3 may not be applied to the third electrode EL3.

The fourth electrode EL4 may be electrically connected to the pixel circuit part PCL through the fourth contact hole CH4. For example, the fourth electrode EL4 may be electrically connected to the fourth conductive lines CL4 and PL2 through the fourth contact hole CH4. Accordingly, the second driving power VSS applied to the fourth conductive lines CL4 and PL2 may be transmitted to the fourth electrode EL4.

In the above-described embodiment, each of the light emitting elements LD may be an ultra-small light emitting element, for example, having a size to a degree of the nanoscale to the microscale, using an inorganic crystal structure material. For example, each of the light emitting elements LD may be an ultra-small light emitting element manufactured by an etching method or an ultra-small light emitting element manufactured by a growth method. However, the type, size, shape, and the like of the light emitting elements LD may be variously changed. At least two to tens of light emitting elements LD may be aligned and/or provided in the emission area EMA of each pixel PXL, but the number of light emitting elements LD is not limited thereto. According to an embodiment, the number of light emitting elements LD aligned and/or provided in the emission area EMA of each pixel PXL may be variously changed.

In the emission area EMA, the light emitting elements LD may be radially aligned and/or provided with respect to the fourth electrode EL4. For example, a portion of the light emitting elements LD may be aligned and/or provided between the fourth electrode EL4 and the third electrode EL3 in the circumferential direction of the fourth electrode EL4, another portion of the light emitting elements LD may be aligned and/or provided between the third electrode EL3 and the second electrode EL2 in the circumferential direction of the third electrode EL3, and still another portion of the light emitting elements LD may be aligned and/or provided between the second electrode EL2 and the first electrode EL1 in the circumferential direction of the second electrode EL2.

The light emitting elements LD may be provided in a solution in a dispersed form and may be injected to the emission area EMA of the pixel PXL.

In an embodiment, the light emitting elements LD may be injected to the emission area EMA of each pixel PXL by an inkjet printing method, a slit coating method, or other various methods. For example, the light emitting elements LD may be mixed with a volatile solvent and supplied to the emission area EMA of each pixel PXL by an inkjet printing method or a slit coating method. In this case, in case that an alignment signal (or an alignment voltage) corresponding to each of the first to fourth electrodes EL1 to EL4 positioned in the emission area EMA of each pixel PXL is applied, an electric field may be formed between the first electrode EL1 and the second electrode EL2, between the second electrode EL2 and the third electrode EL3, and between the third electrode EL3 and the fourth electrode EL4. Accordingly, the light emitting elements LD may be aligned between the first electrode EL1 and the second electrode EL2, between the second electrode EL2 and the third electrode EL3, and between the third electrode EL3 and the fourth electrode EL4. In this case, the light emitting elements LD may be aligned and/or provided in a radial shape (or radially) in the circumferential direction of the fourth electrode EL4 positioned at the center (or a middle), for example, the core, of the emission area EMA of each pixel PXL due to shapes of the first to fourth electrodes EL1 to EL4.

After the light emitting elements LD are aligned, the solvent may be evaporated or removed by other methods, and thus the light emitting elements LD may be finally aligned and/or provided in the emission area EMA of each pixel PXL.

The light emitting elements LD may include the first to third light emitting elements LD1, LD2, and LD3. For example, the light emitting elements LD include first light emitting elements LD1 disposed between the first electrode EL1 and the second electrode EL2, second light emitting elements LD2 disposed between the second electrode EL2 and the third electrode EL3, and third light emitting elements LD3 disposed between the third electrodes EL3 and the fourth electrode EL4.

In case that the light emitting elements LD are aligned in the emission area EMA of each pixel PXL, each of the first to fourth electrodes EL1 to EL4 may receive an alignment signal (or alignment voltage) from a corresponding conductive line to function as an alignment electrode (or an alignment line) for aligning the light emitting elements LD. For example, the first electrode EL1 may be a first alignment electrode (or a first alignment line) receiving a first alignment signal (or a first alignment voltage) from the first conductive line CL1, and the second electrode EL2 may be a second alignment electrode (or a second alignment line) receiving a second alignment signal (or a second alignment voltage) from the second conductive line CL2. In addition, the third electrode EL3 may be a third alignment electrode (or a third alignment line) receiving a third alignment signal (or a third alignment voltage) from the third conductive line CL3, and the fourth electrode EL4 may be a fourth alignment electrode (or a fourth alignment line) receiving a fourth alignment signal (or a fourth alignment voltage) from the fourth conductive line CL4. In an embodiment, the first to fourth alignment signals may have different voltage levels.

The first to fourth alignment signals may be signals having a voltage difference and/or a phase difference of an extent that the light emitting elements LD may be aligned between the first to fourth electrodes EL1 to EL4. At least some of the above-described first to fourth alignment signals may be AC signals, but the disclosure is not limited thereto.

In case that a corresponding alignment signal is applied to each of the first to fourth electrodes EL1 to EL4, an electric field may be formed between the first and second electrodes EL1 and EL2, between the second and third electrodes EL2 and EL3, and between the third and fourth electrodes EL3 and EL4. The light emitting elements LD may be aligned and/or provided in the emission area EMA of each pixel PXL by the electric field formed between two adjacent electrodes.

After the light emitting elements LD are aligned in the emission area EMA of each pixel PXL, a portion of each of the second and third conductive lines CL2 and CL3 may be removed or electrically disconnected and each of the second and third conductive lines CL2 and CL3 may be in a floating state. For example, after the light emitting elements LD are aligned in the emission area EMA of each pixel PXL, the second conductive line CL2 may be in a floating state by removing a side thereof, for example, a portion that does not contact the second electrode EL2 or a portion electrically connected to an alignment pad (not shown) to which the second alignment signal (or the second alignment voltage) is applied. In addition, after the light emitting elements LD are aligned in the emission area EMA of each pixel PXL, the third conductive line CL3 may be in a floating state by removing a side thereof, for example, a portion that does not contact the third electrode EL3 or a portion electrically connected to an alignment pad (not shown) to which the third alignment signal (or the third alignment voltage) is applied.

After the light emitting elements LD are aligned in the emission area EMA of each pixel PXL, the first to fourth electrodes EL1 to EL4 may function as driving electrodes for driving the light emitting elements LD.

In an embodiment, in aligning the light emitting elements LD in the emission area EMA of each pixel PXL, the light emitting elements LD supplied to the emission area EMA may be controlled to be aligned to be relatively deflected, by controlling the alignment signal (or the alignment voltage) applied to each of the first to fourth electrodes EL1 to EL4 or forming a magnetic field.

Each of the light emitting elements LD may include a light emitting element manufactured by an etching method or a light emitting element of a core-shell structure, manufactured by a growth method. In case that each of the light emitting elements LD is a light emitting element manufactured by an etching method, each light emitting element LD may include a light emission stack (or a stack pattern) in which the first semiconductor layer 11, the active layer 12, the second semiconductor layer 13, and the additional electrode 15 are sequentially stacked. In addition, in case that each of the light emitting elements LD is a light emitting element of a core-shell structure, manufactured by a growth method, each light emitting element LD may include the light emission pattern 10 including the first semiconductor layer 11 positioned at the center, for example, the core, the active layer 12 surrounding at least one side of the first semiconductor layer 11, the second semiconductor layer 13 surrounding at least one side of the active layer 12, and the additional electrode 15 surrounding at least one side of the second semiconductor layer 13.

Each of the light emitting elements LD may include a first end EP1 electrically connected to one electrode of two electrodes adjacent to each other in the emission area EMA, and a second end EP2 electrically connected to the remaining electrode of the two adjacent electrodes. In an embodiment, the first end EP1 of each light emitting element LD may be the first semiconductor layer 11 including an n-type semiconductor layer, and the second end EP2 may be the second semiconductor layer 13 including a p-type semiconductor layer. For example, in the emission area EMA of the pixel PXL, each light emitting element LD may be electrically connected in the forward direction between the two adjacent electrodes by a distance. As described above, the light emitting elements LD electrically connected in the forward direction between the two adjacent electrodes may form the light emitting part EMU of each pixel PXL.

The light emitting elements LD may include the first light emitting elements LD1 aligned and/or provided between the first electrode EL1 and the second electrode EL2, the second light emitting elements LD2 aligned and/or provided between the second electrode EL2 and the third electrode EL3, and the third light emitting elements LD3 aligned and/or provided between the third electrode EL3 and the fourth electrode EL4.

In an embodiment, one end EP1 of the both ends EP1 and EP2 of each of the first light emitting elements LD1 may be electrically connected to the second electrode EL2, and the other end EP2 thereof may be electrically connected to the first electrode EL1. One end EP1 of the both ends EP1 and EP2 of each of the second light emitting elements LD2 may be electrically connected to the third electrode EL3, and the other end EP2 thereof may be electrically connected to the second electrode EL2. One end EP1 of the both ends EP1 and EP2 of each of the third light emitting elements LD3 may be electrically connected to the fourth electrode EL4, and the other end EP2 thereof may be electrically connected to the third electrode EL3.

In the emission area EMA of each pixel PXL, the first electrode EL1 and the second electrode EL2 may form a series stage (hereinafter referred to as a "first series stage") together with the first light emitting elements LD1 electrically connected in parallel therebetween. In the emission area EMA of each pixel PXL, the second electrode EL2 and the third electrode EL3 may form another series stage (hereinafter referred to as a "second series stage") together with the second light emitting elements LD2 electrically connected in parallel therebetween. In the emission area EMA of each pixel PXL, the third electrode EL3 and the fourth electrode EL4 may form still another series stage (hereinafter referred to as a "third series stage") together with the third light emitting elements LD3 electrically connected in parallel therebetween. In an embodiment, the first to third series stages may be disposed in the emission area EMA of each pixel PXL, and the first to third series stages may form the light emitting part EMU of the corresponding pixel PXL. The first electrode EL1 included in the first series stage of each pixel PXL may be an anode electrode of the light emitting part EMU of the corresponding pixel PXL, and the fourth electrode EL4 included in the third series stage may be a cathode electrode of the light emitting part EMU.

According to an embodiment, at least one reverse light emitting element LDr electrically connected in a reverse direction between two adjacent electrodes at each series stage may be further disposed, or at least one defective light emitting element, for example, an ineffective light source (not shown), which is not electrically connected to the two electrodes may be further disposed between the two adjacent electrodes at each series stage. For example, in the first series stage, at least one reverse light emitting element LDr aligned and/or provided in a direction opposite to that of the first light emitting elements LD1 may be disposed between the first and second electrodes EL1 and EL2. In the second series stage, at least one reverse light emitting element LDr aligned and/or provided in a direction opposite to that of the second light emitting elements LD2 may be disposed between the second and third electrodes EL2 and EL3. In the third serial stage, at least one reverse light emitting element LDr aligned and/or provided in a direction opposite to that of the third light emitting elements LD3 may be disposed between the third and fourth electrodes EL3 and EL4.

The above-described light emitting elements LD may be provided and/or formed on the first insulating layer INS1 in the emission area EMA of each pixel PXL.

The first insulating layer INS1 may be formed and/or provided under each of the light emitting elements LD aligned and/or provided between two electrodes forming each series stage in the emission area EMA of each pixel PXL. The first insulating layer INS1 may fill a space between each of the light emitting elements LD and the protective layer PSV to stably support the light emitting elements LD, and prevent the light emitting elements LD from being separated from the protective layer PSV.

In addition, in the emission area EMA of each pixel PXL, the first insulating layer INS1 may expose a region of each of the two electrodes forming each series stage, and may cover a remaining region except for the region. The contact electrode CNE may be provided and/or formed on a region of each of the exposed electrodes, and thus each of the electrodes and the contact electrode CNE may be electrically and/or physically connected to each other.

The first insulating layer INS1 may include an inorganic insulating layer formed of an inorganic material or an organic insulating layer formed of an organic material. In an embodiment, the first insulating layer INS1 may be formed as an inorganic insulating layer that is advantageous in protecting the light emitting elements LD from the pixel circuit part PCL of each pixel PXL, but the disclosure is not limited thereto. According to an embodiment, the first insulating layer INS1 may be formed as an organic insulating layer that is advantageous in flattening a support surface of the light emitting elements LD.

A second insulating layer INS2 may be provided and/or formed on each of the light emitting elements LD. The second insulating layer INS2 may be provided and/or formed on each of the light emitting elements LD to cover a portion of an upper surface of each of the light emitting elements LD and expose the both ends EP1 and EP2 of each of the light emitting elements LD to the outside. The second insulating layer INS2 may be formed in an independent pattern in the emission area EMA of each pixel PXL, but the disclosure is not limited thereto.

The second insulating layer INS2 may be formed as a single layer or a multilayer, and may include an inorganic insulating layer including at least one inorganic material or an organic insulating layer including at least one organic material. The second insulating layer INS2 may further fix each of the light emitting elements LD aligned in the emission area EMA of each pixel PXL. In an embodiment, the second insulating layer INS2 may include an inorganic insulating layer that is advantageous in protecting the active layer 12 of each of the light emitting elements LD from external oxygen, moisture, and the like. However, the disclosure is not limited thereto. The second insulating layer INS2 may include an organic insulating layer including an organic material according to a design condition or the like of the display device to which the light emitting elements LD are applied.

In an embodiment, the light emitting elements LD may be prevented from being separated from the aligned position by forming the second insulating layer INS2 on the light emitting elements LD after the alignment of the light emitting elements LD is completed in the emission area EMA of each pixel PXL. As shown in FIG. 12, in case that a gap (or a space) exists between the first insulating layer INS1 and the light emitting elements LD before formation of the second insulating layer INS2, the gap may be filled with the second insulating layer INS2 in a process of forming the second insulating layer INS2. Accordingly, the light emitting elements LD may be formed as an organic insulating layer advantageous for filling the gap between the first insulating layer INS1 and the light emitting elements LD.

In an embodiment, the second insulating layer INS2 may be formed on the light emitting elements LD to prevent the active layer 12 of each of the light emitting elements LD from contacting an external conductive material. The second insulating layer INS2 may cover only a portion of a surface of each of the light emitting elements LD to expose the both ends EP1 and EP2 of each of the light emitting elements LD to the outside.

The contact electrode CNE may be disposed on each of the first to fourth electrodes EL1 to EL4. The contact electrode CNE may be a configuration for electrically connecting each of the first to fourth electrodes EL1 to EL4 to the corresponding light emitting element LD more stably.

The contact electrode CNE may be formed of various transparent conductive materials. For example, the contact electrode CNE may include at least one of various transparent conductive materials including ITO, IZO, and ITZO, and may be substantially transparent or translucent to satisfy a light transmittance. However, the material of the contact electrode CNE is not limited to the above-described embodiments, and according to an embodiment, the contact electrode CNE may be formed of various opaque conductive materials. In an embodiment, the contact electrode CNE may include a first contact electrode CNE1 disposed on the first electrode ELL a second contact electrode CNE2 disposed on the second electrode EL2, a third contact electrode CNE3 disposed on the third electrode EL3, and a fourth contact electrode CNE4 disposed on the fourth electrode EL4.

The first contact electrode CNE1 may electrically connect the first electrode EL1 to one end of the both ends EP1 and EP2 of each of the first light emitting elements LD1 in the emission area EMA of each pixel PXL. In a plan view, the first contact electrode CNE1 may overlap each of one end of each of the first light emitting elements LD1 and the first electrode ELL and may be provided in a circular ring shape. The shape of the first contact electrode CNE1 is not limited to the above-described embodiment. The first contact electrode CNE1 may be provided in various shapes including an elliptical ring shape, a polygonal ring shape, and the like within a range capable of covering the one end of each of the first light emitting elements LD1 and the first electrode EL1.

The second contact electrode CNE2 may electrically connect a side of the second electrode EL2 to the remaining end of the both ends EP1 and EP2 of each of the first light emitting elements LD1 in the emission area EMA of each pixel PXL. In addition, the second contact electrode CNE2 may electrically connect another side of the second electrode EL2 to one end of the both ends EP1 and EP2 of each of the second light emitting elements LD2 in the emission area EMA of each pixel PXL. In a plan view, the second contact electrode CNE2 may overlap each of the remaining end of each of the first light emitting elements LD1, the one end of each of the second light emitting elements LD2, and the second electrode EL2, and may sufficiently cover the second electrode EL2, the remaining end of each of the first light emitting elements LD1, and the one end of each of the second light emitting elements LD2. The second contact electrode CNE2 may be provided in a circular ring shape surrounding a periphery of the third contact electrode CNE3. The shape of the second contact electrode CNE2 is not limited to the above-described embodiment. The second contact electrode CNE2 may be provided in various shapes including an elliptical ring shape, a polygonal ring shape, and the like within a range capable of covering the remaining end of each of the first light emitting elements LD1, the one end of each of the second light emitting elements LD2, and the second electrode EL2.

The third contact electrode CNE3 may electrically connect a side of the third electrode EL3 to the remaining end of the both ends EP1 and EP2 of each of the second light emitting elements LD2 in the emission area EMA of each pixel PXL. In addition, the third contact electrode CNE3 may electrically connect another side of the third electrode EL3 to one end of the both ends EP1 and EP2 of each of the third light emitting elements LD3 in the emission area EMA of each pixel PXL. In a plan view, the third contact electrode CNE3 may overlap each of the remaining end of each of the second light emitting elements LD2, the one end of each of the third light emitting elements LD3, and the third electrode EL3, and may sufficiently cover the third electrode EL3, the remaining end of each of the second light emitting elements LD2, and the one end of each of the third light emitting elements LD3. The third contact electrode CNE3 may be provided in a circular ring shape surrounding a periphery of the fourth contact electrode CNE4. The shape of the third contact electrode CNE3 is not limited to the above-described embodiment. The third contact electrode CNE3 may be provided in various shapes including an elliptical ring shape, a polygonal ring shape, and the like within a range capable of covering the third electrode EL3, the remaining end of each of the second light emitting elements LD2, and the one end of each of the third light emitting elements LD3.

The fourth contact electrode CNE4 may electrically connect the fourth electrode EL4 to the remaining end of each of the third light emitting elements LD3 in the emission area EMA of each pixel PXL. In a plan view, the fourth contact electrode CNE4 may overlap each of the fourth electrode EL4 and the remaining end of each of the third light emitting elements LD3, and may sufficiently cover the fourth electrode EL4 and the remaining end of each of the third light emitting elements LD3. The fourth contact electrode CNE4 may be provided in an isolated circular island shape surrounded by the third contact electrode EL3. The shape of the fourth contact electrode CNE4 is not limited to the above-described embodiment. The fourth contact electrode CNE4 may be provided in various shapes including an elliptical shape, a polygonal shape, and the like within a range capable of covering the fourth electrode EL4 and the remaining end of each of the third light emitting elements LD3.

As described above, in case that the first contact electrode CNE1 having a circular ring shape surrounds a periphery of the second contact electrode CNE2 having a circular ring shape, the second contact electrode CNE2 having a circular ring shape surrounds a periphery of the third contact electrode CNE3 having a circular ring shape, and the third contact electrode CNE3 surrounds a periphery of the fourth contact electrode having a circular shape, the first to fourth contact electrodes CNE1 to CNE4 may form a concentric circular structure in the emission area EMA of each pixel PXL.

In an embodiment, an encapsulation layer ENC may be provided and/or formed on the first to fourth contact electrodes CNE1 to CNE4. The encapsulation layer ENC may be an inorganic insulating layer including an inorganic material or an organic insulating layer including an organic material. For example, the encapsulation layer ENC may have a structure in which at least one inorganic insulating layer or at least one organic insulating layer is alternately stacked. The encapsulation layer ENC may entirely cover the display element part DPL to prevent water or moisture from flowing into the display element part DPL including the light emitting elements LD from the outside.

A capping layer (not shown) may be provided and/or formed in the emission area EMA of each pixel PXL. The capping layer may be provided and/or formed between each of the first to fourth electrodes EL1 to EL4 and the contact electrode CNE formed thereon. For example, the capping layer may be provided and/or formed between the first electrode EL1 and the first contact electrode CNE1, between the second electrode EL2 and the second contact electrode CNE2, between the third electrode EL3 and the third contact electrode CNE3, and between the fourth electrode EL4 and the fourth contact electrode CNE4. The above-described capping layer may prevent damage to each of the first to fourth electrodes EL1 to EL4 due to a defect or the like occurring during a manufacturing process of the display device, and may further strengthen adhesive force between each of the first to fourth electrodes EL1 to EL4 and the protective layer PSV. The capping layer may be formed of a transparent conductive material such as indium zinc oxide (IZO) to minimize loss of light emitted from each of the light emitting elements LD and reflected by each of the first to fourth electrodes EL1 to EL4 in the image display direction of the display device.

According to the above-described embodiment, the circular fourth electrode EL4 is disposed at the center (or the middle), for example, the core, of the emission area EMA of each pixel PXL, the third electrode EL3 surrounding the fourth electrode EL4 is disposed, the second electrode EL2 surrounding the third electrode EL3 is disposed, and the first electrode EL1 surrounding the second electrode EL2 is disposed. In addition, an electric field is formed between two adjacent electrodes among the first to fourth electrodes EL1 to EL4 by applying an alignment signal to each of the first to fourth electrodes EL1 to EL4 through an individual (or corresponding) conductive line. Due to the electric field formed between the two adjacent electrodes, the light emitting elements LD may be aligned between the first to fourth electrodes EL1 to EL4.

In this case, the light emitting elements LD may be aligned and/or provided in a radial shape (or radially) with respect to the fourth electrode EL4 formed in a circular island shape, which is positioned at the center (or the middle), for example, the core, in the emission area EMA of each pixel PXL. Accordingly, the light emitting elements LD may not be aligned and/or provided to be biased in a specific direction in the emission area EMA of each pixel PXL. Therefore, the light emitted from each of the light emitting elements LD may not be concentrated in a specific direction. Accordingly, an amount (or intensity) of light emitted from the emission area EMA of each pixel PXL may be similar to or substantially the same as an amount (or intensity) of light emitted from the emission area EMA of an adjacent pixel PXL. Therefore, the display device according to an embodiment may have a uniform light output distribution over the entire display area DA in which an image is displayed.

According to the above-described embodiment, the first and second electrodes EL1 and EL2 spaced apart from each other and the first light emitting elements LD1 electrically connected in parallel therebetween form the first series stage, the second electrode EL2 and the third electrode EL3 spaced apart from each other and the second light emitting elements LD2 electrically connected in parallel therebetween form the second series stage, and the third electrode EL3 and the fourth electrode EL4 spaced apart from each other and the third light emitting elements LD3 electrically connected in parallel therebetween form the third series stage. The light emitting elements LD included in each of two successive series stages may share an electrode to be electrically connected to each other. For example, the first light emitting elements LD1 included in the first series stage and the second light emitting elements LD2 included in the second series stage may share the second electrode EL2 to be electrically connected to each other. In addition, the second light emitting elements LD2 included in the second series stage and the third light emitting elements LD3 included in the third series stage may share the third electrode EL3 to be electrically connected to each other. In such a method, the light emitting part EMU of each pixel PXL may be configured by electrically connecting, to each other, the light emitting elements LD aligned in the emission area EMA of each pixel PXL in a mixed structure in series/parallel.

According to the above-described embodiment, each pixel PXL may be stably driven by configuring the light emitting part EMU of the series/parallel mixed structure, and thus a driving current flowing through the display panel of the display device may be reduced, so that power consumption efficiency can be increased.

According to the above-described embodiment, the fourth electrode EL4 may be disposed at the center of the emission area EMA of each pixel PXL, the third electrode EL3 surrounding the fourth electrode EL4 may be disposed, the second electrode EL2 surrounding the third electrode EL3 may be disposed, the first electrode EL1 surrounding the second electrode EL2 may be disposed, and thus the first to fourth electrodes EL1 to EL4 may have a concentric circle structure. In this case, an integration degree of the light emitting elements LD aligned and/or provided in the emission area EMA of each pixel PXL may be improved, and thus an alignment area of the light emitting elements LD may be further secured. Therefore, the display device according to an embodiment may more readily implement high resolution.

Figure 16:
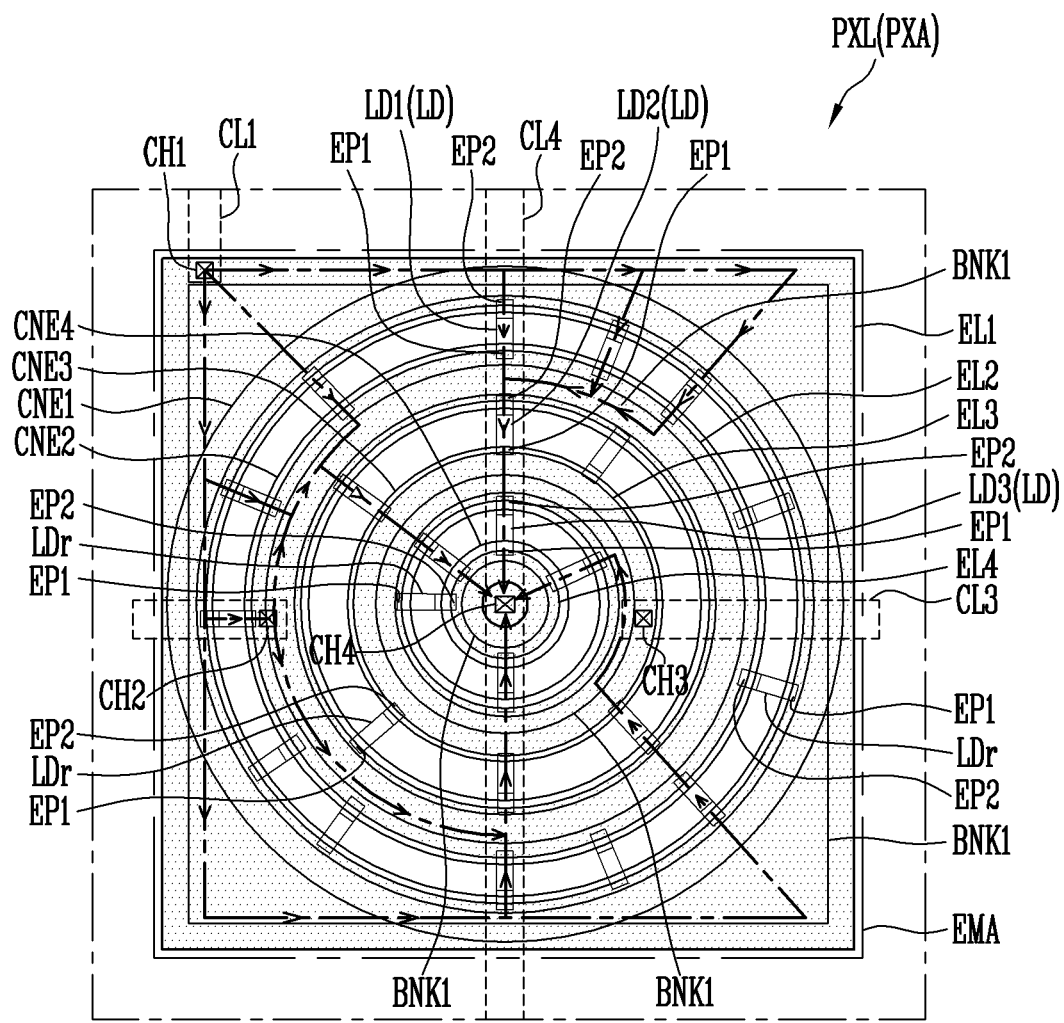
FIG. 16 is a plan view illustrating a driving current flowing through a pixel according to an embodiment of the disclosure, and as an example, illustrates a flow of the driving current flowing through a pixel of FIG. 8.
Figure 17A:
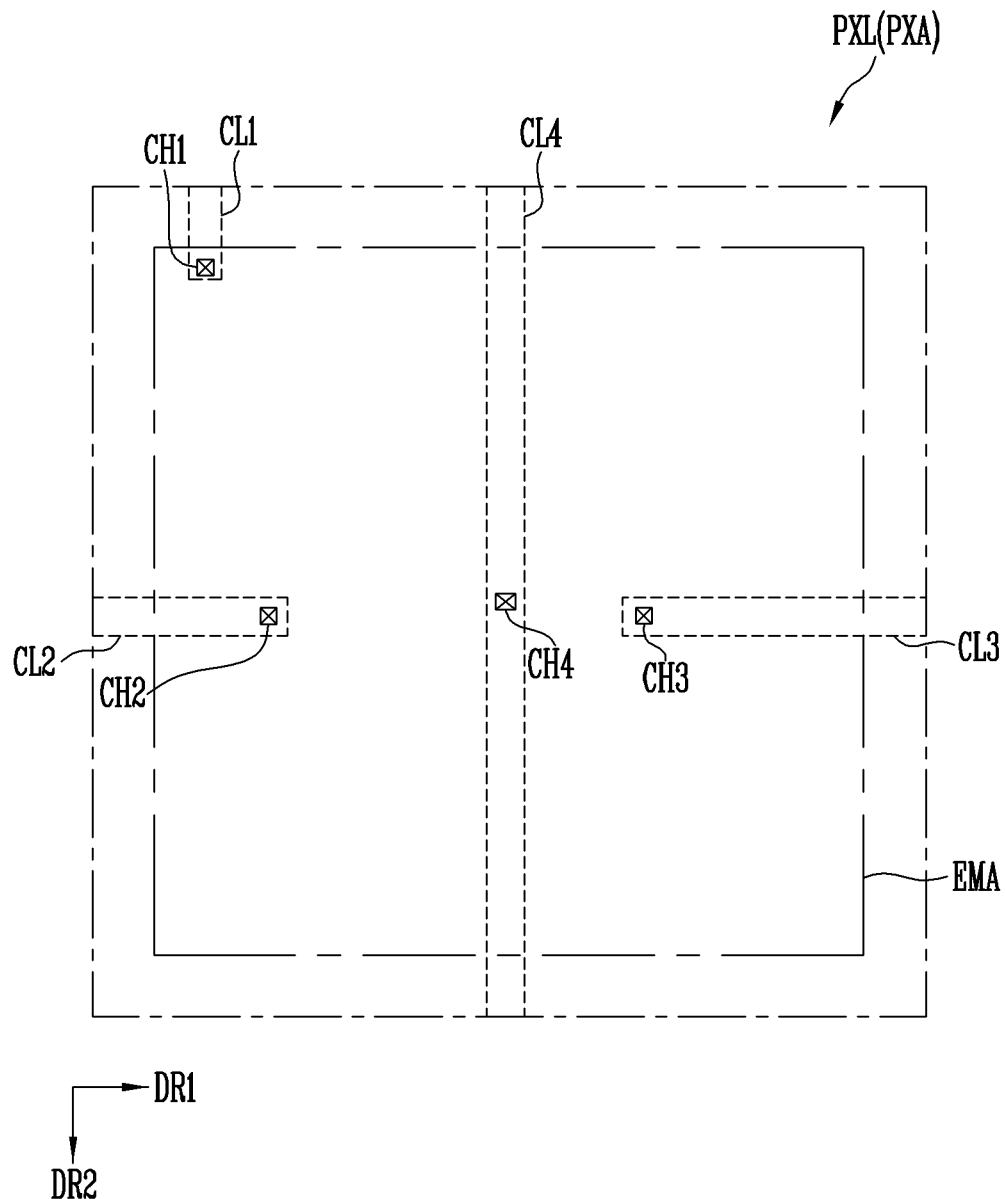
FIGS. 17A to 17F are schematic plan views sequentially illustrating a method of manufacturing the pixel shown in FIG. 8.
Figure 17B:
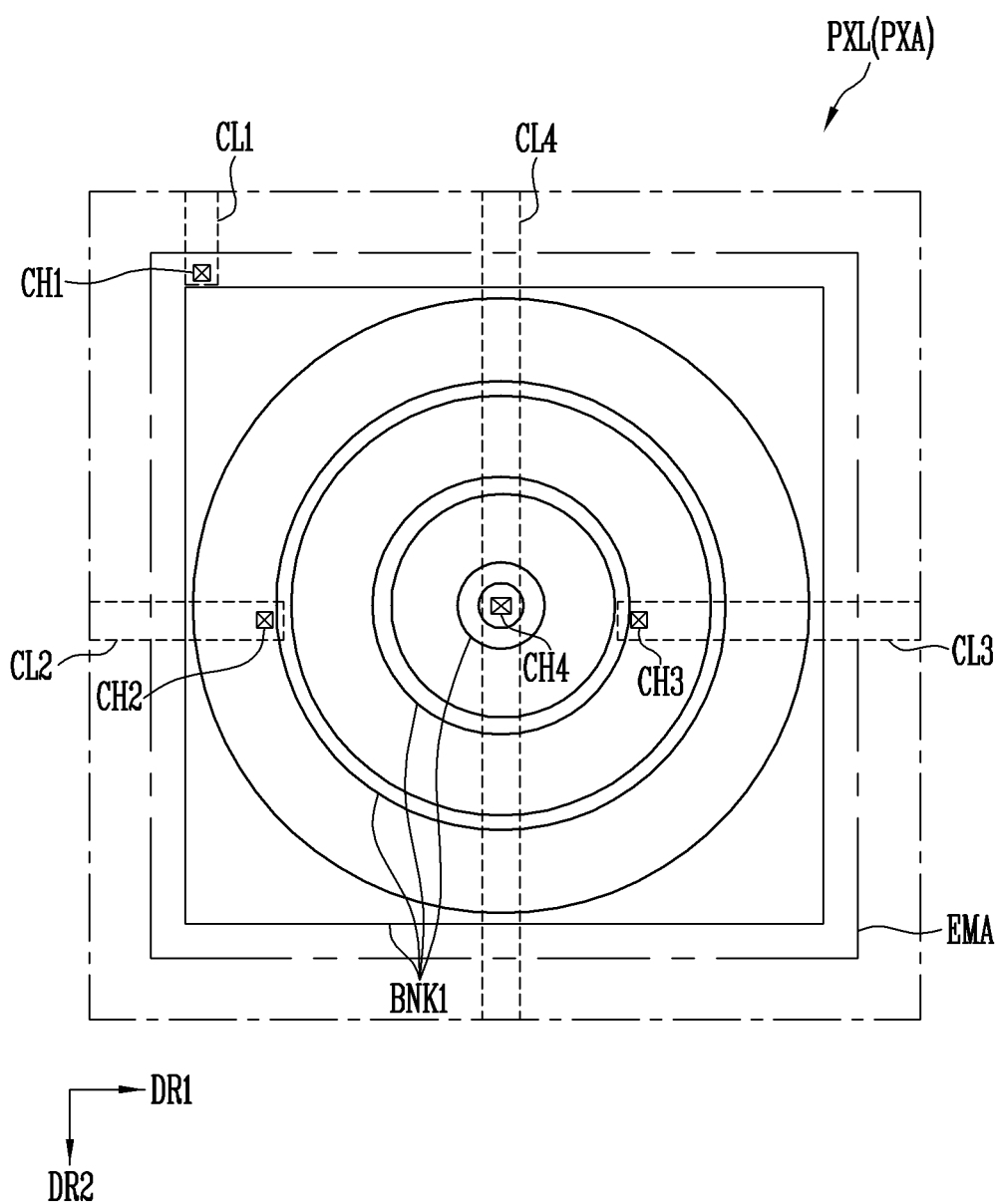
Figure 17C:
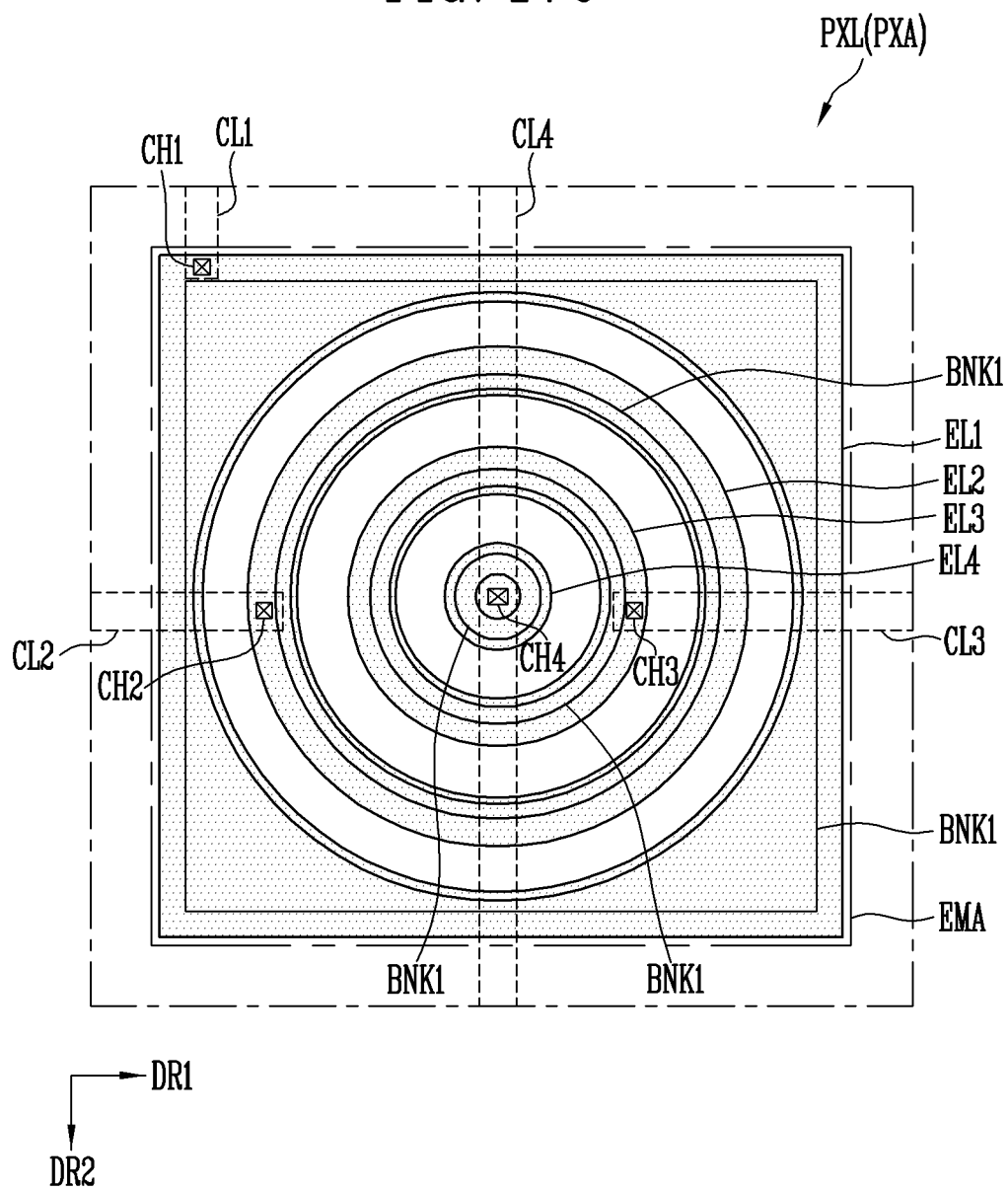
Figure 17D:
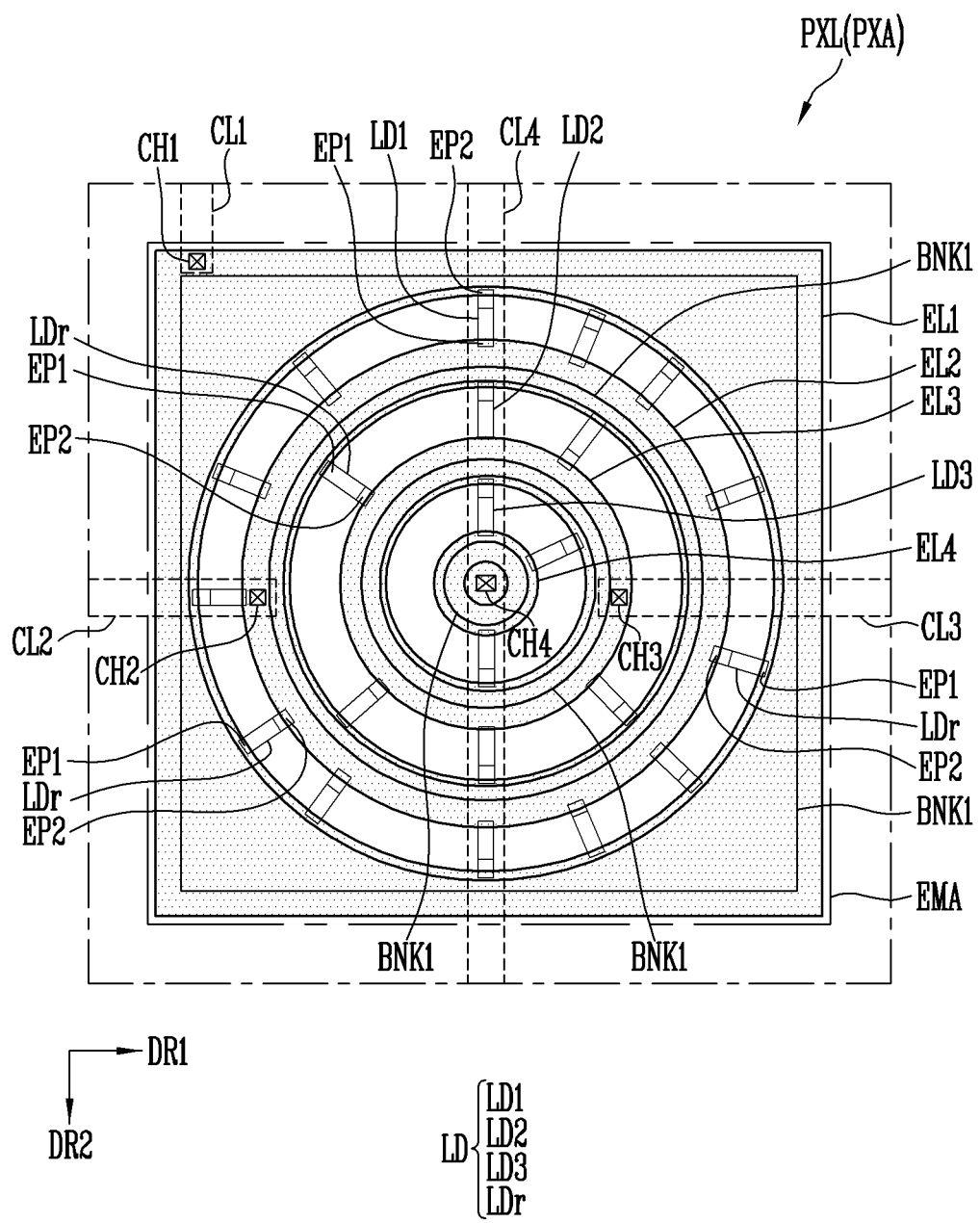
Figure 17E:
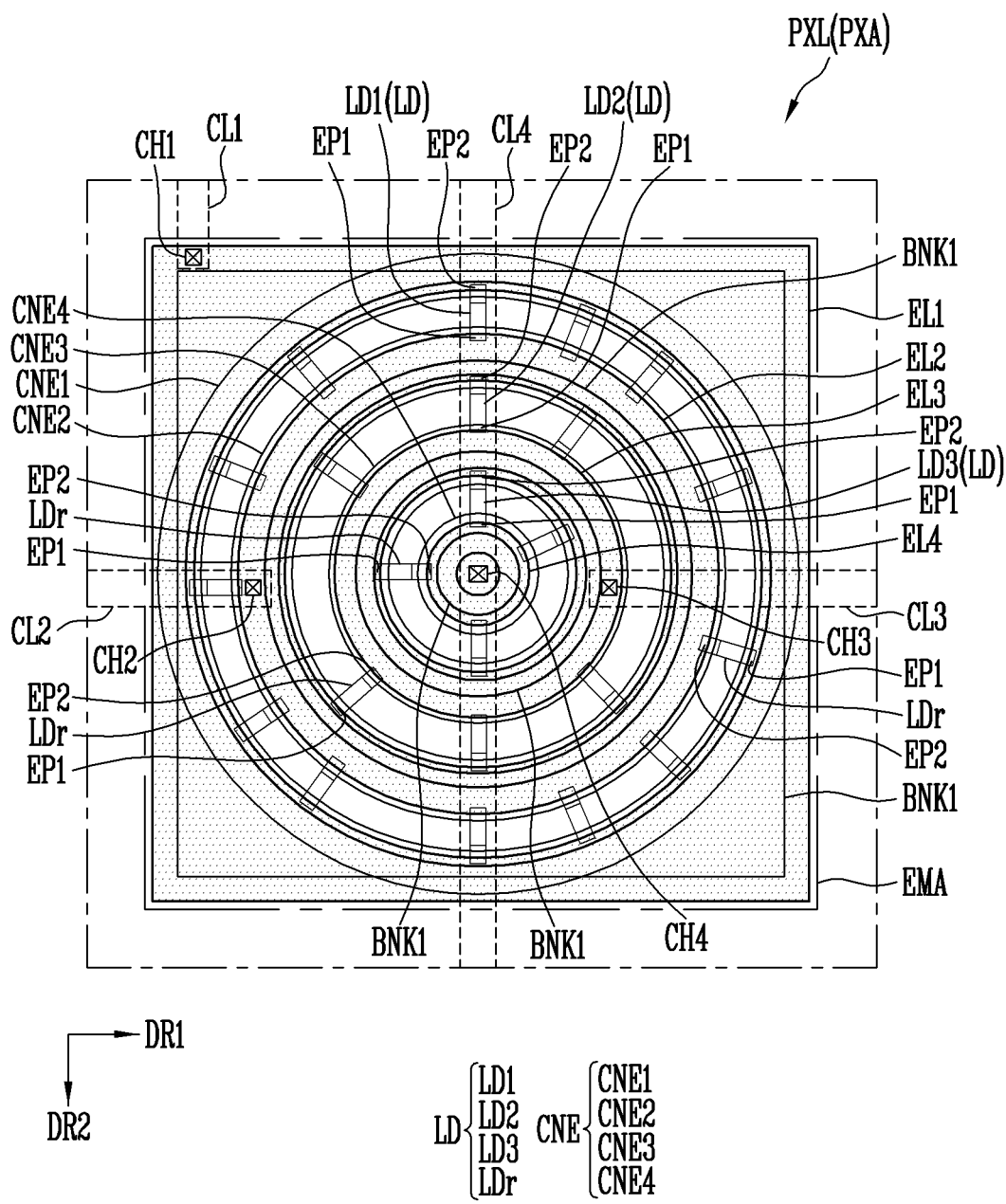
Figure 17F:
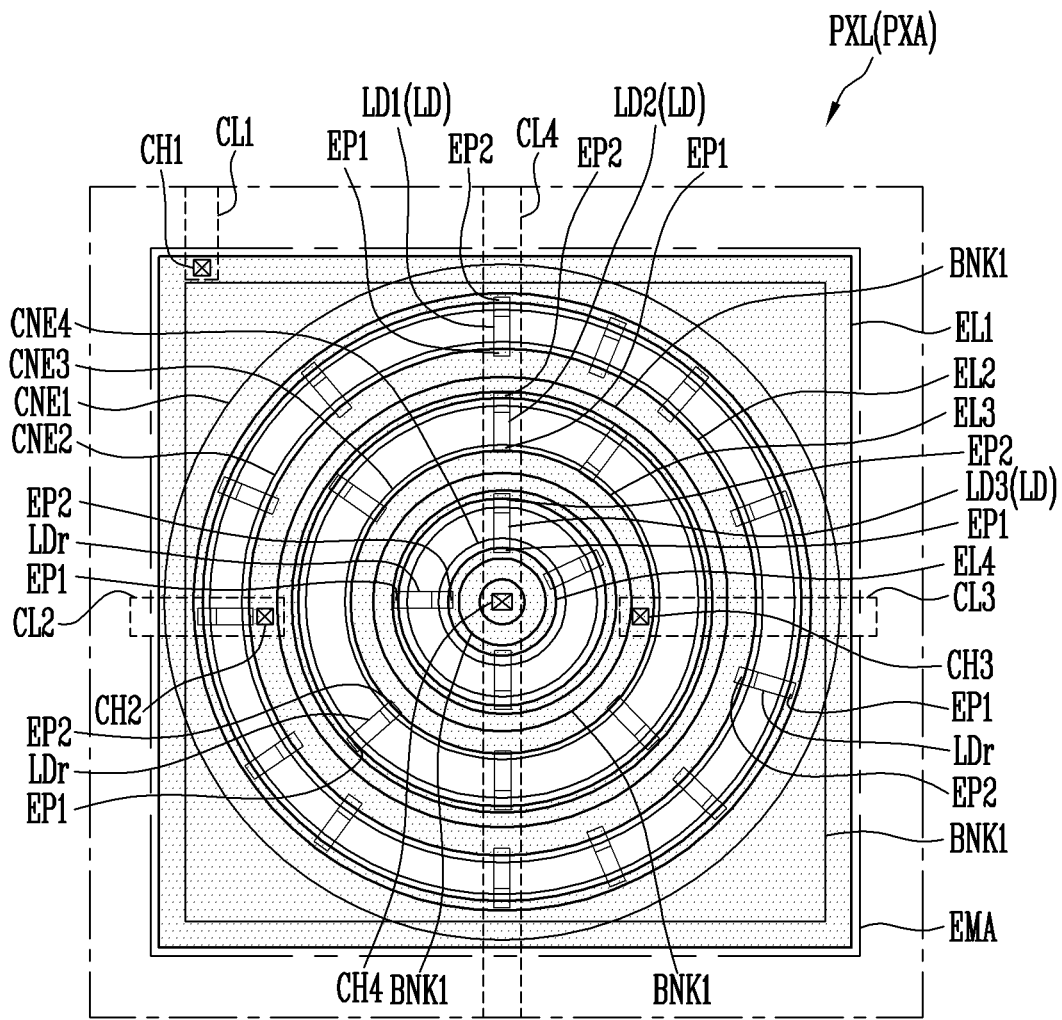
Figure 18A:
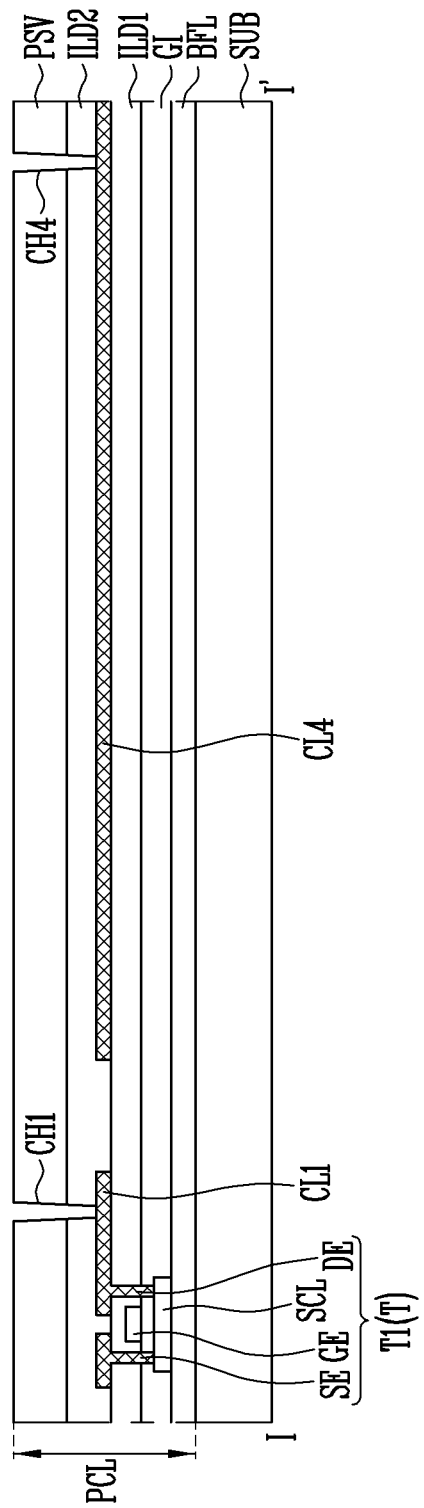
FIGS. 18A to 18H are cross-sectional views sequentially illustrating a method of manufacturing a pixel shown in FIG. 9.
Figure 18B:
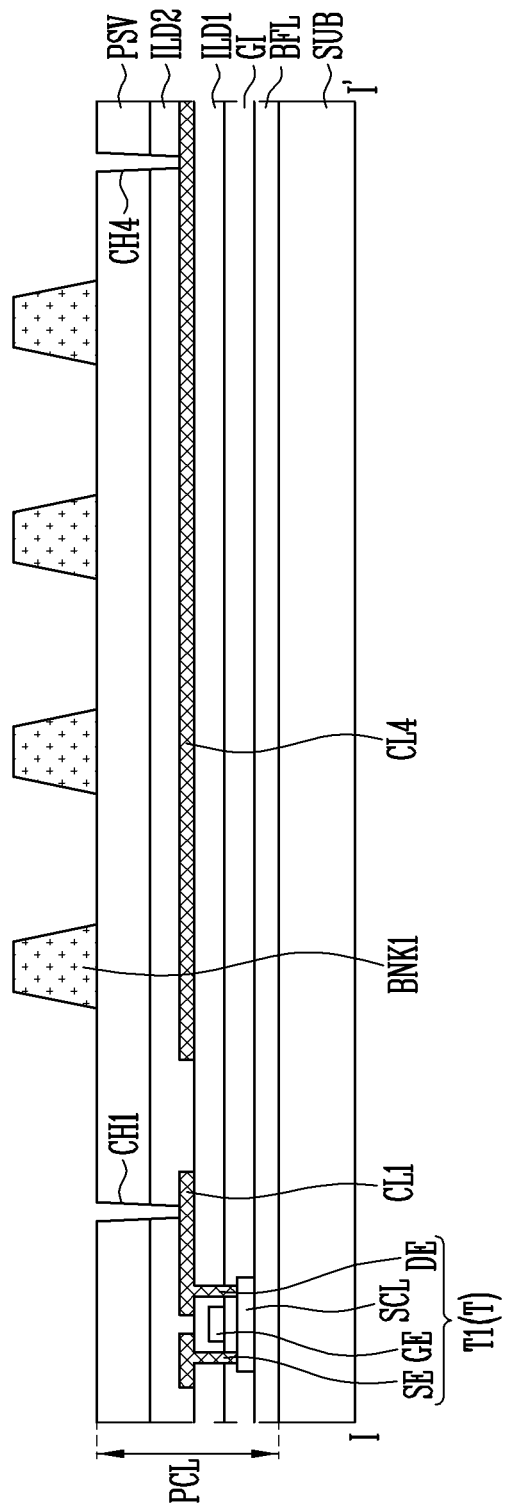
Figure 18C:
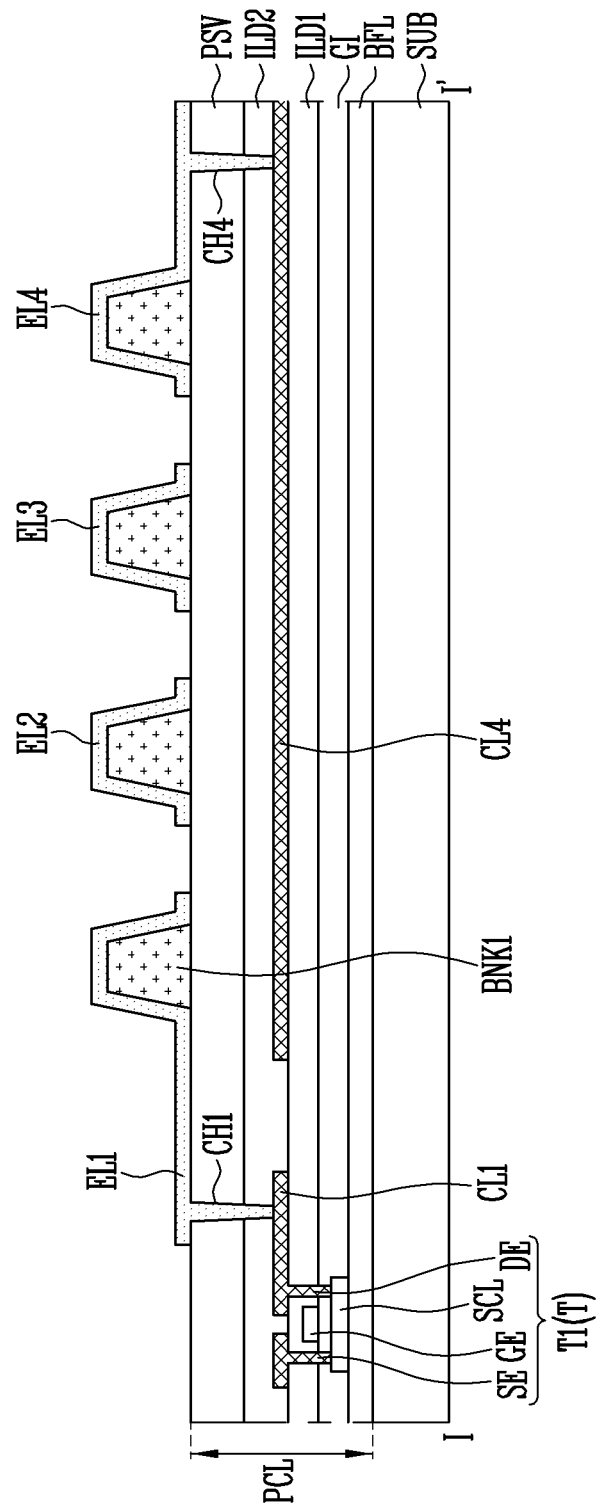
Figure 18D:
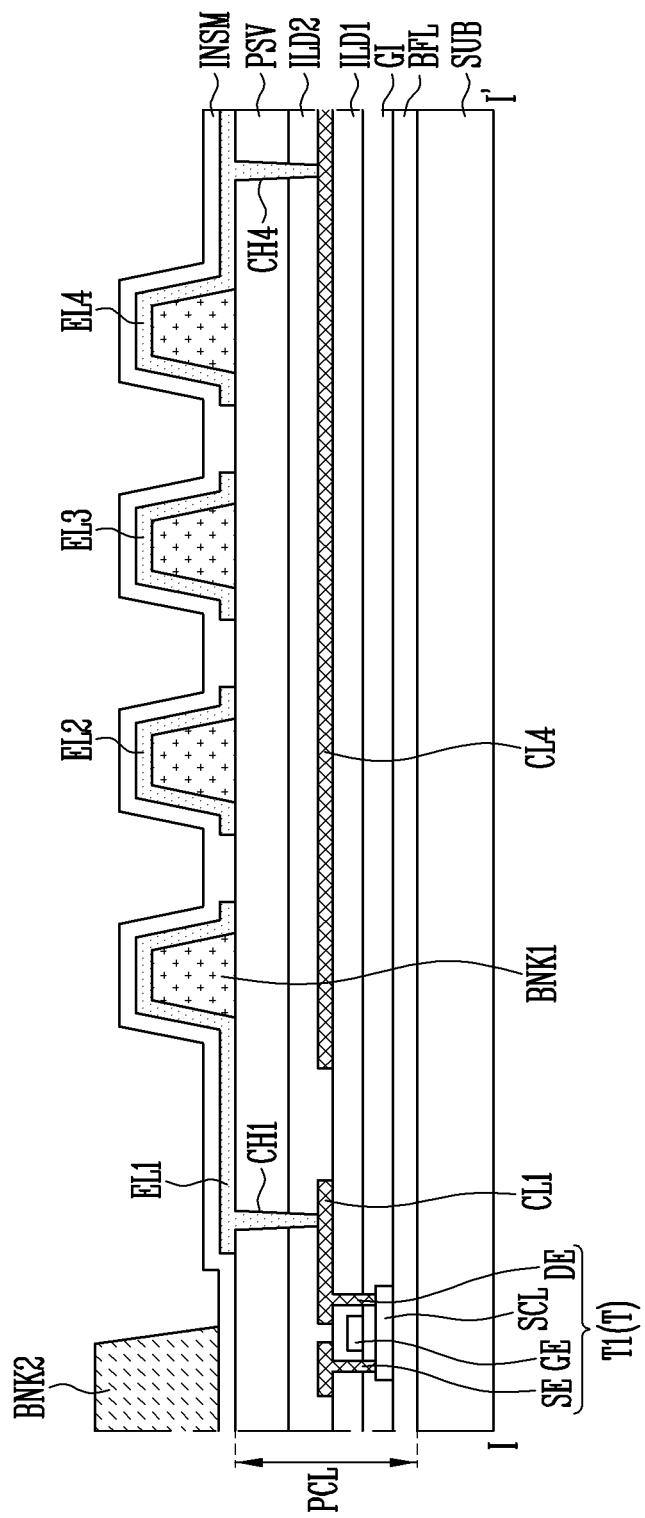
Figure 18E:
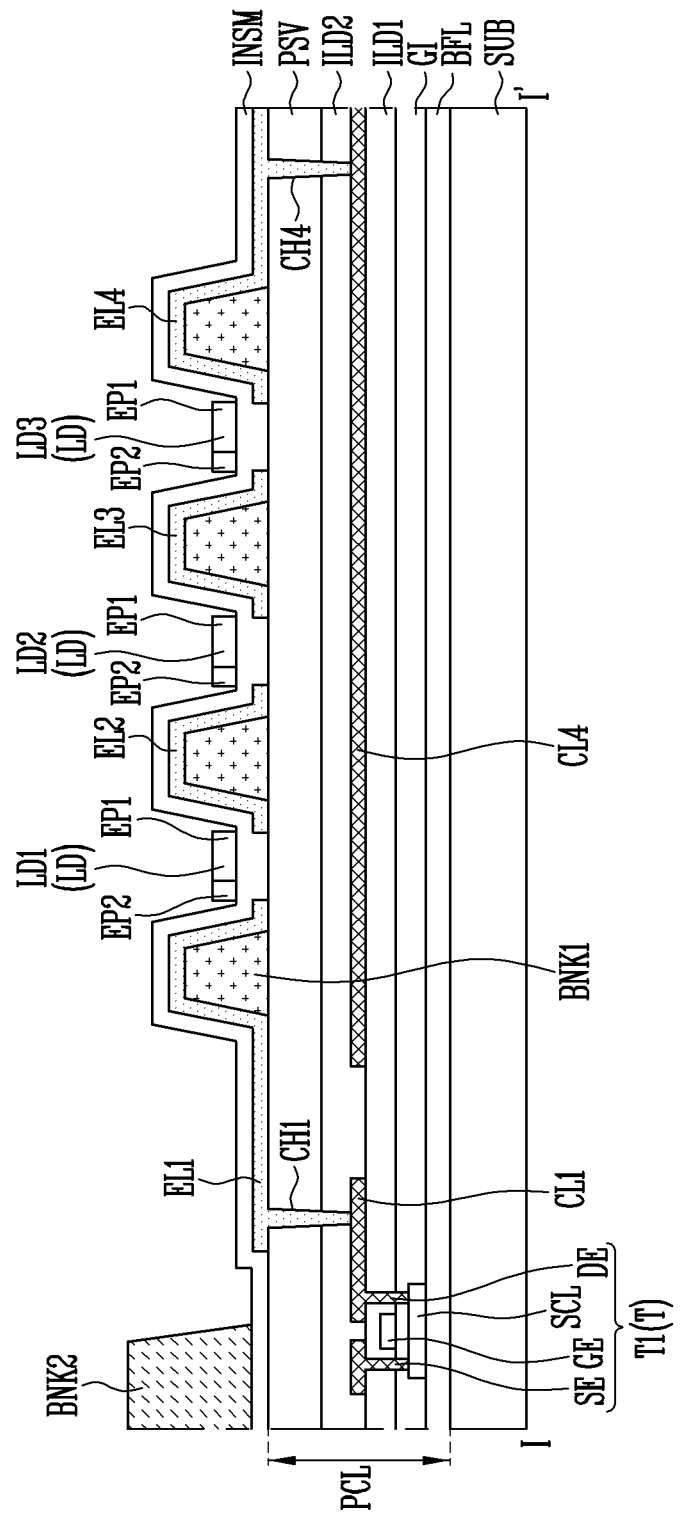
Figure 18F:
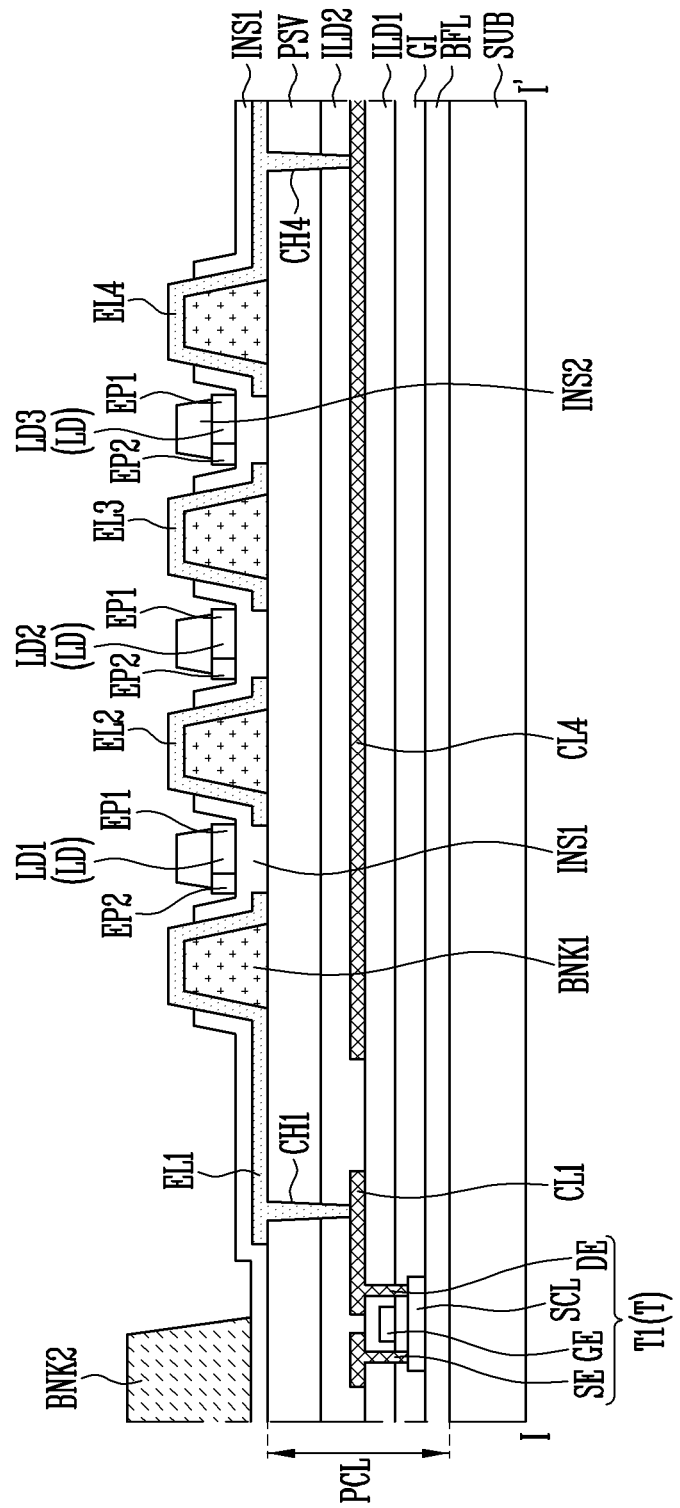
Figure 18G:
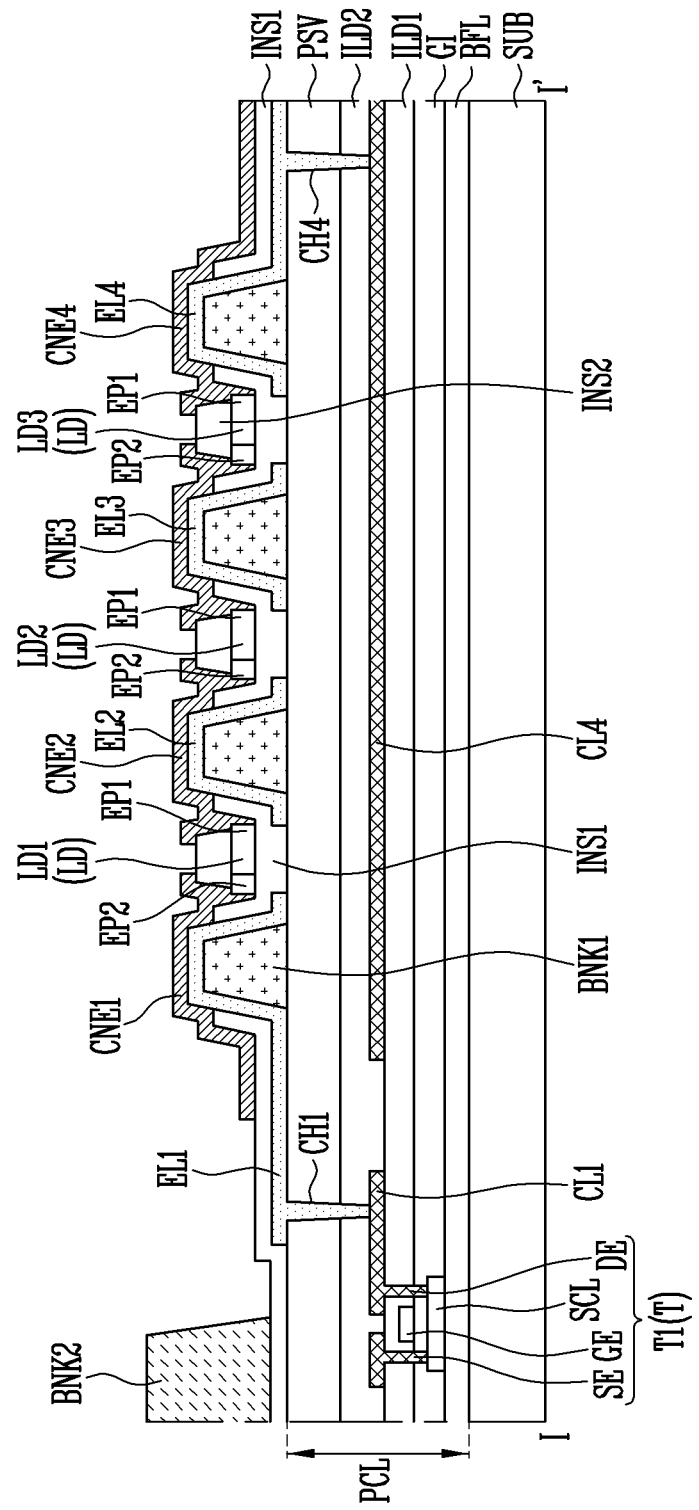
Figure 18H:
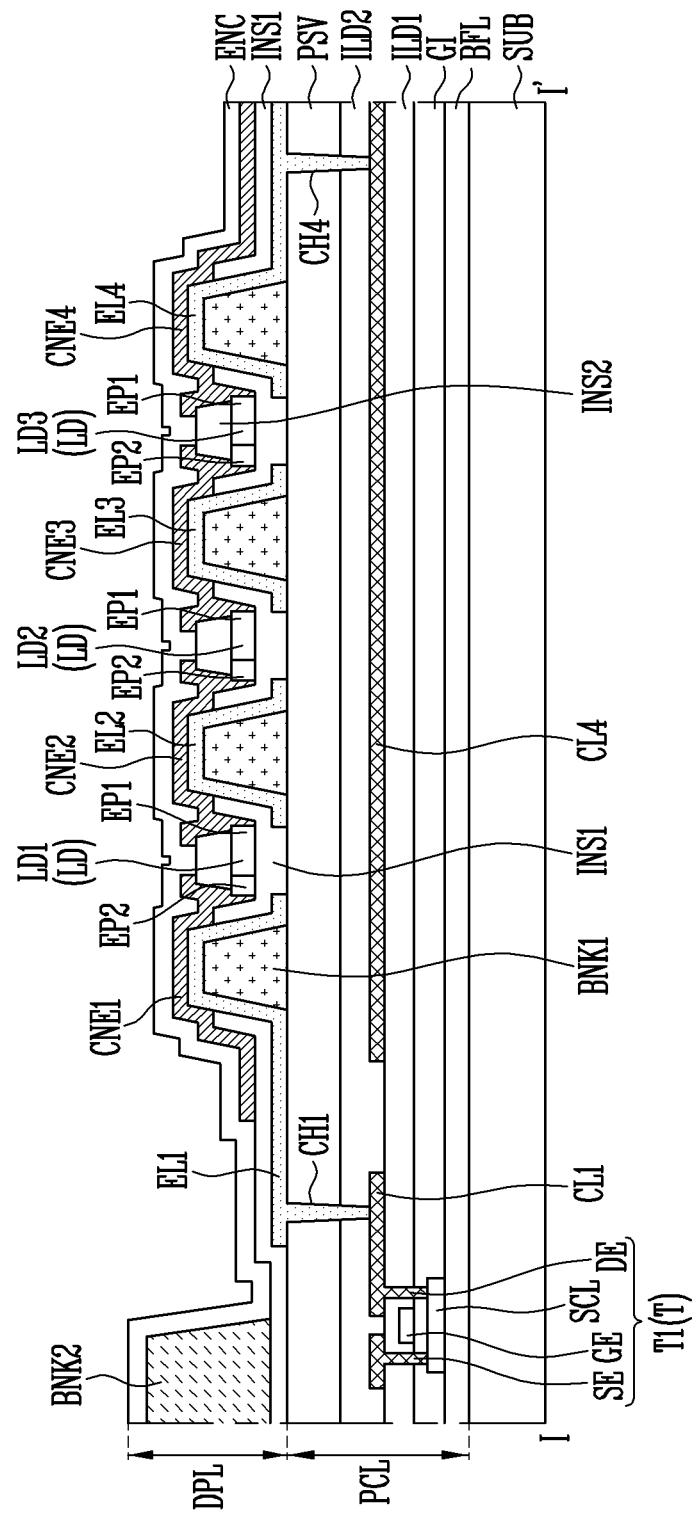

FIG. 16 is a schematic plan view illustrating a driving current flowing through a pixel according to an embodiment, and as an example, illustrates a flow of the driving current flowing through the pixel of FIG. 8. As illustrated in FIG. 16, in case that the pixel PXL of FIG. 8 is driven to emit light in response to a data signal of a grayscale, the flow of the driving current flowing through the pixel PXL is shown by a dotted arrow.

Referring to FIGS. 1A to 5, 7B, 7C, and 8 to 16, when it is assumed that the driving current flows from the first power line PL1 to the fourth conductive lines CL4 and PL2 by the first transistor T1 of the pixel circuit part PCL included in each pixel PXL, for example, by the driving transistor, the driving current may flow into the light emitting part EMU of each pixel PXL through the first conductive line CL1 and the first contact hole CH1. For example, the driving current is supplied to the first electrode EL1 through the first conductive line CL1 and the first contact hole CH1, and the driving current flows to the second electrode EL2 via the first light emitting elements LD1. Accordingly, the first light emitting elements LD1 disposed between the first electrode EL1 and the second electrode EL2 may emit light with a luminance corresponding to a current distributed to each of the first light emitting elements LD1. The driving current flowing through the second electrode EL2 flows to the third electrode EL3 via the second light emitting elements LD2 disposed between the second electrode EL2 and the third electrode EL3. Accordingly, the second light emitting elements LD2 may emit light with a luminance corresponding to a current distributed to each of the second light emitting elements LD2. The driving current flowing through the third electrode EL3 flows to the fourth electrode EL4 via the third light emitting elements LD3 disposed between the third electrode EL3 and the fourth electrode EL4. Accordingly, the third light emitting elements LD3 may emit light with a luminance corresponding to a current distributed to each of the third light emitting elements LD3.

In the method described above, the driving current of each pixel PXL may flow while sequentially passing through the first light emitting elements LD1 disposed between the first and second electrodes EL1 and EL2, the second light emitting elements LD2 disposed between the second electrode EL2 and the third electrode EL3, and the third light emitting elements LD3 disposed between the third electrode EL3 and the fourth electrode EL4. Accordingly, each pixel PXL may emit light with a luminance corresponding to the data signal supplied during each frame period.

FIGS. 17A to 17F are schematic plan views sequentially illustrating a method of manufacturing the pixel shown in FIG. 8, and FIGS. 18A to 18H are cross-sectional views sequentially illustrating a method of manufacturing the pixel shown in FIG. 9.

Hereinafter, the pixel according to an embodiment shown in FIGS. 8 and 9 is sequentially described according to a manufacturing method in conjunction with FIGS. 17A to 17F and FIGS. 18A to 18H.

Referring to FIGS. 1A to 4B, 5, 7B, 7C, 8 to 17A, and 18A, the pixel circuit part PCL included in each pixel PXL is formed on the substrate SUB. The pixel area PXA in which the pixel PXL is provided (or prepared) may include the emission area EMA that emits light and the peripheral area surrounding the periphery of the emission area EMA.

The pixel circuit part PCL may include the pixel circuit 144 including at least one transistor T, the first to fourth conductive lines CL1 to CL4, and at least one insulating layer. The at least one insulating layer may include the buffer layer BFL, the gate insulating layer GI, the first and second interlayer insulating layers ILD1 and ILD2, and the protective layer PSV sequentially formed on the substrate SUB.

Each of the second interlayer insulating layer ILD2 and the protective layer PSV may include the first contact hole CH1 exposing a portion of the first conductive line CL1 integrally provided with the second terminal DE of the first transistor T1 included in the pixel circuit 144, the second contact hole CH2 exposing a portion of the second conductive line CL2, the third contact hole CH3 exposing a portion of the third conductive line CL3, and the fourth contact hole CH4 exposing a portion of the fourth conductive line CL4.

Each of the first to fourth conductive lines CL1 to CL4 may be formed on the first interlayer insulating layer ILD1. In a plan view, each of the first to fourth conductive lines CL1 to CL4 may extend in a direction and may be spaced apart from each other to be electrically and/or physically separated from each other. For example, the first and fourth conductive lines CL1 and CL4 may extend in the second direction DR2, for example, a vertical direction, and the second and third conductive lines CL2 and CL3 may extend in the first direction DR1 intersecting (for example, orthogonal to) the second direction DR2.

In an embodiment, each of the first to fourth conductive lines CL1 to CL4 may be electrically connected to different alignment pads (not shown) disposed in the non-display area NDA of the display device. For example, the first conductive line CL1 may be electrically connected to a first alignment pad, the second conductive line CL2 may be electrically connected to a second alignment pad, the third conductive line CL3 may be electrically connected to a third alignment pad, and the fourth conductive line CL4 may be electrically connected to a fourth alignment pad. Different alignment signals (or alignment voltages) may be applied to the respective first to fourth alignment pads.

Referring to FIGS. 1A to 4B, 5, 7B, 7C, 8 to 16, 17B, 18A, and 18B, the first bank pattern BNK1 is formed on the protective layer PSV. On the protective layer PSV, the first bank pattern BNK1 may be spaced apart from the adjacent first bank pattern BNK1 by a distance. The first bank pattern BNK1 may include an inorganic insulating layer formed of an inorganic material or an organic insulating layer formed of an organic material.

In a plan view, the first bank pattern BNK1 may be formed in a circular ring shape (or a closed loop shape), and may form a concentric circle structure together with the adjacent first bank patterns BNK1 in each emission area EMA. The shape of the first bank pattern BNK1 is not limited to the above-described embodiment, and may be provided in various shapes within a range capable of further securing an amount of light proceeding in the image display direction of the display device by the first to fourth electrodes EL1 to EL4.

Referring to FIGS. 1A to 4B, 5, 7B, 7C, 8 to 16, 17C, and 18A to 18C, the first to fourth electrodes EL1 to EL4 including a conductive material (or substance) having high reflectance are formed on the protective layer PSV including the first bank pattern BNK1.

Each of the first to fourth electrodes EL1 to EL4 may be formed on the first bank pattern BNK1.

The fourth electrode EL4 may be positioned at the center (or the middle), for example, the core, of the emission area EMA of each pixel PXL, and may form an isolated circular island shape. The third electrode EL3 may be formed in a circular ring shape surrounding the periphery of the fourth electrode EL4 in the circumferential direction of the fourth electrode EL4. The second electrode EL2 may be formed in a circular ring shape surrounding the periphery of the third electrode EL3 in the circumferential direction of the third electrode EL3. The first electrode EL1 may be positioned at the outermost portion of the emission area EMA of each pixel PXL and may be formed in a polygonal ring shape surrounding the periphery of the second electrode EL2 in the circumferential direction of the second electrode EL2.

In an embodiment, the first electrode EL1 may be electrically connected to the first conductive line CL1 through the first contact hole CH1, the second electrode EL2 may be electrically connected to the second conductive line CL2 through the second contact hole CH2, the third electrode EL3 may be electrically connected to the third conductive line CL3 through the third contact hole CH3, and the fourth electrode EL4 may be electrically connected to the fourth conductive line CL4 through the fourth contact hole CH4.

Referring to FIGS. 1A to 4B, 5, 7B, 7C, 8 to 16, and 18A to 18D, an insulating material layer INSM is formed on the protective layer PSV including the first to fourth electrodes EL1 to EL4. The insulating material layer INSM may include an inorganic insulating layer formed of an inorganic material or an organic insulating layer formed of an organic material.

Subsequently, a second bank pattern BNK2 is formed in the peripheral area of each pixel PXL. In this case, the second bank pattern BNK2 may be formed on the insulating material layer INSM. The second bank pattern BNK2 may be a structure defining (or partitioning) the emission area EMA between each pixel PXL and pixels PXL adjacent to each pixel PXL, for example, a pixel defining layer.

Referring to FIGS. 1A to 4B, 5, 7B, 7C, 8 to 16, 17D, and 18A to 18E, an electric field is formed between the first to fourth electrodes EL1 to EL4 by applying a corresponding alignment signal (or alignment voltage) to each of the first to fourth electrodes EL1 to EL4 through the first to fourth conductive lines CL1 to CL4. For example, in case that AC power or DC power having a voltage and period is repeatedly applied to each of the first to fourth electrodes EL1 to EL4 several times, an electric field according to a potential difference between two adjacent electrodes among the first to fourth electrodes EL1 to EL4 may be formed between the two adjacent electrodes.

In an embodiment, the first electrode EL1 may receive the first alignment signal from the first alignment pad through the first conductive line CL1, the second electrode EL2 may receive the second alignment signal from the second alignment pad through the second conductive line CL2, the third electrode EL3 may receive the third alignment signal from the third alignment pad through the third conductive line CL3, and the fourth electrode EL4 may receive the fourth alignment signal from the fourth alignment pad through the fourth conductive line CL4. The first to fourth alignment signals may have different voltage levels.

As described above, in a state in which the electric field is formed between the first to fourth electrodes EL1 to EL4, a mixed solution including the light emitting elements LD is injected (or supplied) to the emission area EMA of each pixel PXL by using an inkjet printing method or the like. For example, an inkjet nozzle may be disposed on the insulating material layer INSM, and a solvent in which the light emitting elements LD are mixed may be injected (or supplied) to the emission area EMA of each pixel PXL through the inkjet nozzle. The solvent may be one or more of acetone, water, alcohol, and toluene, but the disclosure is not limited thereto. For example, the solvent may be in a form of an ink or paste. A method of injecting (or supplying) the light emitting elements LD to the emission area EMA of each pixel PXL is not limited to the above-described embodiment, and the method of injecting (or supplying) of the light emitting elements LD may be variously changed.

After the light emitting elements LD are injecting (or supplied) to the emission area EMA of each pixel PXL, the solvent may be removed.

In case that the light emitting elements LD are injected to the emission area EMA, self-alignment of the light emitting elements LD may be induced by the electric field formed between the first electrode EL1 and the second electrode EL2, between the second electrode EL2 and the third electrode EL3, and between the third electrode EL3 and the fourth electrode EL4. Accordingly, the light emitting elements LD may be aligned between the first electrode EL1 and the second electrode EL2, between the second electrode EL2 and the third electrode EL3, and between the third electrode EL3 and the fourth electrode EL4. In this case, the light emitting elements LD may be aligned and/or disposed on the insulating material layer INSM between two corresponding adjacent electrodes in the emission area EMA of each pixel PXL. For example, the first light emitting elements LD1 may be aligned on the insulating material layer INSM between the first electrode EL1 and the second electrode EL2, the second light emitting elements LD2 may be aligned on the insulating material layer INSM between the second electrode EL2 and the third electrode EL3, and the third light emitting elements LD3 may be aligned on the insulating material layer INSM between the third electrode EL3 and the fourth electrode EL4.

According to an embodiment, the light emitting elements LD may include at least one reverse light emitting element LDr electrically connected in a direction opposite to the forward direction according to a waveform, intensity, and the like of the alignment signal applied to each of the first to fourth electrodes EL1 to EL4 in the emission area EMA of each pixel PXL.

As described above, a ratio of the light emitting elements, for example, the reverse light emitting element LDr, electrically connected in the direction opposite to the forward direction, in which the light emitting elements LD may be electrically connected in the emission area EMA of each pixel PXL, may be adjusted, or the light emitting elements LD in the forward direction may be intensively disposed at a specific position, by a method of controlling a direction or intensity of the electric field formed between the first to fourth electrodes EL1 to EL4 by adjusting the alignment signal applied in a step of aligning the light emitting elements LD.

In an embodiment, the light emitting elements LD may be aligned and/or disposed in a radial shape (or radially) with respect to the fourth electrode EL4 in the emission area EMA of each pixel PXL. After the light emitting elements LD are aligned in the emission area EMA of each pixel PXL, each of the first to fourth alignment pads may stop supplying the corresponding alignment signal to the corresponding conductive line. According to an embodiment, each of the first to fourth alignment pads may be electrically disconnected from the corresponding conductive line after the light emitting elements LD are aligned, and thus each of the first to fourth alignment pads may not supply the corresponding alignment signal to the corresponding conductive line.

Referring to FIGS. 1A to 4B, 5, 7B, 7C, 8 to 16, and 18A to 18F, after the light emitting elements LD are aligned in the emission area EMA of each pixel PXL, the second insulating layer INS2 is formed on each of the light emitting elements LD. The second insulating layer INS2 may cover at least a portion of an upper surface of each of the light emitting elements LD to expose the both ends EP1 and EP2 except for the active layer 12 of each of the light emitting elements LD, to the outside.

The insulating material layer INSM may be etched to expose a portion of each of the first to fourth electrodes EL1 to EL4 by a process of forming the second insulating layer INS2 or an etching process performed before and after the process of the forming the second insulating layer INS2, and thus the first insulating layer INS1 may be formed.

Referring to FIGS. 1A to 4B, 5, 7B, 7C, 8 to 16, 17E, and 18A to 18G, the first to fourth contact electrodes CNE1 to CNE4 are formed on the protective layer PSV including the second insulating layer INS2.

The first contact electrode CNE1 may be formed directly on the first electrode EL1 and one end of the both ends EP1 and EP2 of each of the first light emitting elements LD1. The second contact electrode CNE2 may be formed directly on the second electrode EL2, the remaining end of the both ends EP1 and EP2 of each of the first light emitting elements LD1, and one end of the both ends EP1 and EP2 of each of the second light emitting elements LD2. The third contact electrode CNE3 may be formed directly on the third electrode EL3, the remaining end of the both ends EP1 and EP2 of each second light emitting element LD2, and one end of the both ends EP1 and EP2 of each of the third light emitting elements LD3. The fourth contact electrode CNE4 may be formed directly on the fourth electrode EL4 and the remaining end of the both ends EP1 and EP2 of each of the third light emitting elements LD3.

Referring to FIGS. 1A to 4B, 5, 7B, 7C, 8 to 16, 17F, and 18A to 18H, a portion of each of the second and third conductive lines CL2 and CL3 is removed so that each of the second and third conductive lines CL2 and CL3 may be in a floating state. Accordingly, the first light emitting elements LD1, the second light emitting elements LD2, and the third light emitting elements LD3 aligned in the emission area EMA of each pixel PXL may be electrically connected in series, and thus the driving current may flow from the first power line PL1 to the fourth conductive lines CL4 and PL2 by the first transistor T1, for example, the driving transistor, of the pixel circuit part 144 included in each pixel PXL.

In case that a process of removing a portion of each of the second and third conductive lines CL2 and CL3 is performed, a portion of the first electrode EL1 positioned between each pixel PXL and pixels PXL adjacent thereto may be removed. Accordingly, each pixel PXL may be driven independently (or separately) from the pixels PXL adjacent thereto.

Subsequently, the encapsulation layer ENC covering the first to fourth contact electrodes CNE1 to CNE4 is formed. The encapsulation layer ENC may have a structure in which at least one inorganic layer and at least one organic layer are alternately stacked.

Figure 19:
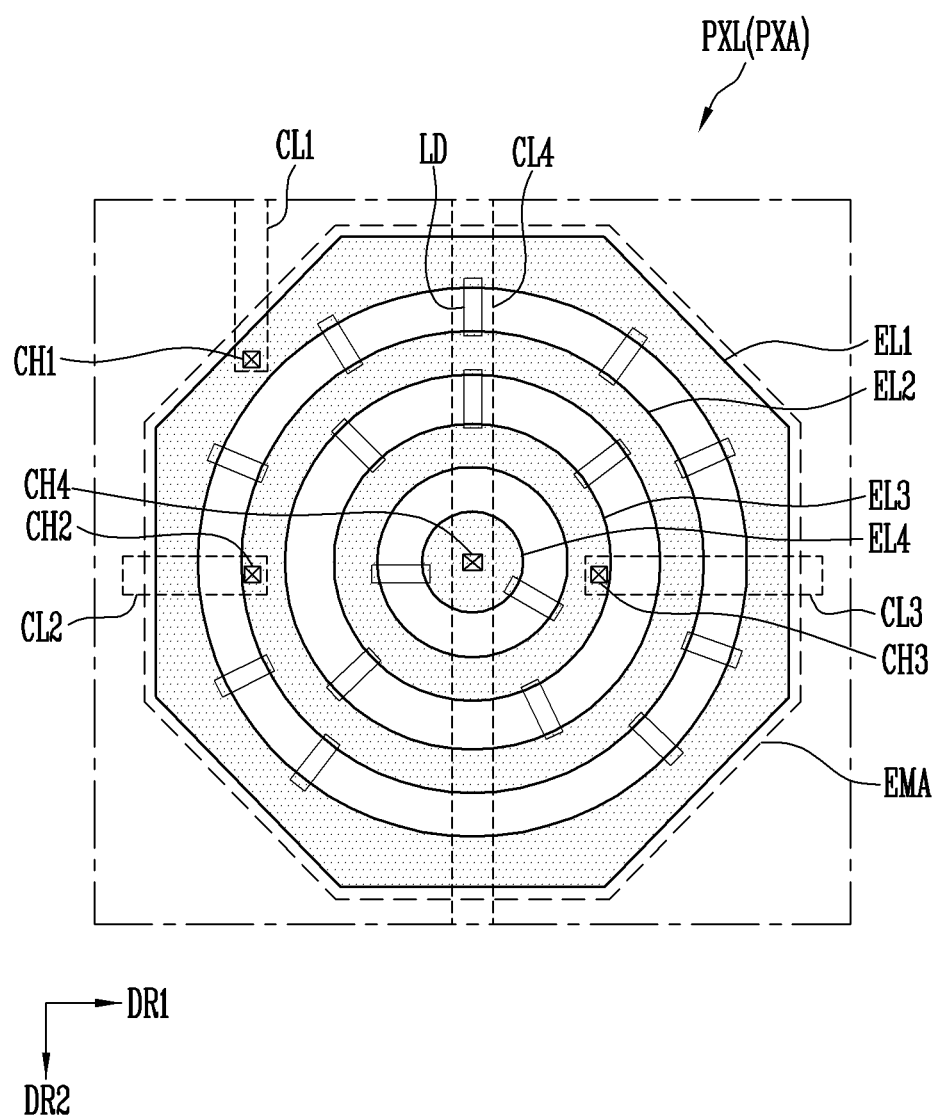
FIG. 19 is a diagram illustrating the pixel of FIG. 8 according to another embodiment, and is a schematic plan view of the pixel including only a partial configuration of a display element part.

FIG. 19 is a schematic diagram illustrating the pixel of FIG. 8 according to another embodiment, and is a schematic plan view of the pixel including only a partial configuration of the display element part.

FIG. 19 illustrates a simplified structure of the pixel PXL, showing only the first to fourth conductive lines, the first to fourth electrodes, and the light emitting elements included in the pixel PXL, but the disclosure is not limited thereto.

Regarding the pixel of FIG. 19, a detailed description of a configuration the same as or similar to that of the above-described embodiment of FIG. 8 is omitted.

Referring to FIGS. 1A to 5, 7B, 7C, and 19, the pixel area PXA in which each pixel PXL is disposed may include the emission area EMA emitting light and the peripheral area surrounding a periphery of the emission area EMA. Each pixel PXL may include the first to fourth conductive lines CL1 to CL4, the first to fourth electrodes EL1 to EL4, and the light emitting elements LD.

The fourth electrode EL4 may be positioned at the center (or the middle), for example, the core, of the emission area EMA of each pixel PXL, and may have a circular island shape. The third electrode EL3 may have a circular ring shape surrounding the periphery of the fourth electrode EL4 in the circumferential direction of the fourth electrode EL4. In this case, the third electrode EL3 and the fourth electrode EL4 may be spaced apart from each other by a distance and may be electrically separated from each other. For example, the third electrode EL3 and the fourth electrode EL4 may be insulated from each other. The fourth electrode EL4 may be surrounded by the third electrode EL3 and may be isolated.

The second electrode EL2 may have a circular ring shape surrounding the periphery of the third electrode EL3 in the circumferential direction of the third electrode EL3. In this case, the second electrode EL2 and the third electrode EL3 may be spaced apart from each other by a distance and may be electrically separated from each other. For example, the second electrode EL2 and the third electrode EL3 may be insulated from each other. The third electrode EL3 may be surrounded by the second electrode EL2 and may be isolated.

The first electrode EL1 may have a polygonal ring shape surrounding the periphery of the second electrode EL2 in the circumferential direction of the second electrode EL2. Specifically, the first electrode EL1 may have an inner surface adjacent to the second electrode EL2 and an outer surface positioned at the outermost portion of the emission area EMA. The inner surface may have a circular ring shape formed as a curve having a curvature, and the outer surface may have a polygonal shape, for example, an octagonal shape, formed as a straight line. The first electrode EL1 and the second electrode EL2 having the above-described shape may be spaced apart from each other by a distance and may be electrically separated from each other. For example, the first electrode EL1 and the second electrode EL2 may be insulated from each other. The second electrode EL2 may be surrounded by the first electrode EL1 and may be isolated. In the above-described embodiment, the first electrode EL1 has a polygonal ring shape, but the disclosure is not limited thereto. According to an embodiment, similar to the second and third electrodes EL2 and EL3, the first electrode EL1 may have the circular ring shape.

In the emission area EMA of each pixel PXL, the first to fourth electrodes EL1 to EL4 may have a concentric circle structure. The light emitting elements LD may be aligned and/or provided between the first to fourth electrodes EL1 to EL4. The light emitting elements LD may be aligned and/or provided in a radial shape (or radially) with respect to the fourth electrode EL4 in the emission area EMA. Accordingly, the light emitting elements LD may not be aligned and/or provided to be biased in a specific direction in the emission area EMA of each pixel PXL. Therefore, the light emitted from each of the light emitting elements LD may proceed in various directions without being concentrated in a specific direction.

Figure 20:
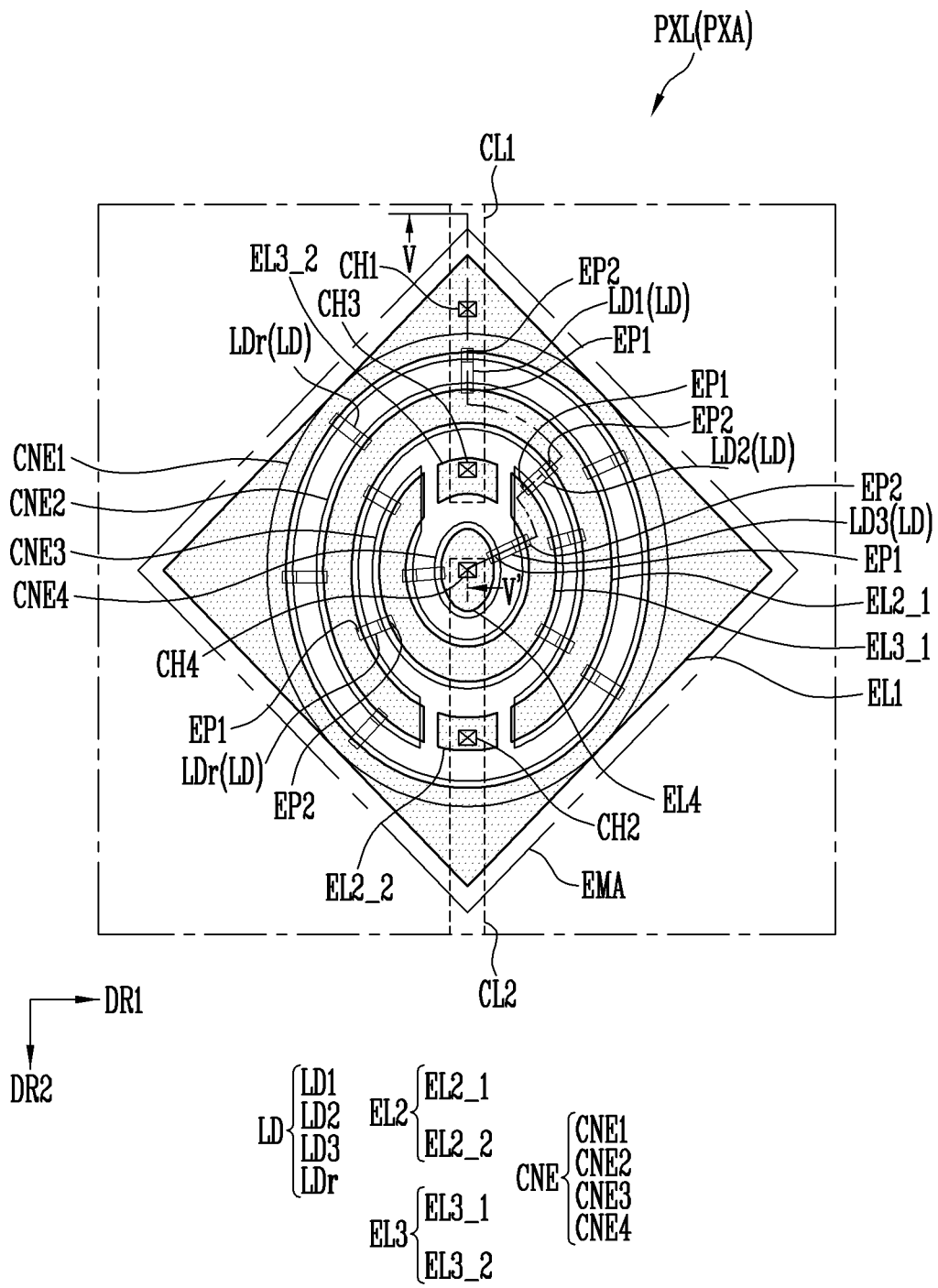
FIG. 20 is a schematic plan view illustrating a pixel according to an embodiment of the disclosure according to still another embodiment.
Figure 21:
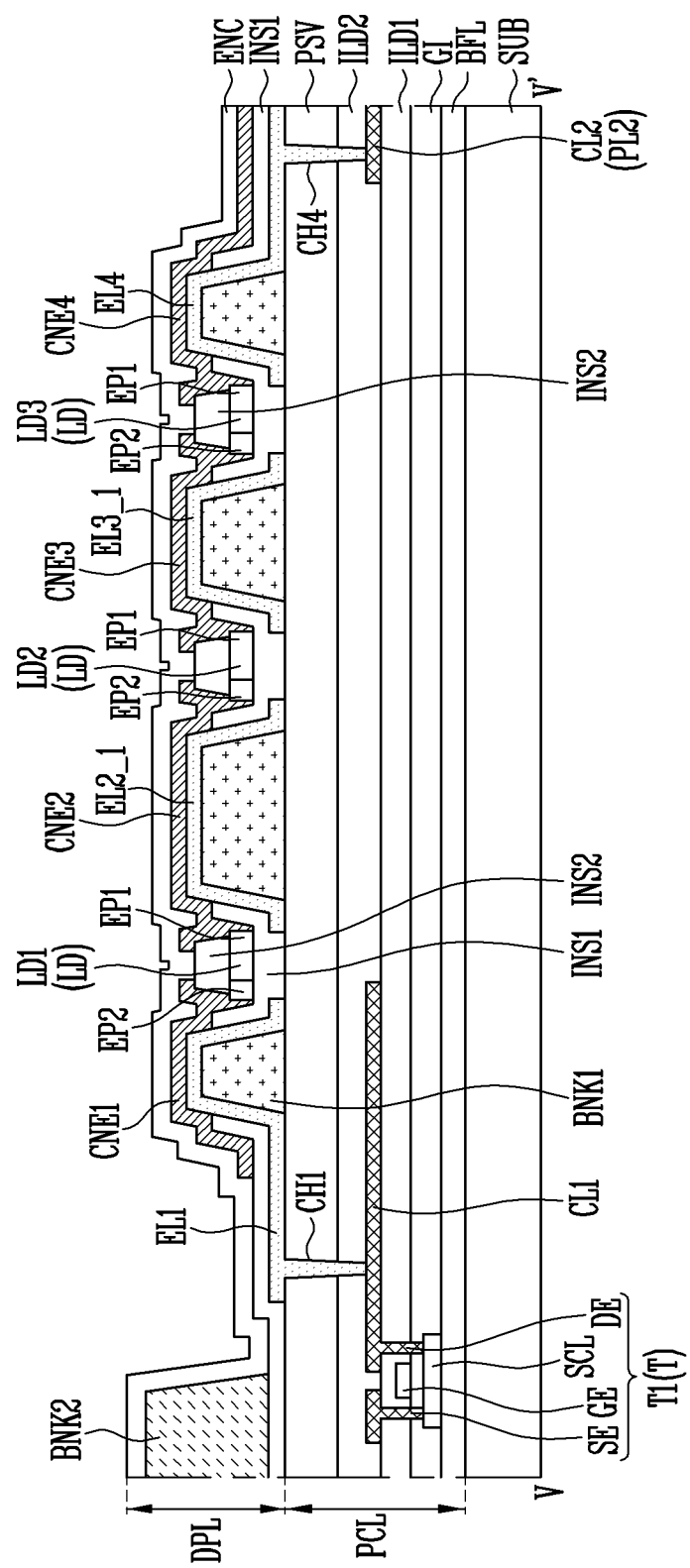
FIG. 21 is a schematic cross-sectional view taken along line V-V' of FIG. 20.
Figure 22:
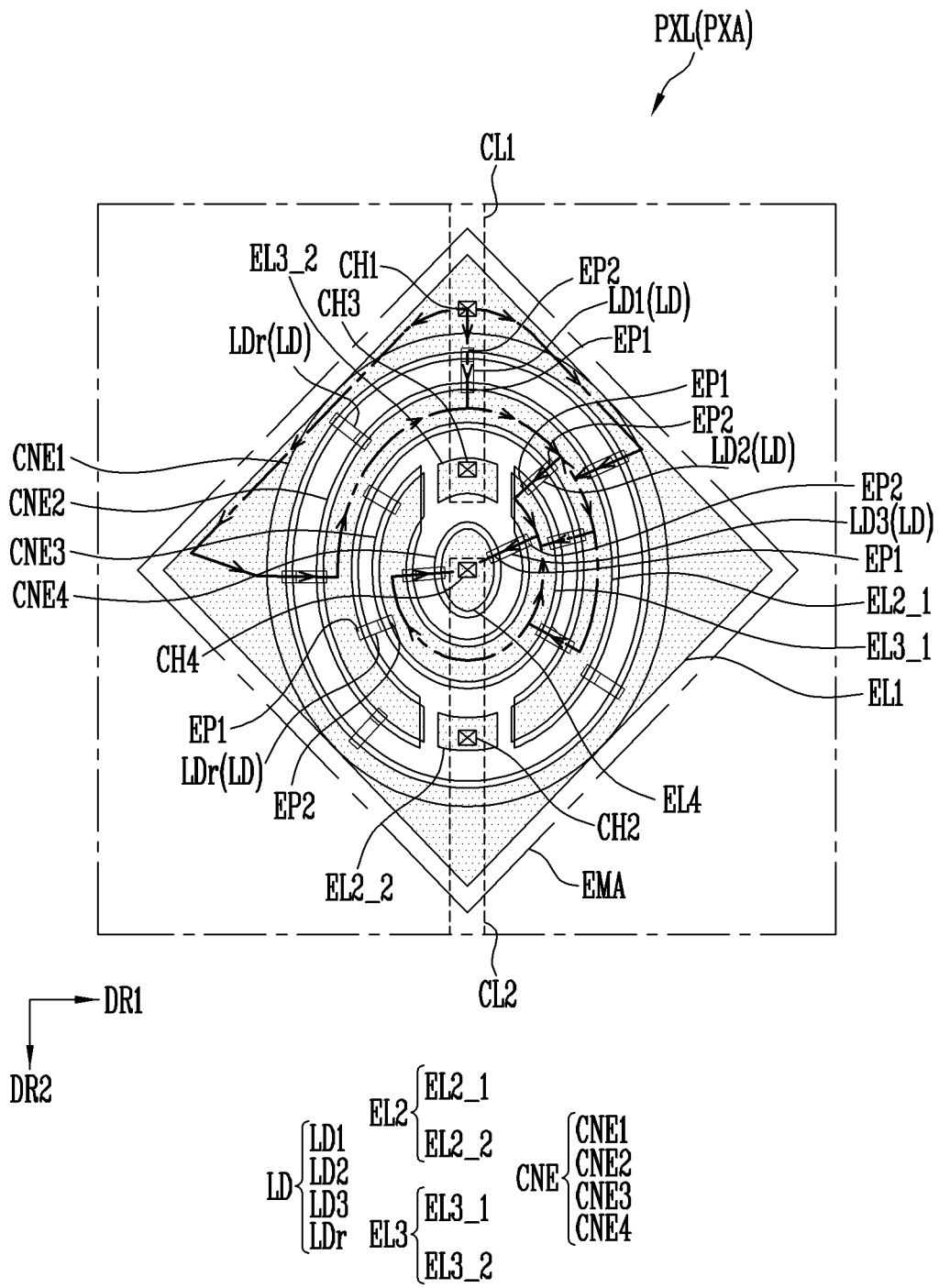
FIG. 22 is a schematic plan view illustrating a driving current flowing through a pixel according to an embodiment of the disclosure, and for example, illustrates a flow of the driving current flowing through the pixel of FIG. 20.
Figure 23:
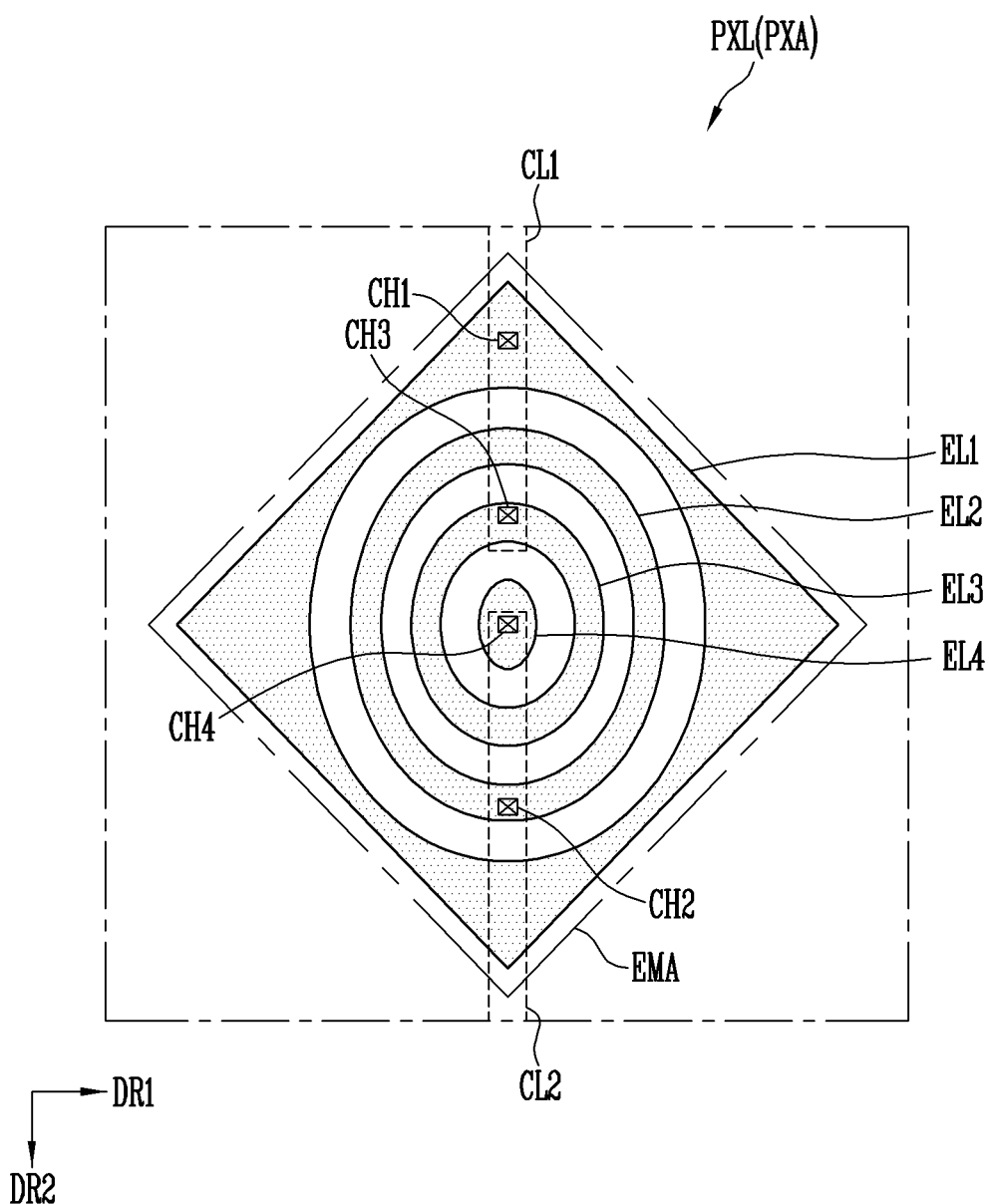
FIG. 23 is a diagram illustrating a shape in case that the light emitting elements are aligned in the pixel of FIG. 20, and is a schematic plan view of the pixel including only a partial configuration of the display element part.

FIG. 20 is a schematic plan view illustrating a pixel according to still another embodiment, FIG. 21 is a schematic cross-sectional view taken along line V-V' of FIG. 20, FIG. 22 is a schematic plan view illustrating a driving current flowing through a pixel according to an embodiment, and for example, illustrates a flow of the driving current flowing through the pixel of FIG. 20, and FIG. 23 is a schematic diagram illustrating the light emitting elements aligned in the pixel of FIG. 20, and is a schematic plan view of the pixel including only a partial configuration of the display element part.

Regarding the pixel of FIGS. 20 to 23, differences from the above-described embodiment are mainly described in order to avoid a repetitive description. Parts which are not specifically described in the disclosure are in accordance with an embodiment described above, and the same number indicates the same component and a similar number indicates a similar component.

Referring to FIGS. 1A to 5, 7B, 7C, and 20 to 23, each pixel PXL may include the pixel circuit part PCL including the pixel circuit 144, and the display element part DPL including the light emitting elements LD. The light emitting elements LD may be positioned in the emission area EMA of the pixel area PXA in which each pixel PXL is disposed.

The pixel circuit part PCL may include at least one transistor T, the first and second conductive lines CL1 and CL2, and at least one insulating layer. The display element part DPL may include the first to fourth electrodes EL1 to EL4, the light emitting elements LD, the first and second bank patterns BNK1 and BNK2, and the contact electrode CNE.

The first conductive line CL1 and the second conductive line CL2 may have a bar shape extending in the second direction DR2, for example, the vertical direction on the substrate SUB. The first and second conductive lines CL1 and CL2 may be provided and/or formed on the first interlayer insulating layer ILD1. The first conductive line CL1 may be provided integrally with the second terminal DE of the driving transistor, for example, the first transistor T1, included in the pixel circuit part PCL to be electrically connected to the second terminal DE of the first transistor T1. According to an embodiment, the first conductive line CL1 may be provided non-integrally with the second terminal DE of the first transistor T1 and may be electrically connected to the second terminal DE of the first transistor T1 through a separate connection means such as a contact hole and a bridge electrode.

The first conductive line CL1 may be electrically connected to the first electrode EL1 of the display element part DPL through the first contact hole CH1 passing through the second interlayer insulating layer ILD2 and the protective layer PSV. In addition, the first conductive line CL1 may be electrically connected to a partial configuration, for example, a (3-2)-th electrode EL3_2, of the third electrode EL3 of the display element part DPL through the third contact hole CH3 passing through the second interlayer insulating layer ILD2 and the protective layer PSV. The (3-2)-th electrode EL3_2 may be in an electrically isolated state, for example, in a floating state. For example, the first conductive line CL1 may be electrically connected to the (3-2)-th electrode EL3_2, which is a floating electrode, through the third contact hole CH3.

In an embodiment, the first conductive line CL1 may allow each of the first and third electrodes EL1 and EL3 to serve as the first alignment electrode (or the first alignment line) by transmitting an alignment signal (or alignment voltage) to the first electrode EL1 and the third electrode EL3 in case that the light emitting elements LD are aligned in the emission area EMA of each pixel PXL. In addition, after the light emitting elements LD are aligned in the emission area EMA of each pixel PXL, the first conductive line CL1 may be electrically connected to the driving transistor, for example, the first transistor T1, of the pixel circuit part PCL to allow the first electrode EL1 to function as a driving electrode of the light emitting elements LD. In addition, the first conductive line CL1 may be electrically connected to the (3-2)-th electrode EL3_2 in the floating state by removing a portion of the third electrode EL3 after the light emitting elements LD are aligned.

The second conductive line CL2 may be electrically connected to the fourth electrode EL4 of the display element part DPL through the fourth contact hole CH4 passing through the second interlayer insulating layer ILD2 and the protective layer PSV. In addition, the second conductive line CL2 may be electrically connected to a partial configuration, for example, a (2-2)-th electrode EL2_2, of the second electrode EL2 of the display element part DPL through the second contact hole CH2 passing through the second interlayer insulating layer ILD2 and the protective layer PSV. The (2-2)-th electrode EL2_2 may be in an electrically isolated state, for example, in a floating state. For example, the second conductive line CL2 may be electrically connected to the (2-2)-th electrode EL2_2, which is a floating electrode, through the third contact hole CH3. The second conductive line CL2 may be the second power line PL2 to which the second driving power VSS is applied in the pixel PXL shown in FIGS. 7B and 7C.

In an embodiment, the second conductive line CL2 may allow each of the second and fourth electrodes EL2 and EL4 to serve as the second alignment electrode (or the second alignment line) by transmitting an alignment signal (or alignment voltage) to the second electrode EL2 and the fourth electrode EL4 in case that the light emitting elements LD are aligned in the emission area EMA of each pixel PXL. In addition, after the light emitting elements LD are aligned in the emission area EMA of each pixel PXL, the second conductive line CL2 may allow the fourth electrode EL4 to serve as the driving electrode of the light emitting elements LD by transmitting the second driving power VSS to the fourth electrode EL4. In addition, the second conductive line CL2 may be electrically connected to the (2-2)-th electrode EL2_2 in the floating state by removing a portion of the second electrode EL2 after the light emitting elements LD are aligned.

In an embodiment, the fourth electrode EL4 may have a circular shape disposed at the center (or the middle), for example, the core, of the emission area EMA of each pixel PXL.

The third electrode EL3 may be spaced apart from the fourth electrode EL4 and may have a shape surrounding the periphery of the fourth electrode EL4 in the circumferential direction of the fourth electrode EL4. In an embodiment, the third electrode EL3 may include a (3-1)-th electrode EL3_1 of a shape in which at least one region is open (or opened) and a (3-2)-th electrode EL3_2 spaced apart from the (3-1)-th electrode EL3_1. For example, the (3-1)-th electrode EL3_1 may have a "C" shape.

Before the light emitting elements LD are aligned in the emission area EMA of each pixel PXL, the third electrode EL3 may be provided in an elliptical ring shape surrounding the fourth electrode EL4 as shown in FIG. 23. In case that the light emitting elements LD are aligned in the emission area EMA, the third electrode EL3 may serve as the first alignment electrode for aligning the light emitting elements by receiving the first alignment signal (or the first alignment voltage) from the first conductive line CL1 together with the first electrode EL1. For example, in case that the light emitting elements LD are aligned in the emission area EMA, a same alignment signal, for example, the first alignment signal, may be transmitted to the first electrode EL1 and the third electrode EL3 through the first conductive line CL1.

In case that the alignment of the light emitting elements LD is completed, a portion of the third electrode EL3 may be removed or disconnected. Accordingly, the third electrode EL3 may be provided in a shape including the (3-1)-th electrode EL3_1 in which at least one region is opened and the (3-2)-th electrode EL3_2 spaced apart from and electrically separated from the (3-1)-th electrode EL3_1, after the alignment of the light emitting elements LD is completed. In case that the alignment of the light emitting elements LD is completed, the (3-1)-th electrode EL3_1 may become a connection path for applying the driving current to the light emitting elements LD aligned between the third electrode EL3 and electrodes adjacent to the third electrode EL3, and the (3-2)-th electrode EL3_2 may be in a floating state. In an embodiment, the (3-1)-th electrode EL3_1 may be provided in a shape surrounding one region of the fourth electrode EL4, and the (3-2)-th electrode EL3_2 may be provided in a shape surrounding another region of the fourth electrode EL4. In a plan view, the (3-2)-th electrode EL3_2 may be provided and/or formed in an open region of the third electrode EL3.

The second electrode EL2 may be spaced apart from the third electrode EL3 and may surround the periphery of the third electrode EL3. In an embodiment, the second electrode EL2 may include a (2-1)-th electrode EL2_1 of which at least one region is open (or opened) and a (2-2)-th electrode EL2_2 which is spaced apart from the (2-1)-th electrode EL2_1. For example, the (2-1)-th electrode EL2_1 may have a "C" shape.

Before the light emitting elements LD are aligned in the emission area EMA of each pixel PXL, the second electrode EL2 may have an elliptical ring shape surrounding the third electrode EL3 as shown in FIG. 23. In case that the light emitting elements LD are aligned in the emission area EMA, the second electrode EL2 may serve as the second alignment electrode for aligning the light emitting elements by receiving the second alignment signal (or the second alignment voltage) from the second conductive line CL2 together with the fourth electrode EL4. For example, in case that the light emitting elements LD are aligned in the emission area EMA, a same alignment signal, for example, the second alignment signal, may be transmitted to the second electrode EL2 and the fourth electrode EL4 through the second conductive line CL2.

In case that the alignment of the light emitting elements LD is completed, a portion of the second electrode EL2 may be removed or electrically disconnected. Accordingly, the second electrode EL2 may include the (2-1)-th electrode EL2_1 in which at least one region is opened and the (2-2)-th electrode EL2_2 spaced apart from the (2-1)-th electrode EL2_1 to be electrically separated (or electrically disconnected) from the (2-1)-th electrode EL2_1 after the alignment of the light emitting elements LD is completed. In case that the alignment of the light emitting elements LD is completed, the (2-1)-th electrode EL2_1 may become a connection path for applying the driving current to the light emitting elements LD aligned between the second electrode EL2 and electrodes adjacent to the second electrode EL2, and the (2-2)-th electrode EL2_2 may be in a floating state. In an embodiment, the (2-1)-th electrode EL2_1 may be provided in a shape surrounding one region of the third electrode EL3, and the (2-2)-th electrode EL2_2 may be provided in a shape surrounding another region of the third electrode EL3. In a plan view, the (2-2)-th electrode EL2_2 may be provided and/or formed in an open region of the second electrode EL2.

The first electrode EL1 may be spaced apart from the second electrode EL2 and may have a shape surrounding the periphery of the second electrode EL2. For example, the first electrode EL1 may have a ring shape of a rhombus surrounding the periphery of the second electrode EL2.

The above-described first to fourth electrodes EL1 to EL4 may have a concentric circle structure in the emission area EMA of each pixel PXL. Accordingly, the light emitting elements LD may be aligned in a radial shape (or radially) with respect to the fourth electrode EL4 positioned at the core of the emission area EMA.

The light emitting elements LD may include at least one first light emitting element LD1 aligned between the first electrode EL1 and the second electrode EL2, at least one second light emitting element LD2 aligned between the second electrode EL2 and the third electrode EL3, and at least one third light emitting element LD3 aligned between the third electrode EL3 and the fourth electrode EL4.

In the emission area EMA of each pixel PXL, the first and second electrodes EL1 and EL2 and the first light emitting elements LD1 electrically connected in parallel therebetween may form the first series stage, the second and third electrodes EL2 and EL3 and the second light emitting elements LD2 electrically connected in parallel therebetween may form the second series stage, and the third and fourth electrodes EL3 and EL4 and the third light emitting elements LD3 electrically connected in parallel therebetween may configure the third series stage. At least one reverse light emitting element LDr electrically connected in a reverse direction between two adjacent electrodes in each serial stage may be further disposed.

When it is assumed that the driving current flows from the first power line PL1 to the second conductive line CL2 by the first transistor T1 of the pixel circuit part PCL included in each pixel PXL, the driving current may flow into the first electrode EL1 through the first conductive line CL1 and the first contact hole CH1. The driving current flowing into the first electrode EL1 flows to the (2-1)-th electrode EL2_1 via the first light emitting elements LD1. Accordingly, the first light emitting elements LD1 disposed between the first electrode EL1 and the (2-1)-th electrode EL2_1 may emit light with a luminance corresponding to the current distributed to each of the first light emitting elements LD1. The driving current flowing through the (2-1)-th electrode EL2_1 flows to the (3-1)-th electrode EL3_1 via the second light emitting elements LD2. Accordingly, the second light emitting elements LD2 may emit light with a luminance corresponding to the current distributed to each of the second light emitting elements LD2. The driving current flowing through the (3-1)-th electrode EL3_1 flows to the fourth electrode EL4 via the third light emitting elements LD3. Accordingly, the third light emitting elements LD3 may emit light with a luminance corresponding to the current distributed to each of the third light emitting elements LD3.

In the method described above, the driving current of each pixel PXL may flow while sequentially passing through the first light emitting elements LD1 disposed between the first and (2-1)-th electrodes EL1 and EL2_1, the second light emitting elements LD2 disposed between the (2-1)-th electrode EL2_1 and the (3-1)-th electrode EL3_1, and the third light emitting elements LD3 disposed between the (3-1)-th electrode EL3_1 and the fourth electrode EL4. Accordingly, each pixel PXL may emit light with a luminance corresponding to the data signal supplied thereto during each frame period.

Although the above has been described with reference to the embodiment of the disclosure, those skilled in the art or those having ordinary knowledge of the corresponding technical field will understand that the disclosure may be variously changed and modified without departing from the technical scope of the disclosure described in the claims to be described below.

Therefore, the technical scope of the disclosure should not be limited to the contents described in the detailed description of the specification, but should be defined by the claims.

What is claimed is:
1. A display device comprising:
a display area including pixel areas each including an emission area;
a non-display area; and
a pixel disposed in each of the pixel areas, wherein the pixel comprises:
a first electrode;
a second electrode spaced apart from the first electrode and surrounding a periphery of the first electrode;
a third electrode spaced apart from the second electrode and surrounding a periphery of the second electrode;
a fourth electrode spaced apart from the third electrode and surrounding a periphery of the third electrode;
light emitting elements disposed between the first to fourth electrodes; and
a first conductive line and a second conductive line disposed under the first to fourth electrodes with an insulating layer disposed between the first and second conductive lines,
the first conductive line is electrically connected to the first electrode, and the second conductive line is electrically connected to the fourth electrode.

2. The display device according to claim 1, wherein in a plan view,
each of the second to fourth electrodes has a ring shape, and
the first electrode has an isolated circular island shape surrounded by the second to fourth electrodes.

3. The display device according to claim 2, wherein the light emitting elements comprises:
first light emitting elements disposed between the first electrode and the second electrode;
second light emitting elements disposed between the second electrode and the third electrode; and
a third light emitting element disposed between the third electrode and the fourth electrode.

4. The display device according to claim 3, wherein
the first light emitting elements are disposed between the first electrode and the second electrode in a circumferential direction centered on the first electrode,
the second light emitting elements are disposed between the second electrode and the third electrode in a circumferential direction centered on the second electrode, and
the third light emitting elements are disposed between the third electrode and the fourth electrode in a circumferential direction centered on the third electrode.

5. The display device according to claim 4, wherein the first conductive line and the second conductive line are disposed on a same layer.

6. The display device according to claim 4, wherein the first conductive line and the second conductive line are disposed on different layers.

7. The display device according to claim 6, wherein
the insulating layer includes a first insulating layer and a second insulating layer sequentially stacked on a substrate,
the first conductive line is disposed on one of the first and second insulating layers, and
the second conductive line is disposed on the other of the first and second insulating layers.

8. The display device according to claim 6, wherein the pixel further comprises:
a third conductive line electrically connected to the second electrode with the insulating layer disposed between the third conductive line and the second electrode; and
a fourth conductive line electrically connected to the third electrode with the insulating layer disposed between the fourth conductive line and the third electrode, and
the third and fourth conductive lines are in a floating state.

9. The display device according to claim 8, wherein the third and fourth conductive lines and the first and second conductive lines are disposed on a same layer.

10. The display device according to claim 8, wherein the third conductive line and the fourth conductive line are disposed on different layers.

11. The display device according to claim 8, wherein
the first light emitting elements form a first stage electrically connected in parallel between the first electrode and the second electrode,
the second light emitting elements form a second stage electrically connected in parallel between the second electrode and the third electrode, and
the third light emitting elements form a third stage electrically connected in parallel between the third electrode and the fourth electrode.

12. The display device according to claim 1, wherein the pixel further comprises:
a bank pattern disposed under each of the first to fourth electrodes; and
a contact electrode respectively disposed on the first to fourth electrodes.

13. The display device according to claim 12, wherein
the second electrode includes a 2-1-th electrode surrounding one region of the first electrode and a 2-2-th electrode spaced apart from the 2-1-th electrode and surrounding another region of the first electrode, and
the third electrode includes a 3-1-th electrode surrounding one region of the second electrode and a 3-2-th electrode spaced apart from the 3-1-th electrode and surrounding another region of the second electrode.

14. The display device according to claim 13, wherein the 2-2-th electrode and the 3-2-th electrode are in a floating state.

15. The display device according to claim 13, wherein
The 2-2-th electrode is electrically connected to the second conductive line, and
the 3-2-th electrode is electrically connected to the first conductive line.

16. The display device according to claim 15, wherein the first conductive line and the second conductive line are disposed on a same layer.

17. The display device according to claim 1, wherein
the pixel further comprises a pixel circuit part including at least one transistor electrically connected to the fourth electrode, and
the first electrode is a cathode electrode of the pixel and the fourth electrode is an anode electrode of the pixel.

18. A method of manufacturing a display device, the method comprising:
providing a pixel including a pixel area,
wherein the providing of the pixel comprises forming a pixel circuit part and forming a display element part,
the forming of the pixel circuit part comprises:
forming at least one transistor, a first conductive line, a second conductive line, a third conductive line, and a fourth conductive line spaced apart from each other on a substrate; and
forming a protective layer on the transistor and the first to fourth conductive lines, and
the forming of the display element part comprises:
forming a first electrode electrically connected to the first conductive line, a second electrode spaced apart from the first electrode and electrically connected to the second conductive line, a third electrode spaced apart from the second electrode and electrically connected to the third conductive line, and a fourth electrode spaced apart from the third electrode and electrically connected to the fourth conductive line, on the protective layer;

aligning light emitting elements between the first to fourth electrodes by forming an electric field between the first and second electrodes, between the second and third electrodes, and between the third and fourth electrodes by applying an alignment signal corresponding to each of the first to fourth conductive lines; and forming a contact electrode on each of the first to fourth electrodes.

19. The method according to claim 18, further comprising:

removing a portion of each of the second and third conductive lines after the forming of the contact electrode.

20. The method according to claim 18, wherein the first electrode is disposed at a center of the pixel area, the second electrode surrounds a periphery of the first electrode, the third electrode surrounds a periphery of the second electrode, and the fourth electrode surrounds a periphery of the third electrode.

* * * * *